(12) United States Patent
Yamazaki et al.

(10) Patent No.: US 10,103,274 B2
(45) Date of Patent: Oct. 16, 2018

(54) SEMICONDUCTOR DEVICE

(71) Applicant: Semiconductor Energy Laboratory Co., Ltd., Kanagawa-ken (JP)

(72) Inventors: Shunpei Yamazaki, Tokyo (JP); Masahiro Katayama, Tochigi (JP); Chieko Misawa, Tochigi (JP); Yuka Yokoyama, Tochigi (JP); Hironobu Takahashi, Tochigi (JP); Kenichi Okazaki, Tochigi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 15/462,229

(22) Filed: Mar. 17, 2017

(65) Prior Publication Data
US 2017/0194503 A1 Jul. 6, 2017

Related U.S. Application Data

(63) Continuation of application No. 14/556,769, filed on Dec. 1, 2014, now Pat. No. 9,601,634.

(30) Foreign Application Priority Data

Dec. 2, 2013 (JP) .................................. 2013-249165

(51) Int. Cl.
*H01L 29/10* (2006.01)
*H01L 29/786* (2006.01)
(Continued)

(52) U.S. Cl.
CPC .... *H01L 29/7869* (2013.01); *H01L 29/66969* (2013.01); *H01L 29/78606* (2013.01); *G02F 1/1368* (2013.01); *H01L 27/1225* (2013.01)

(58) Field of Classification Search
CPC ........... H01L 29/7869; H01L 29/78606; H01L 29/66969; H01L 27/1225
See application file for complete search history.

(56) References Cited

U.S. PATENT DOCUMENTS

| | | | |
|---|---|---|---|
| 5,396,099 A | 3/1995 | Kitajima | |
| 5,731,856 A | 3/1998 | Kim et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Syed Gheyas
(74) *Attorney, Agent, or Firm* — Husch Blackwell LLP

(57) ABSTRACT

A highly reliable semiconductor device which uses an oxide semiconductor film for a backplane is provided. A semiconductor device includes a first conductive film, a first insulating film over the first conductive film, an oxide semiconductor film which is over the first insulating film and overlaps with the first conductive film, a second insulating film over the oxide semiconductor film, and a pair of second conductive films electrically connected to the oxide semiconductor film through an opening portion included in the second insulating film. The second insulating film overlaps with a region of the oxide insulating film in which a carrier flows between the pair of second conductive films and overlaps with end portions of the oxide semiconductor film.

19 Claims, 37 Drawing Sheets

(51) Int. Cl.
*H01L 29/66* (2006.01)
*G02F 1/1368* (2006.01)
*H01L 27/12* (2006.01)

(56) References Cited

U.S. PATENT DOCUMENTS

| | | | |
|---|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,097,881 B2 | 1/2012 | Lee et al. |
| 8,384,079 B2 | 2/2013 | Yamazaki et al. |
| 8,420,441 B2 | 4/2013 | Yamazaki et al. |
| 8,421,083 B2 | 4/2013 | Yamazaki et al. |
| 8,546,180 B2 | 10/2013 | Yamazaki et al. |
| 8,659,013 B2 | 2/2014 | Yamazaki |
| 8,872,171 B2 | 10/2014 | Yamazaki et al. |
| 8,895,375 B2 | 11/2014 | Takemura |
| 8,969,130 B2 | 3/2015 | Tanaka et al. |
| 9,082,861 B2 | 7/2015 | Yamazaki |
| 9,166,054 B2 | 10/2015 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0172591 A1 | 7/2007 | Seo et al. |
| 2007/1015221 | 7/2007 | Lai et al. |
| 2007/0187678 A1 | 8/2007 | Hirao et al. |
| 2007/0194379 A1 | 8/2007 | Hosono et al. |
| 2007/1018776 | 8/2007 | Furuta et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/1005059 | 2/2008 | Nakagawarao et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308804 A1 | 12/2008 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152541 A1 | 6/2009 | Maekawa et al. |
| 2009/1015250 | 6/2009 | Umedak et al. |
| 2009/0256147 A1 | 10/2009 | Kim et al. |
| 2009/0278122 A1 | 11/2009 | Hosono et al. |
| 2009/0280600 A1 | 11/2009 | Hosono et al. |
| 2009/0321731 A1 | 12/2009 | Jeong et al. |
| 2010/0032664 A1 | 2/2010 | Lee et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0084267 A1 | 4/2011 | Yamazaki et al. |
| 2011/0157131 A1 | 6/2011 | Miyake |
| 2013/0119373 A1 | 5/2013 | Yamazaki |
| 2013/0120702 A1 | 5/2013 | Yamazaki et al. |
| 2013/0176235 A1 | 7/2013 | Chou et al. |
| 2013/0193431 A1 | 8/2013 | Yamazaki |
| 2016/0043112 A1 | 2/2016 | Yamazaki |

FOREIGN PATENT DOCUMENTS

| | | |
|---|---|---|
| EP | 2 264 770 A2 | 12/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-100760 A | 4/2006 |
| JP | 2007-096055 A | 4/2007 |
| JP | 2007-123861 A | 5/2007 |
| JP | 2008-060419 A | 3/2008 |
| JP | 2010-041058 A | 2/2010 |
| JP | 2011-150307 A | 8/2011 |
| JP | 2013-123045 A | 6/2013 |
| JP | 2013-128106 A | 6/2013 |

(56) References Cited

FOREIGN PATENT DOCUMENTS

| | | |
|---|---|---|
| JP | 2013-236066 A | 11/2013 |
| WO | WO 2004/114391 A1 | 12/2004 |
| WO | WO 2006/025609 A2 | 3/2006 |

OTHER PUBLICATIONS

Asaoka, Y. et al., "29.1: Polarizer-Free Reflective LCD Combined With Ultra Low-Power Driving Technology," SID Digest '09: SID International Symposium Digest of Technical Papers, May 31, 2009, pp. 395-398.

Chern, H.N. et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D-H. et al., "21.2: AL and SN-Doped Zinc Indium Oxide Thin Film Transistors for AMOLED Back-Plane," SID Digest '09: SID International Symposium Digest of Technical Papers, May 31, 2009, pp. 280-283.

Clark, S.J. et al., "First Principles Methods Using Castep," Zeitschrift fur Kristallographie, 2005, vol. 220, pp. 567-570.

Coates, D. et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M.J. et al., "Electron Microscopy of a Cholesteric Liquid Crystal and its Blue Phase," Physical Review. A, May 1, 1984, vol. 29, No. 5, pp. 2957-2959.

Dembo, H. et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E.M.C. et al., "Wide-Bandgap High-Mobility ZnO Thin-Film Transistors Produced at Room Temperature," Applied Physics Letters, Sep. 27, 2004, vol. 85, No. 13, pp. 2541-2543.

Fung, T.C. et al., "2-D Numerical Simulation of High Performance Amorphous In—Ga—Zn—O TFTs for Flat Pahel Displays," AM-FPD '08 Digest of Technical Papers, Jul. 2, 2008, pp. 251-252, The Japan Society of Applied Physics.

Godo, H. et al., "P-9: Numerical Analysis on Temperature Dependence of Characteristics of Amorphous In—Ga—Zn-Oxide TFT," SID Digest '09: SID International Symposium Digest of Technical Papers, May 31, 2009, pp. 1110-1112.

Godo, H. et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Hayashi, R. et al., "42.1: Invited Paper: Improved Amorphous In—Ga—Zn—O TFTs," SID Digest '08: SID International Symposium Digest of Technical Papers, May 20, 2008, vol. 39, pp. 621-624.

Hirao, T. et al., "Novel Top-Gate Zinc Oxide Thin-Film Transistors (ZnO TFTs) for AMLCDS," Journal of the Society for Information Display, 2007, vol. 15, No. 1, pp. 17-22.

Hosono, H, et al., "Working Hypothesis to Explore Novel Wide Band Gap Electrically Conducting Amorphous Oxides and Examples," Journal of Non-Crystalline Solids, 1996, vol. 198-260, pp. 165-169.

Hosono, H., "68.3: Invited Paper:Transparent Amorphous Oxide Semiconductors for High Performance TFT," SID Digest '07: SID International Symposium Digest of Technical Papers, 2007, vol. 38, pp. 1830-4833.

Hsieh, H-H. et al., "P-29: Modeling of Amorphous Oxide Semiconductor Thin Film Transistors and Subgap Density of States," SID Digest '08: SID International Symposium Digest of Technical Papers, May 20, 2008, vol. 39, pp. 1277-1280.

Ikeda, T. et al., "Full-Functional System Liquid Crystal Display Using Cg-Silicon Technology," SID Digest '04: SID International Symposium Digest of Technical Papers, 2004, vol. 35, pp. 860-863.

Janotti, A. et al., "Native Point Defects in ZnO," Physical Review. B, Oct. 4, 2007, vol. 76, No. 16, pp. 165202-1-165202-22.

Janotti, A. et al., "Oxygen Vacancies in ZnO," Applied Physics Letters, 2005, vol. 87, pp. 122102-1-122102-3.

Jeong, J.K. et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Jin, D-U. et al., "65.2: Distinguished Paper:World-Largest (6.5") Flexible Full Color Top Emission AMOLED Display on Plastic Film and its Bending Properties," SID Digest '09: SID International Symposium Digest of Technical Papers, May 31, 2009, pp. 983-985.

Kanno, H. et al., "White Stacked Electrophosphorecent Organic Light-Emitting Devices Employing MOO3 as a Charge-Generation Layer," Advanced Materials, 2006, vol. 18, No. 3, pp. 339-342.

Kikuchi, H. et al., "39.1: Invited Paper:Optically Isotropic Nano-Structured Liquid Crystal Composites for Display Applications," SID Digest '09: SID International Symposium Digest of Technical Papers, May 31, 2009, pp. 578-581.

Kikuchi, H. et al., "62.2: Invited Paper:Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi, H. et al., "Polymer-Stabilized Liquid Crystal Blue Phases," Nature Materials, Sep. 2, 2002, vol. 1, pp. 64-68.

Kim, S. et al., "High-Performance Oxide Thin Film Transistors Passivated by Various Gas Plasmas," 214th ECS Meeting, 2008, No. 2317, ECS.

Kimizuka, N. et al., "Spinel,YBFE2O4, and YB2FE3O7 Types of Structures for Compounds in the In2O3 and Sc2O3-A2O3-Bo Systems [A; Fe, Ga, or Al; B: Mg. Mn, Fe, Ni, Cu,Or Zn] at Temperatures Over 1000° C.," Journal of Solid State Chemistry, 1985, vol. 60, pp. 382-384.

Kimizuka, N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—2nGa2O4—ZnO System," Journal of Solid State Chemistry, Apr. 1, 1995, vol. 116, No. 1, pp. 170-178.

Kitzerow, H-S. et al., "Observation of Blue Phases in Chiral Networks," Liquid Crystals, 1993, vol. 14, No. 3, pp. 911-916.

Kurokawa, Y. et al., "UHF RFCPUS on Flexible and Glass Substrates for Secure RFID Systems," Journal of Solid-State Circuits, 2008, vol. 43, No. 1, pp. 292-299.

Lany, S. et al., "Dopability, Intrinsic Conductivity, and Nonstoichiometry of Transparent Conducting Oxides," Physical Review Letters, Jan. 26, 2007, vol. 98, pp. 045501-1-045501-4.

Lee, H.N. et al., "Current Status of, Challenges to, and Perspective View of AM-OLED," IDW '06: Proceedings of the 13th International Display Workshops, Dec. 7, 2006, pp. 663-866.

Lee, J-H. et al., "World's Largest (15-Inch) XGA AMLCD Panel Using IGZO Oxide TFT," SID Digest '08: SID International Symposium Digest of Technical Papers, May 20, 2008, vol. 39, pp. 625-628.

Lee, M-H. et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Li, C. et al., "Modulated Structures of Homologous Compounds InMO3(ZnO)m (M=In,Ga; m=Integer) Described by Four-Dimensional Superspace Grbup," Journal of Solid State Chemistry, 1998, vol. 139, pp. 347-355.

Masuda, S. et al., "Transparent Thin Film Transistors Using ZnO as an Active Channel Layer and Their Electrical Properties," Journal of Applied Physics, Feb. 1, 2003, vol. 93, No. 3, pp. 1624-1630.

Meiboom, S. et al., "Theory of the Blue Phase of Cholesteric Liquid Crystals," Physical Review Letters, May 4, 1981, vol. 46, No. 18, pp. 1216-1219.

Miyasaka, M., "Suftla Flexible Microelectronics on Their Way to Business," SID Digest '07: SID International Symposium Digest of Technical Papers, 2007, vol. 38, pp. 1673-1676.

Mo, Y-G. et al., "Amorphous Oxide TFT Backplanes for Large Size AMOLED Displays," IDW '08: Proceedings of the 6th International Display Workshops, Dec. 3, 2008, pp. 581-584.

(56) References Cited

OTHER PUBLICATIONS

Nakamura, M. et al., "The Phase Relations in the In2O3—Ga2ZnO4—ZnO System at 1350° C.," Journal of Solid State Chemistry, Aug. 1, 1991, vol. 93, No. 2, pp. 298-315.

Nakamura, M., "Synthesis of Homologous Compound with New Long-Period Structure," NIRIM Newsletter, Mar. 1, 1995, vol. 150, pp. 1-4.

Nomura, K. et al., "Amorphous Oxide Semiconductors for High-Performance Flexible Thin-Film Transistors," Japanese Journal of Applied Physics, 2006, vol. 45, No. 5B, pp. 4303-4308.

Nomura, K. et al., "Carrier Transport in Transparent Oxide Semiconductor with Intrinsic Structural Randomness Probed Using Single-Crystalline InGaO3(ZnO)5 Films," Applied Physics Letters, Sep. 13, 2004, vol. 85, No. 11, pp. 1993-1995.

Nomura, K. et al., "Room-Temperature Fabrication of Transparent Flexible Thin-Film Transistors Using Amorphous Oxide Semiconductors," Nature, Nov. 25, 2004, vol. 432, pp. 488-492.

Nomura, K. et al., "Thin-Film Transistor Fabricated in Single-Crystalline Transparent Oxide Semiconductor," Science, May 23, 2003, vol. 300, No. 5623, pp. 1269-1272.

Nowatari, H. et al., "60.2: Intermediate Connector With Suppressed Voltage Loss for White Tandem OLEDs," SID Digest '09: SID International Symposium Digest of Technical Papers, May 31, 2009, vol. 40, pp. 899-902.

Oba, F. et al., "Defect Energetics in ZnO: A Hybrid Hartree-Fock Density Functional Study," Physical Review. B, 2008, vol. 77, pp. 245202-1-245202-6.

Oh, M.S. et al., "Improving the Gate Stability of ZnO Thin-Film Transistors With Aluminum Oxide Dielectric Layers," Journal of the Electrochemical Society, 2008, vol. 155, No. 12, pp. H1009-H1014.

Ohara, H. et al., "21.3: 4.0 In. QVGA AMOLED Display Using In—Ga—Zn-Oxide TFTs With a Novel Passivation Layer," SID Digest '09: SID International Symposium Digest of Technical Papers, May 31, 2009, pp. 284-287.

Ohara, H. et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M. et al., "Amorphous Transparent Conductive Oxide InGaO3(ZnO)m (m<4):a Zn4s Conductor," Philosophical Magazine, 2001, vol. 81, No. 5, pp. 501-515.

Orita, M. et al., "Mechanism of Electrical Conductivity of Transparent InGaZnO4," Physical Review. B, Jan. 15, 2000, vol. 61, No. 3, pp. 1811-1816.

Osada, T. et al., "15.2: Development of Driver-Integrated Panel using Amorphous In—Ga—Zn-Oxide TFT," SID Digest '09: SID International Symposium Digest of Technical Papers, May 31, 2009, pp. 184-187.

Osada, T. et al., "Development of Driver-Integrated Panel Using Amorphous In—Ga—Zn-Oxide TFT," AM-FPD '09 Digest of Technical Papers, Jul. 1, 2009, pp. 33-36.

Park, J.-S. et al., "Amorphous Indium-Gallium-Zinc Oxide TFTs and Their Application for Large Size AMOLED," AM-FPD '08 Digest of Technical Papers, Jul. 2, 2008, pp. 275-278.

Park, J.S. et al., "Dry Etching of ZnO Films and Plasma-Induced Damage to Optical Properties," Journal of Vacuum Science & Technology B, Mar. 1, 2003, vol. 21, No. 2, pp. 800-803.

Park, J.-S. et al., "Electronic Transport Properties of Amorphous Indium-Gallium-Zinc Oxide Semiconductor Upon Exposure to Water," Applied Physics Letters, 2008, vol. 92, pp. 072104-1-072104-3.

Park, J.C. et al., "High Performance Amorphous Oxide Thin Film Transistors with Self-Aligned Top-Gate Structure," IEDM 09: Technical Digest of International Electron Devices Meeting, Dec. 7, 2009, pp. 191-194.

Park, J.-S. et al., "Improvements in the Device Characteristics of Amorphous Indium Gallium Zinc Oxide Thin-Film Transistors by Ar Plasma Treatment," Applied Physics Letters, Jun. 26, 2007, vol. 90, No. 26, pp. 262106-1-262106-3.

Park, S. et al., "Challenge to Future Displays: Transparent AM-OLED Driven by Peald Grown ZnO TFT," IMID '07 Digest, 2007, pp. 1249-1252.

Park, Sang-Hee et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Prins, M.W.J. et al., "A Ferroelectric Transparent Thin-Film Transistor," Applied Physics Letters, Jun. 17, 1996, vol. 68, No. 25, pp. 3650-3652.

Sakata, J. et al., "Development of 4.0-In. AMOLED Display With Driver Circuit Using Amorphous In—Ga—Zn-Oxide TFTs," IDW '09: Proceedings of the 16th International Display Workshops, 2009, pp. 689-692.

Son, K.-S. et al., "42.4L: Late-News Paper: 4 Inch QVGA AMOLED Driven by the Threshold Voltage Controlled Amorphous Gizo (Ga2O3—In2O3—ZnO) TFT," SID Digest '08: SID International Symposium Digest of Technical Papers, May 20, 2008, vol. 39, pp. 633-636.

Takahashi, M. et al., "Theoretical Analysis of IGZO Transparent Amorphous Oxide Semiconductor," IDW '08: Proceedings of the 15th International Display Workshops, Dec. 3, 2008, pp. 1637-1640.

Tsuda, K. et al., "Ultra Low Power Consumption Technologies for Mobile TFT-LCDs," IDW '02: Proceedings of the 9th International Display Workshops, Dec. 4, 2002, pp. 295-298.

Ueno, K. et al., "Field-Effect Transistor on SrTiO3 With Sputtered Al2O3 Gate Insulator," Applied Physics Letters, Sep. 1, 2003, vol. 83, No. 9, pp. 1755-1757.

Van de Walle, C.G., "Hydrogen as a Cause of Doping in Zinc Oxide," Physical Review Letters, Jul. 31, 2000, vol. 85, No. 5, pp. 1012-1015.

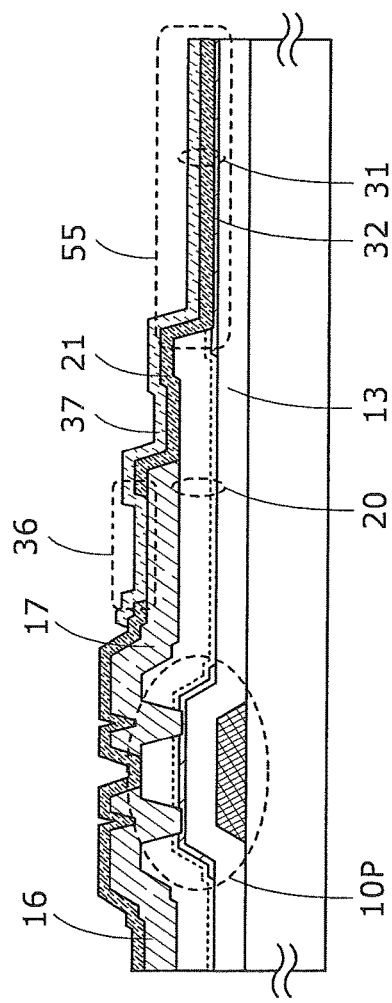
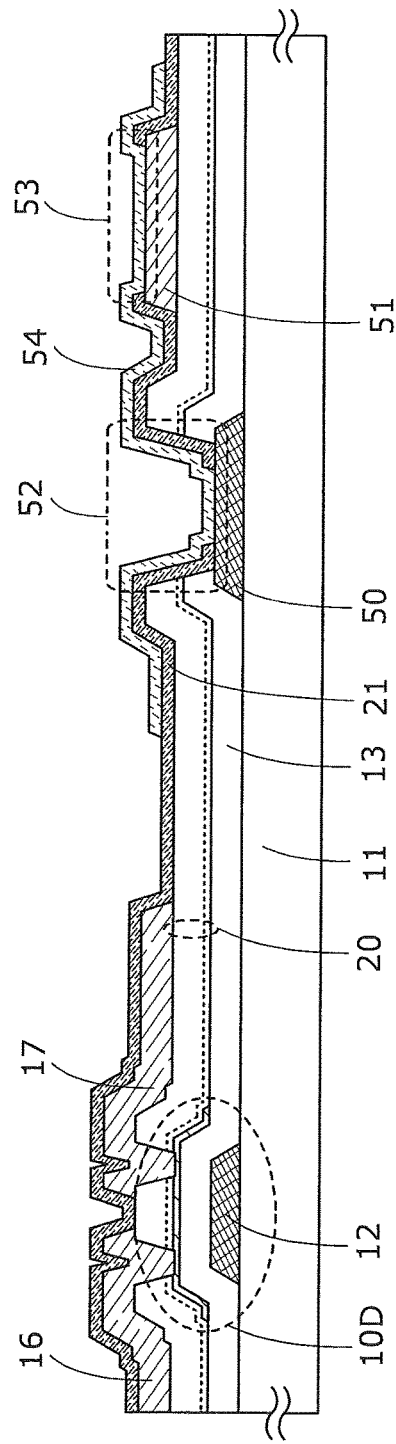

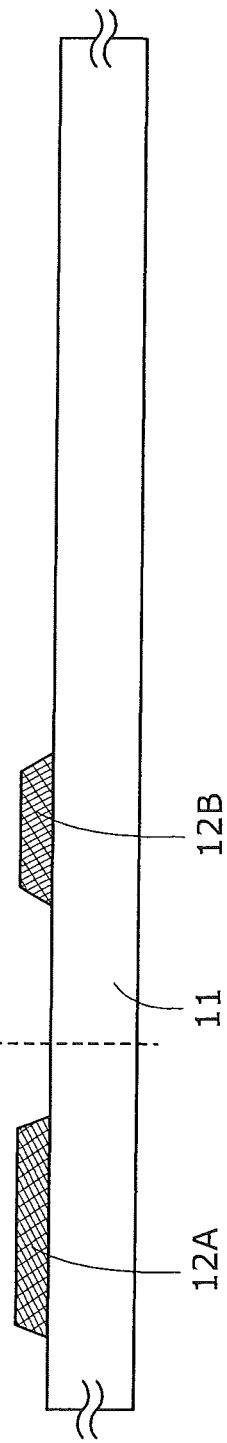
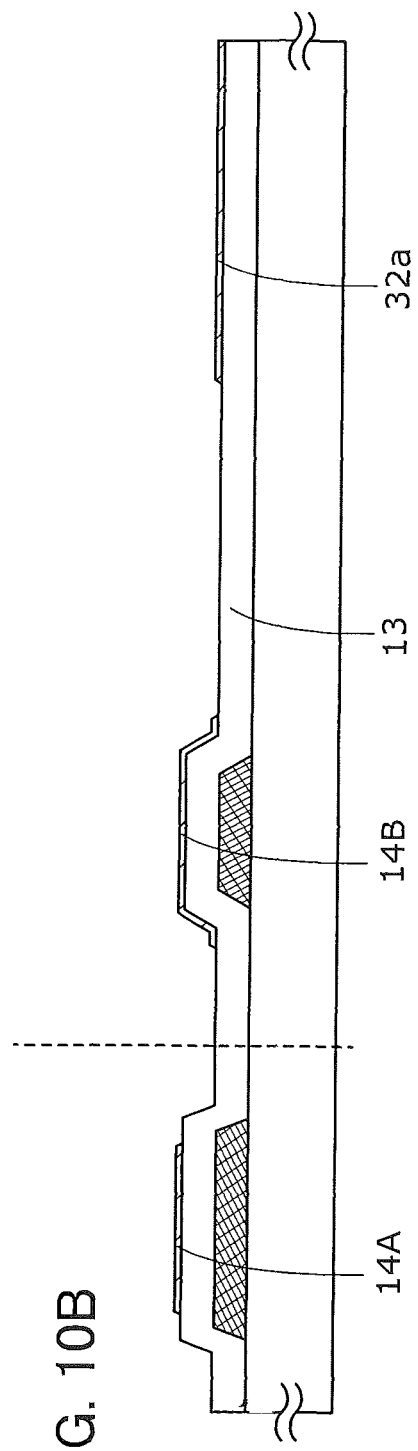
FIG. 10A
FIG. 10B

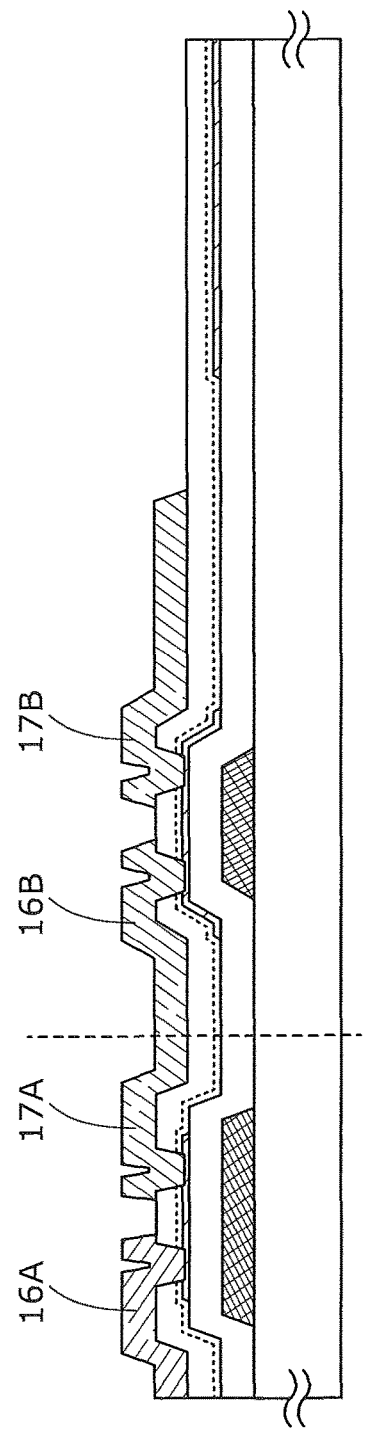
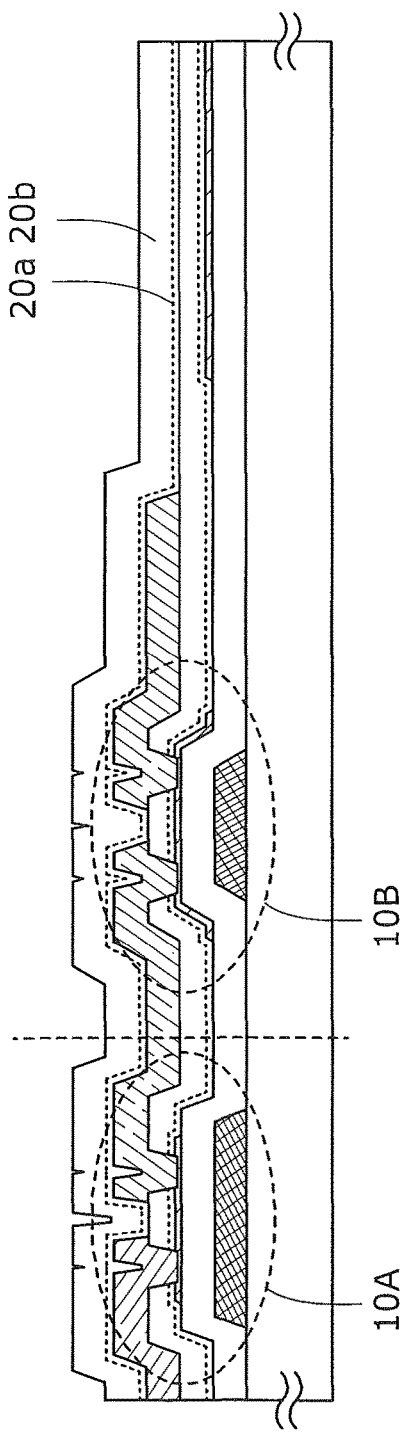
FIG. 12A
FIG. 12B

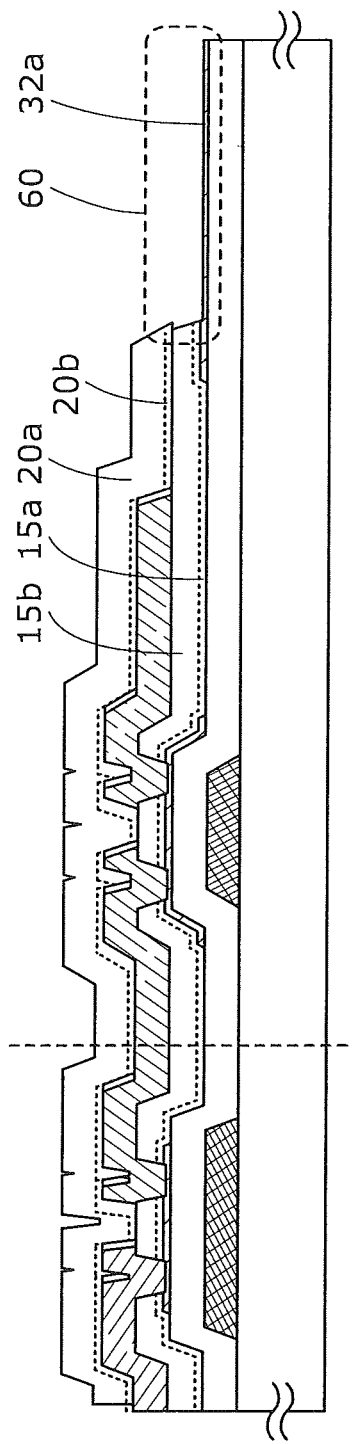
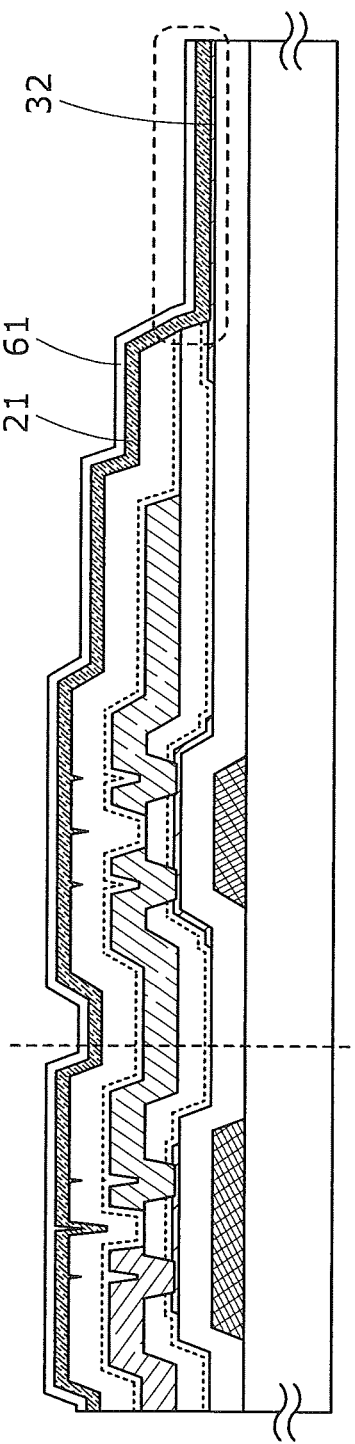
FIG. 13A
FIG. 13B

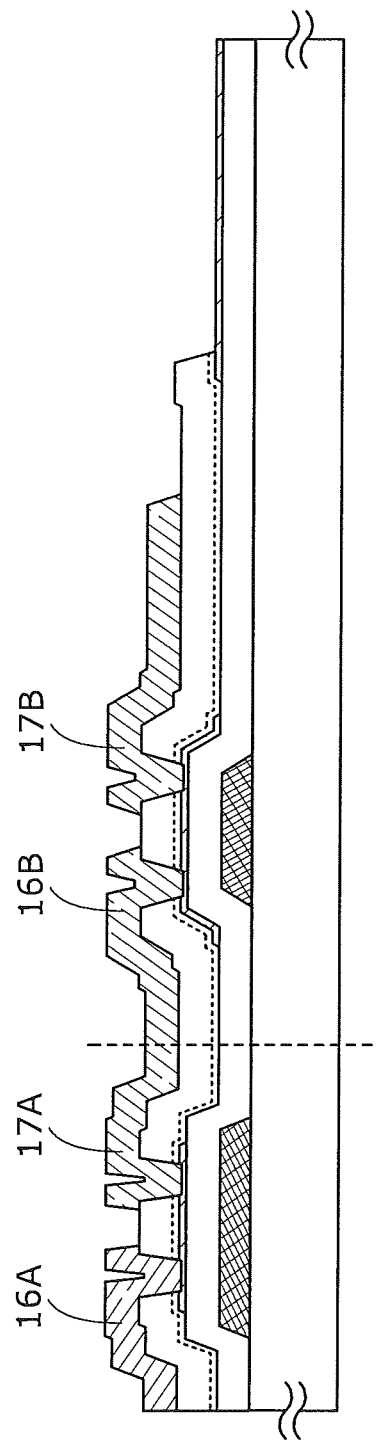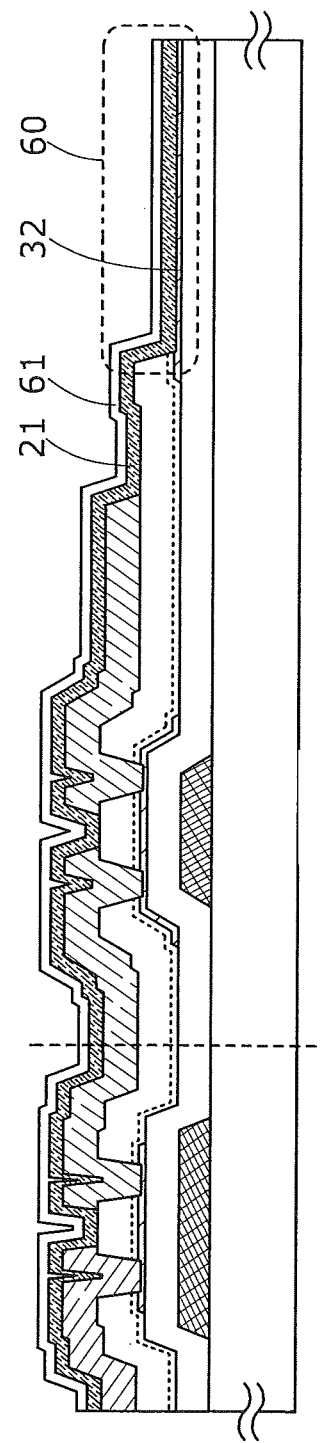

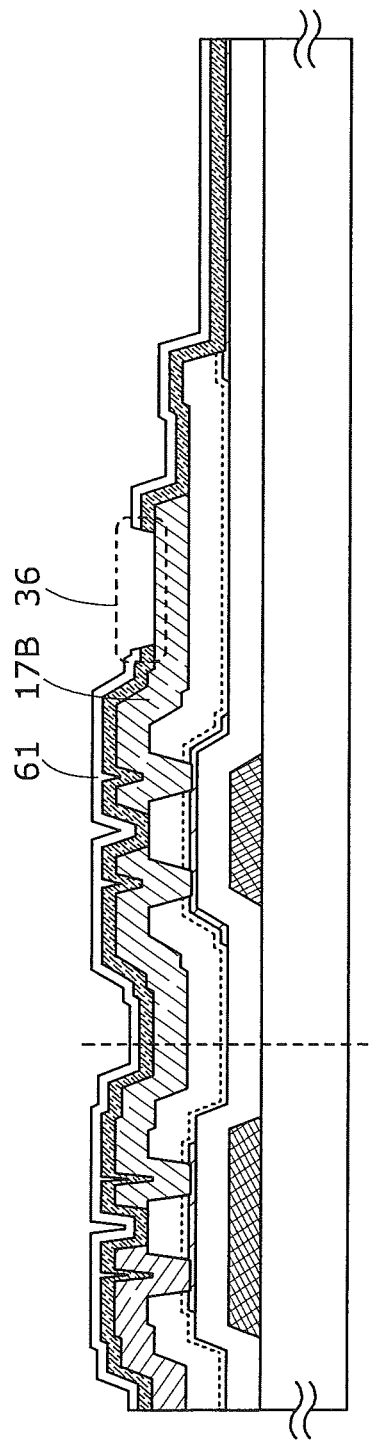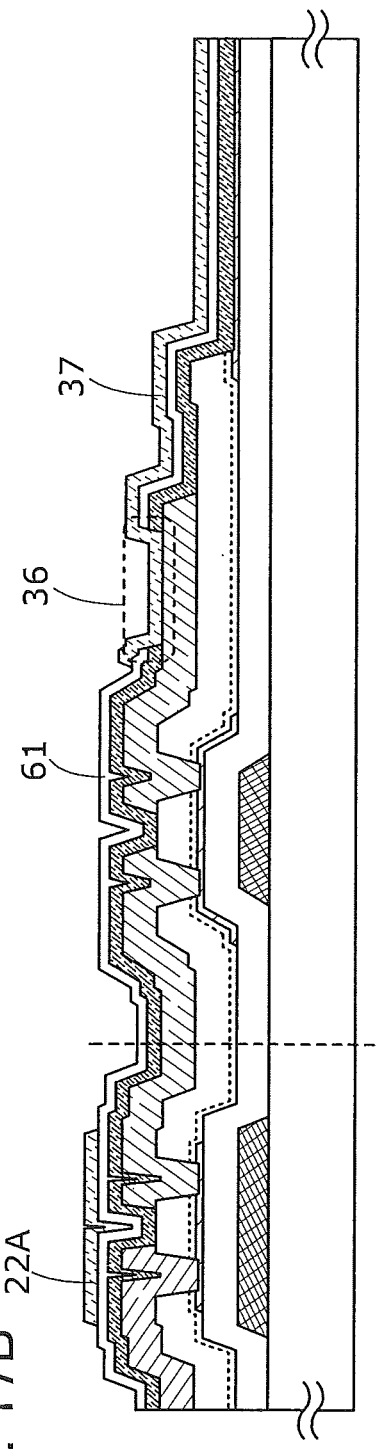

405  412  411  440

405  412  411  440

401  418  410  420  432

FIG. 25A
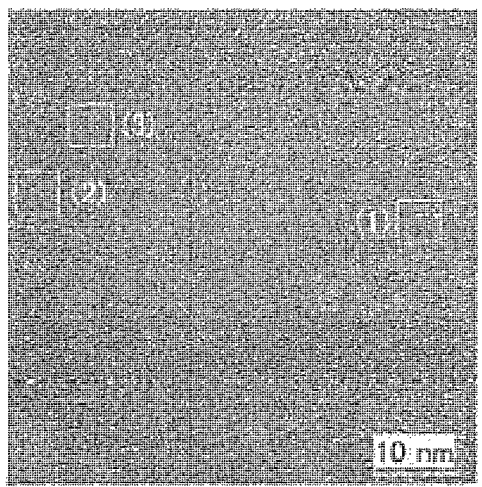
FIG. 25B     FIG. 25C     FIG. 25D
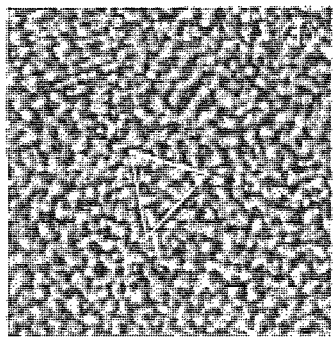 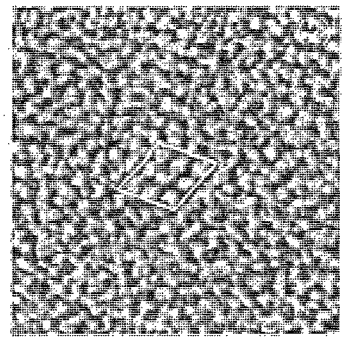 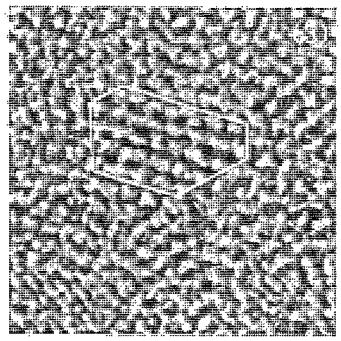

FIG. 27A
FIG. 27B
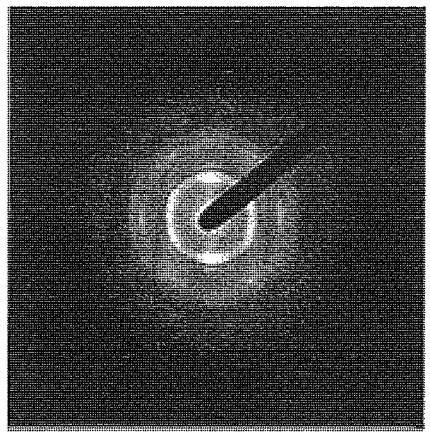 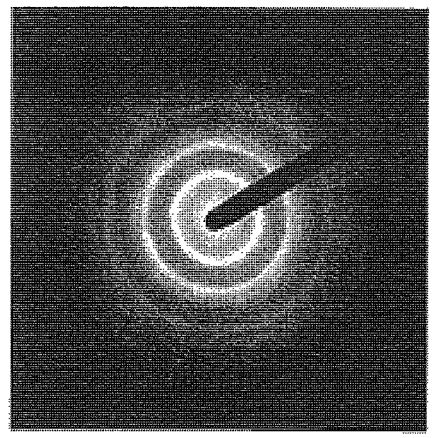

SEMICONDUCTOR DEVICE

This application is a continuation of copending U.S. application Ser. No. 14/556,769, filed on Dec. 1, 2014 which is incorporated herein by reference.

BACKGROUND OF THE INVENTION

1. Field of the Invention

The present invention relates to an object, a method, or a manufacturing method. In addition, the present invention relates to a process, a machine, manufacture, or a composition of matter. In particular, one embodiment of the present invention relates to a semiconductor device, a display device, a light-emitting device, a memory device, a driving method thereof, or a manufacturing method thereof. In particular, one embodiment of the present invention relates to a semiconductor device, a display device, a light-emitting device, a power storage device, a storage device, a driving method thereof, or a manufacturing method thereof.

2. Description of the Related Art

A metal oxide having semiconductor characteristics called an oxide semiconductor has attracted attention. The metal oxide is used for various applications. For example, indium oxide, which is a well-known metal oxide, is used for a light-transmitting pixel electrode in a liquid crystal display device, a light-emitting device, or the like. Examples of such metal oxides having semiconductor characteristics include tungsten oxide, tin oxide, indium oxide, and zinc oxide. Transistors in each of which a channel formation region is formed using such a metal oxide having semiconductor characteristics have been known (Patent Documents 1 and 2).

REFERENCE

[Patent Document 1] Japanese Published Patent Application No. 2007-123861
[Patent Document 2] Japanese Published Patent Application No. 2007-096055

SUMMARY OF THE INVENTION

Improvement in reliability is a big issue for mass production of a semiconductor device whose backplane is formed using a transistor that includes a channel formation region in an oxide semiconductor film. An object of one embodiment of the present invention is to provide a highly reliable semiconductor device manufactured using an oxide semiconductor film for a backplane.

Note that an object of one embodiment of the present invention is to provide a novel semiconductor device or the like. Note that the descriptions of these objects do not disturb the existence of other objects. In one embodiment of the present invention, there is no need to achieve all the objects. Other objects will be apparent from and can be derived from the description of the specification, the drawings, the claims, and the like.

A semiconductor device according to one embodiment of the present invention includes a first conductive film, a first insulating film over the first conductive film, an oxide semiconductor film which is over the first insulating film and overlaps with the first conductive film, a second insulating film over the oxide semiconductor film, and a pair of second conductive films electrically connected to the oxide semiconductor film through an opening portion included in the second insulating film. The second insulating film overlaps with a region of the oxide semiconductor film in which a carrier flows between the pair of second conductive films and overlaps with end portions of the oxide semiconductor film.

Alternatively, a semiconductor device according to one embodiment of the present invention includes a first conductive film, a first insulating film over the first conductive film, an oxide semiconductor film which is over the first insulating film and overlaps with the first conductive film, a second insulating film over the oxide semiconductor film, a pair of second conductive films electrically connected to the oxide semiconductor film through an opening portion included in the second insulating film, a third insulating film containing an oxide over the second insulating film and the pair of the second conductive films, and a fourth insulating film containing a nitride over the third insulating film. The second insulating film overlaps with a region of the oxide semiconductor film in which a carrier flows between the pair of second conductive films and overlaps with end portions of the oxide semiconductor film.

Alternatively, a semiconductor device according to one embodiment of the present invention includes a first conductive film, a first insulating film over the first conductive film, an oxide semiconductor film which is over the first insulating film and overlaps with the first conductive film, a second insulating film over the oxide semiconductor film, a pair of second conductive films electrically connected to the oxide semiconductor film through a first opening portion included in the second insulating film, a third insulating film containing oxide over the second insulating film and a pair of the second conductive films; a fourth insulating film containing nitride over the third insulating film, and a third conductive film which is over the fourth insulating film and overlaps with the oxide semiconductor film. The second insulating film overlaps with a region in which a carrier flows between the pair of second conductive films and overlaps with end portions of the oxide semiconductor film. The third conductive film is electrically connected to the first conductive film through a second opening portion included in the first to fourth insulating films. The end portions of the oxide semiconductor film overlap with the third conductive film with the first to fourth insulating films provided therebetween in a region different from regions where the pair of second conductive films are located.

Furthermore, in the semiconductor device of one embodiment of the present invention, the oxide semiconductor film may contain In, Ga, and Zn.

Furthermore, in the semiconductor device of one embodiment of the present invention, the oxide semiconductor film may be a CAAC-OS film.

One embodiment of the present invention allows for providing a highly reliable semiconductor device manufactured using an oxide semiconductor film for a backplane.

Note that, according to one embodiment of the present invention, a novel semiconductor device or the like can be provided. Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF THE DRAWINGS

FIGS. 9A and 9B illustrate a cross section of pixels and transistors, and a connection between conductive films.

FIGS. 10A and 10B illustrate a method for manufacturing a semiconductor device.

FIGS. 12A and 12B illustrate a method for manufacturing a semiconductor device.

FIGS. 13A and 13B illustrate a method for manufacturing a semiconductor device.

FIGS. 16A and 16B illustrate a method for manufacturing a semiconductor device.

FIGS. 17A and 17B illustrate a method for manufacturing a semiconductor device.

FIGS. 25A to 25D are Cs-corrected high-resolution TEM images of a plane of a CAAC-OS layer.

FIGS. 27A and 27B show electron diffraction patterns of a CAAC-OS.

DETAILED DESCRIPTION OF THE INVENTION

Embodiments of the present invention will be described below in detail with reference to the drawings. Note that the present invention is not limited to the following description. Note that the present invention is not limited to the following description, and it is easily understood by those skilled in the art that the mode and details can be variously changed without departing from the spirit and scope of the present invention. Therefore, the present invention should not be construed as being limited to the description of the embodiments below.

Note that a "source" of a transistor means a source region that is part of a semiconductor film functioning as an active layer or a source electrode connected to the semiconductor film. Similarly, a "drain" of the transistor means a drain region that is part of the semiconductor film or a drain electrode connected to the semiconductor film. A "gate" means a gate electrode.

<Structure Example 1 of Transistor>

Figure 1A:
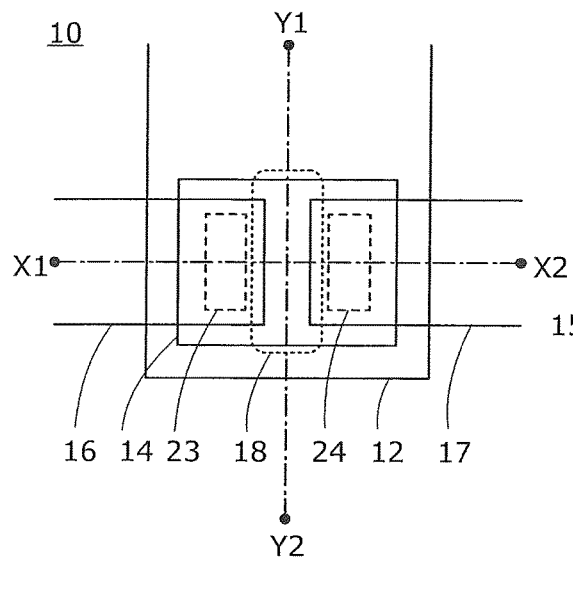
FIGS. 1A to 1C illustrate a structure of a transistor.
Figure 1B:
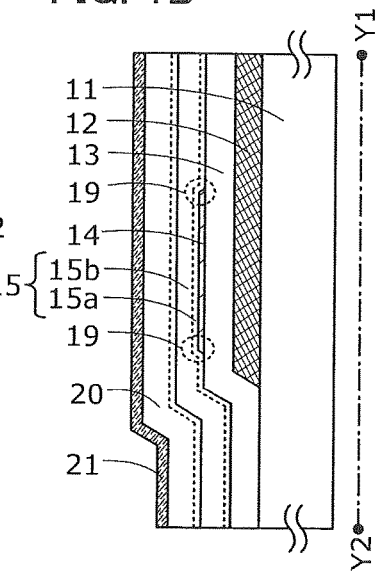
Figure 1C:
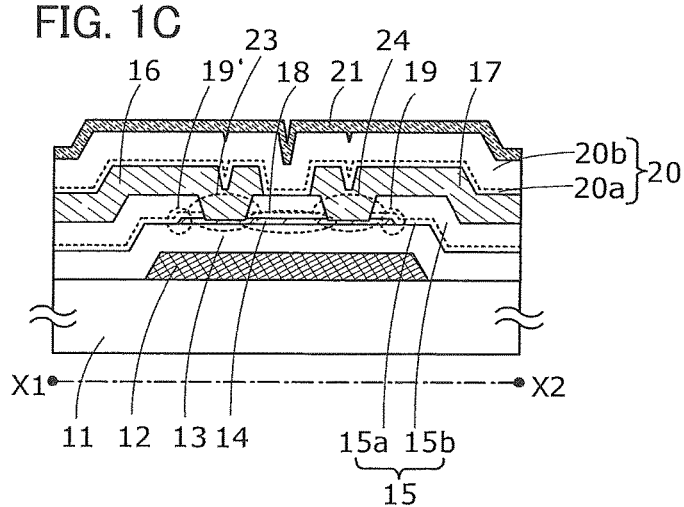

FIGS. 1A to 1C illustrate a specific structure example of a transistor 10 included in a semiconductor device of one embodiment of the present invention. FIG. 1A is the top view of the transistor 10. Note that various insulating films such as a gate insulating film are omitted in FIG. 1A to clarify the layout of the transistor 10. FIG. 1B is a cross-sectional view along the dashed line Y1-Y2 in the top view in FIG. 1A. FIG. 1C is a cross-sectional view along the dashed line X1-X2 in the top view in FIG. 1A.

As illustrated in FIGS. 1A to 1C, the transistor 10 includes a conductive film 12 that functions as a gate electrode over a substrate 11 having an insulating surface, an insulating film 13 that is over the conductive film 12 and functions as a gate insulating film, an oxide semiconductor film 14 that is over the insulating film 13 and overlaps with the conductive film 12, an insulating film 15 over the oxide semiconductor film 14, and conductive films 16 and 17 that function as a source electrode and a drain electrode and are electrically connected to the oxide semiconductor film 14 through opening portions 23 and 24 included in the insulating film 15. FIGS. 1A to 1C illustrate the case where the insulating film 15 includes an insulating film 15a and an insulating film 15b which are stacked in this order.

The insulating film 15 overlaps with a region 18 of the oxide semiconductor film 14 in which a carrier flows between the conductive films 16 and 17, and end portions 19 of the oxide semiconductor film 14. Although FIGS. 1A to 1C illustrate the case where the whole of the end portions 19 of the oxide semiconductor film 14 overlaps with the insulating film 15, part of the end portions 19 of the oxide semiconductor film 14 may overlap with the insulating film 15.

The region 18 and the end portions 19 overlap with the insulating film 15, thereby preventing entry of a metal included in the conductive films 16 and 17 into the oxide semiconductor film 14 due to etching or the like for forming the conductive films 16 and 17. Thus, deterioration of electrical characteristics of the transistor 10 due to impurities is suppressed, so that a highly reliable semiconductor device can be provided.

Furthermore, insulating films 20 and 21 are sequentially stacked over the insulating film 15 and the conductive films 16 and 17 in FIGS. 1A to 1C. The transistor 10 may include the insulating films 20 and 21. Although the multilayer insulating film 20 and the single-layer insulating film 21 are illustrated in FIGS. 1A to 1C, the insulating film 20 may be a single insulating film or a stack of three or more insulating films. The insulating film 21 may be a stack of two or more insulating films.

As the insulating films 15 and 20, an insulating film having higher capability to supply oxygen to the oxide semiconductor film 14 than the insulating film 21, for example, an oxide film having an insulating property (hereinafter, referred to as an oxide insulating film) such as a silicon oxide film or a silicon oxynitride film can be used. Furthermore, as the insulating film 21, an insulating film having higher capability to block oxygen, hydrogen, water, and the like than the insulating film 20 can be used. Since the insulating film 21 overlaps with the oxide semiconductor film 14 with the insulating films 15 and 20 provided therebetween, oxygen released from the insulating films 15 and 20 can be sufficiently supplied to the oxide semiconductor film 14. Furthermore, since the insulating film 21 overlaps with the oxide semiconductor film 14, it is possible to prevent entry of hydrogen, water, or the like into the oxide semiconductor film 14 from the outside.

As the insulating film 21, a nitride insulating film can be used, for example. The nitride insulating film has a capability to block an alkali metal and an alkaline earth metal as well as oxygen, hydrogen, water, and the like. As the nitride insulating film, a silicon nitride film, a silicon nitride oxide film, an aluminum nitride film, an aluminum nitride oxide film, or the like can be used. The use of the nitride insulating film as the insulating film 21 can prevent entry of an alkali metal and an alkaline earth metal as well as hydrogen, water, or the like to the oxide semiconductor film 14 from the outside.

The oxide insulating film having a capability to block oxygen, hydrogen, water, and the like may be used as the insulating film 21. As the oxide insulating film having the capability to block oxygen, hydrogen, water, and the like, aluminum oxide, aluminum oxynitride, gallium oxide, gallium oxynitride, yttrium oxide, yttrium oxynitride, hafnium oxide, and hafnium oxynitride can be given.

Thus, with the use of the insulating films 15, 20, and 21 having the above structure, deterioration of the electrical characteristics of the transistor 10 can be further suppressed, whereby a semiconductor device with higher reliability can be provided.

There are few carrier generation sources in a highly purified oxide semiconductor (purified oxide semiconductor) obtained by reduction of impurities such as moisture and hydrogen serving as electron donors (donors) and reduction of oxygen vacancies; therefore, the highly purified oxide semiconductor can be an intrinsic (i-type) semiconductor or a substantially i-type semiconductor. For this reason, a transistor having a channel formation region in a highly purified oxide semiconductor film has extremely small off-state current and high reliability. Thus, a transistor in which a channel formation region is formed in the oxide semiconductor film easily has an electrical characteristic of a positive threshold voltage (also referred to as a normally-off characteristic).

Specifically, various experiments can prove a small off-state current of a transistor having a channel formation region in a highly purified oxide semiconductor. For example, even when an element has a channel width of $1\times10^6$ μm and a channel length of 10 off-state current can be less than or equal to the measurement limit of a semiconductor parameter analyzer, i.e., less than or equal to $1\times10^{-13}$ A, at voltage (drain voltage) between the source electrode and the drain electrode of from 1 V to 10 V. In that case, it can be seen that off-state current standardized on the channel width of the transistor is lower than or equal to 100 zA/μm. In addition, a capacitor and a transistor are connected to each other and the off-state current is measured with a circuit in which charge flowing into or from the capacitor is controlled by the transistor. In the measurement, a highly-purified oxide semiconductor film was used for a channel formation region of the transistor, and the off-state current of the transistor was measured from a change in the amount of electrical charge of the capacitor per unit hour. As a result, it was found that, in the case where the voltage between the source electrode and the drain electrode of the transistor is 3 V, a lower off-state current of several tens of yA/μm is obtained. Accordingly, the off-state current of the transistor in which the purified oxide semiconductor film is used as a channel formation region is considerably lower than that of a transistor in which silicon having crystallinity is used.

<Structure Example 2 of Transistor>

Figure 2A:
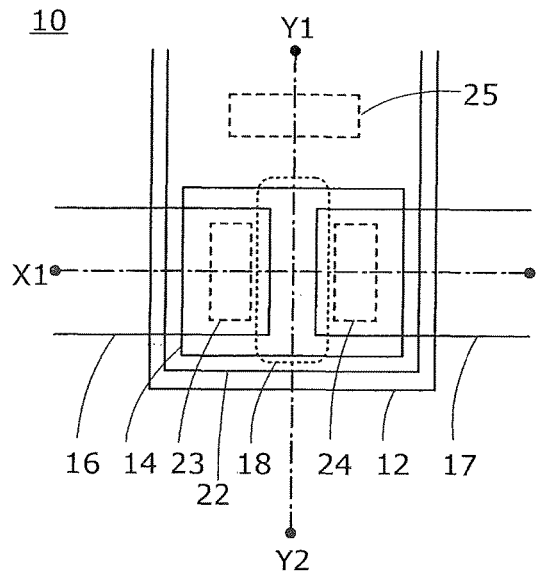
FIGS. 2A to 2C illustrate a structure of a transistor.
Figure 2B:
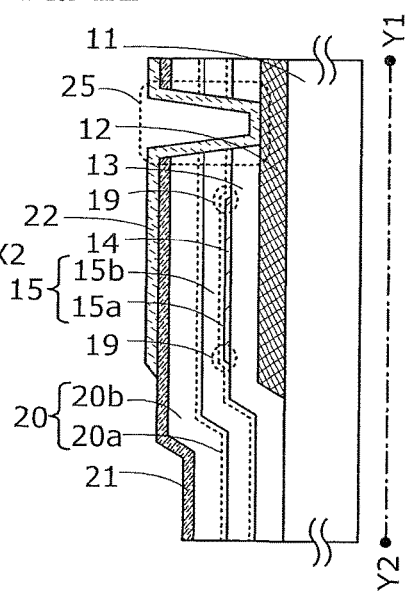
Figure 2C:
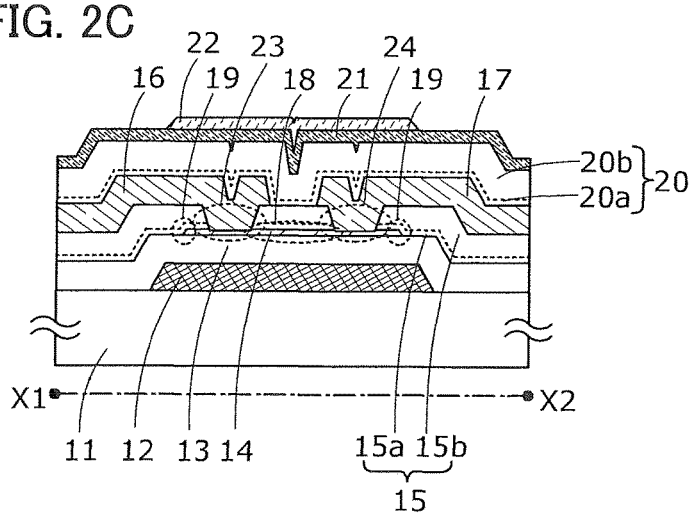

Next, FIGS. 2A to 2C illustrate another structure example of the transistor 10 included in a semiconductor device of one embodiment of the present invention. FIG. 2A is a top view of the transistor 10. Note that insulating films such as a gate insulating film are not illustrated in FIG. 2A in order to clarify the layout of the transistor 10. FIG. 2B is a cross-sectional view along the dashed line Y1-Y2 in the top view in FIG. 2A. FIG. 2C is a cross-sectional view along the dashed line X1-X2 in the cross-sectional view in FIG. 2C.

Like the transistor 10 illustrated in FIGS. 1A to 1C, the transistor 10 illustrated in FIGS. 2A to 2C includes the conductive film 12 that functions as a gate electrode over the substrate 11 having an insulating surface, the insulating film 13 that is over the conductive film 12 and functions as a gate insulating film, the oxide semiconductor film 14 that is over the insulating film 13 and overlaps with the conductive film 12, an insulating film 15 over the oxide semiconductor film 14, and a conductive films 16 and 17 that function as a source electrode and a drain electrode and are electrically connected to the oxide semiconductor film 14 through the opening portions 23 and 24 included in the insulating film 15.

As in the transistor 10 illustrated in FIGS. 1A to 1C, in the transistor 10 illustrated in FIGS. 2A to 2C, the insulating film 15 overlaps with the region 18 of the oxide semiconductor film 14 in which a carrier flows between the conductive films 16 and 17, and the end portions 19 of the oxide semiconductor film 14. Although FIGS. 2A to 2C illustrate the case where the whole of the end portions 19 of the oxide semiconductor film 14 overlap with the insulating film 15, part of the end portions 19 of the oxide semiconductor film 14 may overlap with the insulating film 15.

The region 18 and the end portions 19 overlap with the insulating film 15, thereby preventing entry of a metal included in the conductive films 16 and 17 into the oxide semiconductor film 14 due to etching or the like for forming the conductive films 16 and 17. The region 18 and the end portions 19 overlap with the insulating film 15, whereby the region 18 and the end portions 19 can be prevented from being exposed to plasma in etching for forming the conductive films 16 and 17. Thus, oxygen vacancies generated when oxygen is released from the region 18 and the end portions 19 can be suppressed. Alternatively, it is possible to prevent a state in which oxygen is easily released from the region 18 and the end portions 19 and an oxygen vacancy is easily formed. Therefore, deterioration of the electrical characteristics of the transistor 10 due to impurities can be suppressed and a highly reliable semiconductor device can be provided.

Furthermore, in FIGS. 2A to 2C, the insulating films 20 and 21 are sequentially stacked over the insulating film 15, the conductive film 16, and the conductive film 17. As the insulating films 15 and 20, an insulating film having higher capability to supply oxygen to the oxide semiconductor film 14 than the insulating film 21 can be used. Furthermore, as the insulating film 21, an insulating film having higher capability to block against oxygen, hydrogen, water, and the like than the insulating film 20 can be used. Thus, deterioration of the electrical characteristics of the transistor 10 is further suppressed, so that a semiconductor device with higher reliability can be provided.

The structure of the transistor 10 in FIGS. 2A to 2C is different from that illustrated in FIGS. 1A to 1C in that a conductive film 22 is over the insulating film 21. The conductive film 22 is provided over the insulating film 21 to overlap with the oxide semiconductor film 14. Furthermore, the conductive film 22 is electrically connected to the conductive film 12. Specifically, in FIGS. 2A to 2C, the conductive film 22 is electrically connected to the conductive film 12 through an opening portion 25 formed in the insulating films 13, 15, 20, and 21.

In the transistor 10 illustrated in FIGS. 2A to 2C, the conductive films 12 and 22 overlap with end portions of the oxide semiconductor film 14 that do not overlap with the conductive film 16 and the conductive film 17, i.e., end portions of the oxide semiconductor film 14 that are in a region different from regions where the conductive films 16 and 17 are located. When the end portions of the oxide semiconductor film 14 are exposed to plasma by etching for forming the end portions, a chlorine radical, a fluorine radical, or other radicals generated from an etching gas are easily bonded to a metal element contained in the oxide semiconductor. For this reason, in the end portions of the oxide semiconductor film 14, oxygen bonded to the metal element is easily eliminated, so that an oxygen vacancy is easily formed; thus, the oxide semiconductor film easily has n-type conductivity. However, an electric field applied to the end portions can be controlled by controlling the potentials of the conductive film 12 and the conductive film 22 because the end portions of the oxide semiconductor film 14 that do not overlap with the conductive film 16 and the conductive film 17 overlap with the conductive film 12 and the conductive film 22 in the transistor 10 illustrated in FIGS. 2A to 2C. Consequently, current that flows between the conductive film 16 and the conductive film 17 through the end portions of the oxide semiconductor film 14 can be controlled by the potential applied to the conductive film 12 and the conductive film 22. Such a structure of the transistor 10 is referred to as a surrounded channel (s-channel) structure.

Specifically, when a potential at which the transistor 10 is turned off is applied to the conductive film 12 and the conductive film 22, off-state current that flows between the conductive film 16 and the conductive film 17 through the end portions can be low. For this reason, in the transistor 10, even when the distance between the conductive films 16 and 17 at the end portions of the oxide semiconductor film 14 is reduced as a result of reducing the channel length to obtain high on-state current, the transistor 10 can have low off-state current. Consequently, with the short channel length, the transistor 10 can have high on-state current when in an on state and low off-state current when in an off state. When a potential at which the transistor 10 is turned on is applied to the conductive film 12 and the conductive film 22, because the end portions 19 of the oxide semiconductor film 14 overlap with the conductive film 12 and the conductive film 22, a carrier flows not only in a region in the vicinity of the interface between the oxide semiconductor film 14 and the insulating film 15, but also in other regions of the oxide semiconductor film 14; thus, the amount of carrier that move in the transistor 10 is increased. As a result, the on-state current and the field-effect mobility of the transistor 10 can be increased.

The channel length refers to the shortest carrier travel distance between the conductive films 16 and 17 in a region where the oxide semiconductor film 14 overlaps with the conductive film 12.

<Structure Example 3 of Transistor>

Figure 3A:
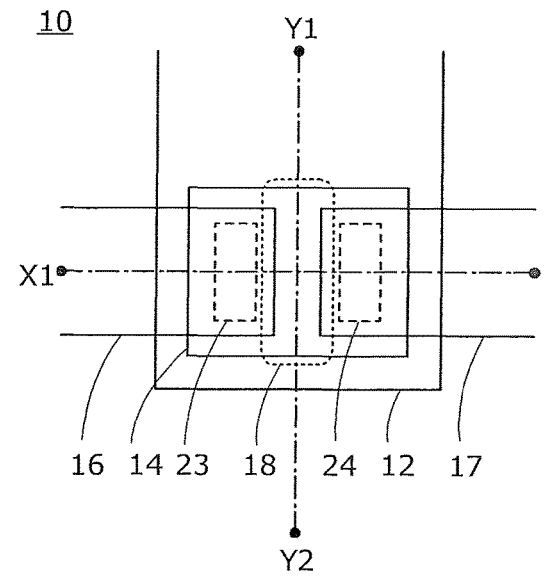
FIGS. 3A to 3C illustrate a structure of a transistor.
Figure 3B:
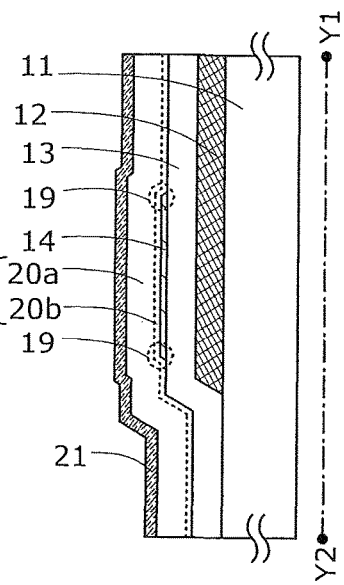
Figure 3C:
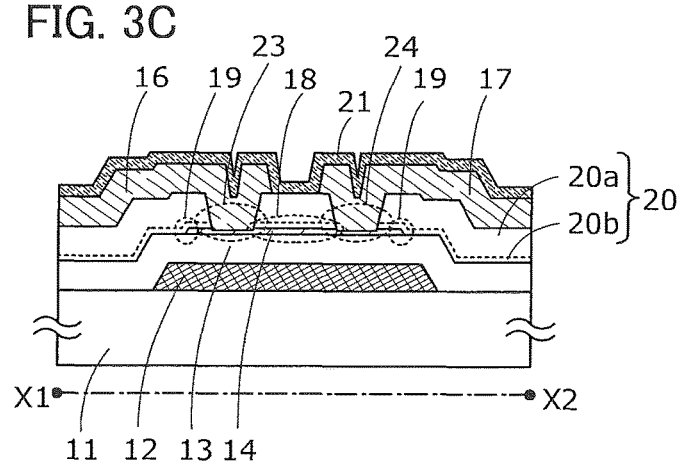

Next, FIGS. 3A to 3C illustrate a structure example of the transistor 10 included in a semiconductor device of one embodiment of the present invention. FIG. 3A is a top view of the transistor 10. Note that various insulating films such as a gate insulating film are omitted in FIG. 3A to clarify the layout of the transistor 10. FIG. 3B is a cross-sectional view along the dashed line Y1-Y2 in the top view in FIG. 3A. FIG. 3C is a cross-sectional view along the dashed line X1-X2 in the top view in FIG. 3A.

The structure of the transistor 10 illustrated in FIGS. 3A to 3C is different from that illustrated in FIGS. 1A to 1C in that the insulating film 15 is not included and the insulating film 20 is over the oxide semiconductor film 14, and the conductive films 16 and 17 are electrically connected to the oxide semiconductor film 14 through the opening portions 23 and 24, respectively.

Specifically, the transistor 10 illustrated in FIGS. 3A to 3C includes the conductive film 12 that functions as a gate electrode over the substrate 11 having an insulating surface, the insulating film 13 that is over the conductive film 12 and functions as a gate insulating film, the oxide semiconductor film 14 provided over the insulating film 13 to overlap with the conductive film 12, the insulating film 20 over the oxide semiconductor film 14, and the conductive film 16 and the conductive film 17 electrically connected to the oxide semiconductor film 14 through the opening portion 23 and the opening portion 24 in the insulating film 20.

In the transistor 10 illustrated in FIGS. 3A to 3C, the insulating film 20 overlaps with the region 18 of the oxide semiconductor film 14 in which a carrier flows between the conductive films 16 and 17, and the end portions 19 of the oxide semiconductor film 14. Although FIGS. 3A to 3C illustrate the case where the whole of the end portions 19 of the oxide semiconductor film 14 overlap with the insulating film 20, part of the end portions 19 of the oxide semiconductor film 14 may overlap with the insulating film 20.

The region 18 and the end portions 19 overlap with the insulating film 20, thereby preventing entry of a metal included in the conductive films 16 and 17 into the oxide semiconductor film 14 due to etching or the like for forming the conductive films 16 and 17. The region 18 and the end portions 19 overlap with the insulating film 20, whereby the region 18 and the end portions 19 can be prevented from being exposed to plasma in etching for forming the conductive films 16 and 17. Thus, oxygen vacancies generated when oxygen is released from the region 18 and the end portions 19 can be reduced. Alternatively, it is possible to prevent a state in which oxygen is easily released from the region 18 and the end portions 19 and an oxygen vacancy is easily formed. Therefore, deterioration of the electrical characteristics of the transistor 10 due to impurities can be suppressed and a highly reliable semiconductor device can be provided.

Furthermore, in FIGS. 3A to 3C, the insulating film 21 is provided over the insulating film 20, the conductive film 16, and the conductive film 17. As the insulating film 20, an insulating film having higher capability to supply oxygen to the oxide semiconductor film 14 than the insulating film 21 can be used. Furthermore, as the insulating film 21, an insulating film having higher capability to block oxygen, hydrogen, water, and the like than the insulating film 20 can be used. With the above structure, deterioration of electrical characteristics of the transistor 10 is further suppressed, so that a semiconductor device with higher reliability can be provided.

Not including the insulating film 15, the transistor 10 in FIGS. 3A to 3C can be manufactured in a smaller number of steps than the transistor 10 in FIGS. 1A to 1C.

Note that the transistor 10 illustrated in FIGS. 1A to 1C and FIGS. 2A to 2C may include a metal oxide film between the oxide semiconductor film 14 and the insulating film 15, the conductive film 16, and the conductive film 17. Furthermore, the transistor 10 illustrated in FIGS. 3A to 3C and FIGS. 4A to 4C may include a metal oxide film between the oxide semiconductor film 14 and the insulating film 20, the conductive film 16, and the conductive film 17.

When the metal oxide film is formed of an In-M-Zn film oxide in which the atomic ratio of the element M (M is Ti, Ga, Y, Zr, La, Ce, Nd, Sn, or Hf) is higher than that of In, the energy gap of the metal oxide film can be large and the electron affinity of the metal oxide film can be small. Therefore, a difference in electron affinity between the oxide semiconductor film 14 and the metal oxide film may be controlled by the proportion of the element M. Furthermore, oxygen vacancy is less likely to be generated in the metal oxide film in which the atomic ratio of Ti, Ga, Y, Zr, La, Ce, Nd, Sn, or Hf is higher than that of In because Ti, Ga, Y, Zr, La, Ce, Nd, Sn, and Hf each are a metal element that is strongly bonded to oxygen.

When an In-M-Zn oxide is used for the metal oxide film, the proportions of In and M, not taking Zn and O into consideration, are preferably as follows: the proportion of In is less than 50 at. % and the proportion of M is greater than or equal to 50 at. %; further preferably, the proportion of In is less than 25 at. % and the atomic percentage of M is greater than or equal to 75 at. %.

Further, in the case where each of the oxide semiconductor film 14 and the metal oxide film is formed of an In-M-Zn oxide film (M represents Ti, Ga, Y, Zr, Sn, La, Ce, Nd, Sn, or Hf), the proportion of M (M represents Ti, Ga, Y, Zr, Sn, La, Ce, Nd, Sn, or Hf) in the metal oxide film is larger than that in the oxide semiconductor film 14. Typically, the proportion of M in the oxide semiconductor film 14 is 1.5 or more times, preferably twice or more, more preferably three or more times as large as that in the oxide semiconductor film 14.

Furthermore, in the case where the oxide semiconductor film 14 and the metal oxide film are each formed of an In-M-Zn oxide film (M is Ti, Ga, Y, Zr, La, Ce, Nd, Sn, or Hf), when In:M:Zn=$x_1$:$y_1$:$z_1$[atomic ratio] is satisfied in the oxide semiconductor film 14 and In:M:Zn=$x_2$:$y_2$:$z_2$[atomic ratio] is satisfied in the metal oxide film, $y_2/x_2$ is larger than $y_1/x_1$, preferably $y_2/x_2$ is 1.5 or more times as large as $y_1/x_1$, further preferably, $y_2/x_2$ is two or more times as large as $y_1/x_1$, still further preferably $y_2/x_2$ is three or more times or four or more times as large as $y_1/x_1$. In this case, it is preferable that in the oxide semiconductor film 14, $y_1$ be larger than or equal to $x_1$ because the transistor 10 including the oxide semiconductor film 14 can have stable electrical characteristics. However, when $y_1$ is three or more times as large as $x_1$, the field-effect mobility of the transistor including the oxide semiconductor film 14 is reduced. Thus, it is preferable that $y_1$ be less than three times as large as $x_1$.

In the case where the oxide semiconductor film 14 is formed of an In-M-Zn oxide film (M is Ti, Ga, Y, Zr, La, Ce, Nd, Sn, or Hf) and a target having the atomic ratio of metal elements of In:M:Zn=$x_1$:$y_1$:$z_1$ is used for depositing the oxide semiconductor film 14, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film to be described later as the oxide semiconductor film 14 is easily formed. Typical examples of the atomic ratio of the metal elements of the target are In:M:Zn=1:1:1, In:M:Zn=1:1:1.2, and In:M:Zn=3:1:2.

In the case where the metal oxide film is formed of an In-M-Zn oxide film (M is Ti, Ga, Y, Zr, La, Ce, Nd, Sn, or Hf) and a target having the atomic ratio of metal elements of In:M:Zn=$x_2$:$y_2$:$z_2$ is used for depositing the metal oxide film 108a, $x_2/y_2$ is preferably less than $x_1/y_1$, and $z_2/y_2$ is preferably greater than or equal to ⅓ and less than or equal to 6, further preferably greater than or equal to 1 and less than or equal to 6. When the atomic ratio of M with respect to indium is high, the energy gap of the metal oxide film 108a can be large and the electron affinity thereof can be small; therefore, $y_2/x_2$ is preferably greater than or equal to 3 or greater than or equal to 4. Typical examples of the atomic ratio of the metal elements of the target include In:M:Zn=1:3:2, In:M:Zn=1:3:4, In:M:Zn=1:3:5, In:M:Zn=1:3:6, In:M:Zn=1:4:2, In:M:Zn=1:4:4, and In:M:Zn=1:4:5.

Further, in the case where the metal oxide film is formed of an In-M oxide film (M is Ti, Ga, Y, Zr, La, Ce, Nd, Sn, or Hf), a deviant metal element (e.g., zinc) is not contained as M, whereby the metal oxide film 108b which does not include a spinel crystal structure can be formed. For the metal oxide film, for example, an In—Ga oxide film can be used. The In—Ga oxide can be formed by a sputtering method using an In—Ga metal oxide target (In:Ga=7:93), for example. To deposit the metal oxide film by a sputtering method using DC discharge, on the assumption that an atomic ratio of In:M is x:y, it is preferable that y/(x+y) be less than or equal to 0.96, further preferably less than or equal to 0.95, for example, 0.93.

Note that the atomic ratio of each of the oxide semiconductor film 14, and the metal oxide film varies within a range of ±40% of that in the above atomic ratio as an error.

<Structure Example 4 of Transistor>

Figure 4A:
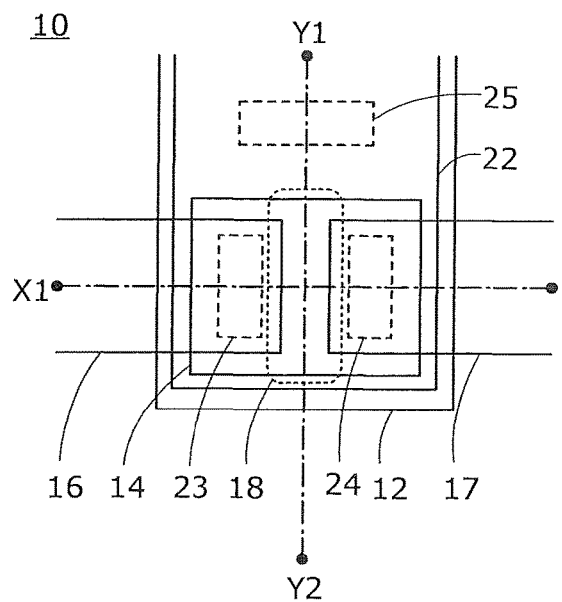
FIGS. 4A to 4C illustrate a structure of a transistor.
Figure 4B:
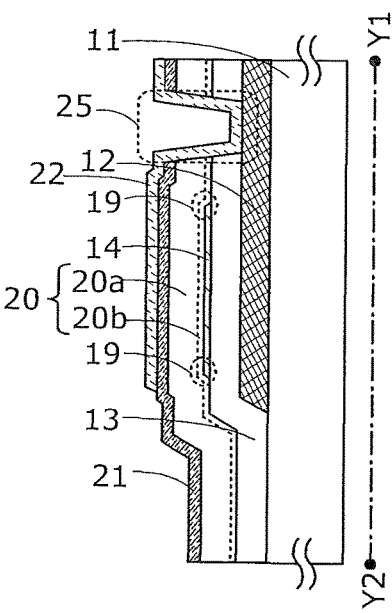
Figure 4C:
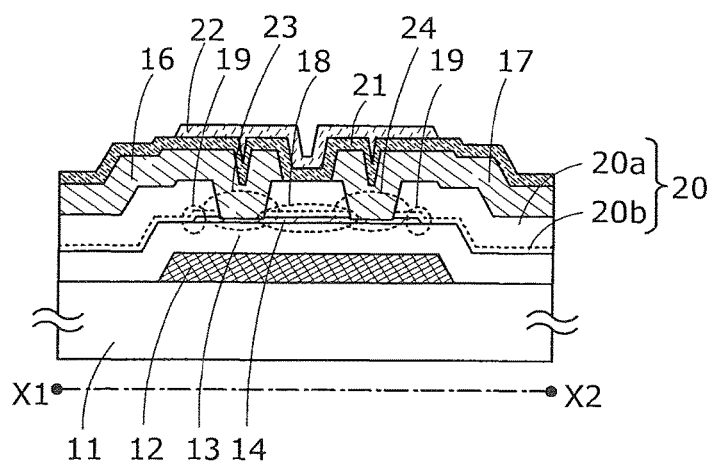

Next, another structural example of the transistor 10 included in a semiconductor device of one embodiment of the present invention is illustrated in FIGS. 4A to 4C. FIG. 4A is the top view of the transistor 10. Note that various insulating films such as a gate insulating film are omitted in FIG. 4A to clarify the layout of the transistor 10. FIG. 4B is a cross-sectional view along the dashed line Y1-Y2 in the top view in FIG. 4A. FIG. 4C is a cross-sectional view along the dashed line X1-X2 in the top view in FIG. 4A.

The structure of the transistor 10 in FIGS. 4A to 4C is different from that in FIGS. 3A to 3C in that the conductive film 22 is over the insulating film 21. The conductive film 22 is provided over the insulating film 21 to overlap with the oxide semiconductor film 14. Furthermore, the conductive film 22 is electrically connected to the conductive film 12. Specifically, in FIGS. 4A to 4C, the conductive film 22 is electrically connected to the conductive film 12 through the opening portion 25 included in the insulating films 13, 20, and 21.

With the above structure, the transistor 10 illustrated in FIGS. 4A to 4C has an s-channel structure. For this reason, even when the distance between the conductive films 16 and 17 in the end portions of the oxide semiconductor film 14 is reduced as a result of reducing the channel length, the transistor 10 can have a low off-state current. In addition, the amount of carriers that move in the oxide semiconductor film 14 is increased; accordingly, the on-state current and field-effect mobility of the transistor 10 can be increased.

<Structure Example of Display Device>

Next, a structure example of a display device as an example of semiconductor device of one embodiment of the present invention is described.

Figure 7A:
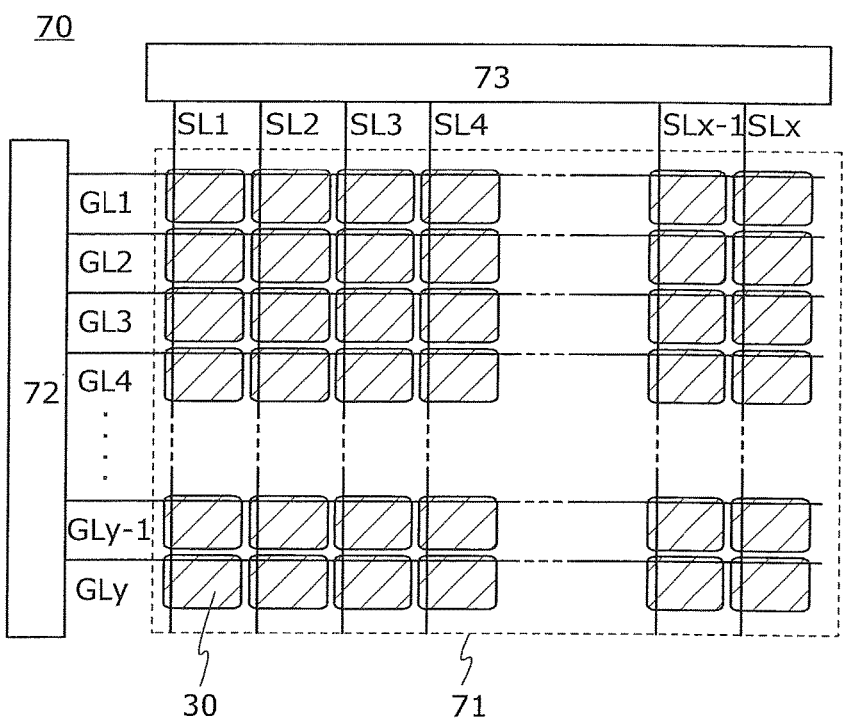
FIGS. 7A to 7C illustrate a structure of a display device.

In a display device 70 illustrated in FIG. 7A, a pixel portion 71 includes a plurality of pixels 30, wirings GL (wirings GL1 to GLy, y: a natural number) that correspond to bus lines each selecting the pixels 30 in a row, and wirings SL (wirings SL1 to SLx, x: a natural number) for supplying video signals to the selected pixels 30. The input of signals to the wirings GL is controlled by a driver circuit 72. The input of image signals to the wirings SL is controlled by a driver circuit 73. Each of the plurality of pixels 30 is electrically connected to at least one of the wirings GL and at least one of the wirings SL.

The kinds and number of the wirings in the pixel portion 71 can be determined by the structure, number, and position of the pixels 30. Specifically, in the pixel portion 71 illustrated in FIG. 7A, the pixels 30 are arranged in a matrix of x columns and y rows, and the wirings SL1 to SLx and the wirings GL1 to GLy are provided in the pixel portion 71.

Although FIG. 7A illustrates the case where the driver circuits 72 and 73 and the pixel portion 71 are formed over one substrate, the driver circuits 72 and 73 may be formed over a substrate different from a substrate over which the pixel portion 71 is formed.

Figure 7B:
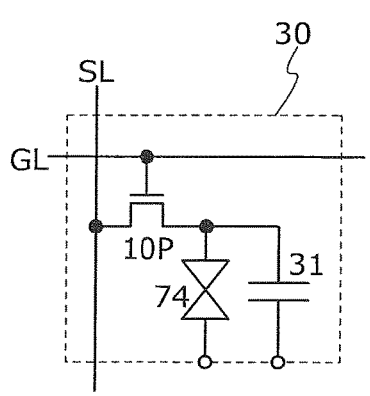

FIG. 7B illustrates an example of a structure of the pixel 30 in a liquid crystal display device that is an example of the display device. Each of the pixels 30 includes a liquid crystal element 74, a transistor 10P for controlling supply of an image signal to the liquid crystal element 74, and a capacitor 31 for holding a voltage between a pixel electrode and a common electrode of the liquid crystal element 74. The liquid crystal element 74 includes a pixel electrode, a common electrode, and a liquid crystal layer which contains a liquid crystal material and to which a voltage is applied across the pixel electrode and the common electrode.

The transistor 10P controls whether to supply the potential of the wiring SL to the pixel electrode of the liquid crystal element 74. A predetermined potential is applied to the common electrode of the liquid crystal element 74.

The connection state between the transistor 10P and the liquid crystal element 74 is specifically described below. In FIG. 7B, a gate of the transistor 10P is electrically connected to any one of the wirings GL1 to GLy. One of a source and a drain of the transistor 10P is electrically connected to any one of the wirings SL1 to SLx, and the other is electrically connected to the pixel electrode of the liquid crystal element 74.

The transmittance of the liquid crystal element 74 changes when the alignment of liquid crystal molecules included in the liquid crystal layer changes in accordance with the level of voltage applied between the pixel electrode and the common electrode. Accordingly, when the transmittance of the liquid crystal element 74 is controlled by the potential of an image signal supplied to the pixel electrode, gray-scale images can be displayed. In each of the plurality of pixels 30 included in the pixel portion 71, the gray level of the liquid crystal element 74 is adjusted in response to an image signal containing image data; thus, an image is displayed on the pixel portion 71.

FIG. 7B illustrates an example in which the one transistor 10P is used as a switch for controlling the input of an image signal to the pixels 30. However, a plurality of transistors functioning as one switch may be used in the pixels 30.

In one embodiment of the present invention, the transistor 10P with an extremely low off-state current is preferably used as the switch for controlling the input of a video signal to the pixels 30. When the transistor 10P has an extremely low off-state current, leakage of charge through the transistor 10P can be prevented. Thus, the potential of an image signal that is applied to the liquid crystal element 74 and the capacitor 31 can be held more reliably. Accordingly, the change in the transmittance of the liquid crystal element 74 due to leakage of electric charge in one frame period is prevented, so that the quality of an image to be displayed can be improved. Since leakage of charge through the transistor 10P can be prevented when the transistor 10P has low off-state current, the supply of a power supply potential or a signal to the driver circuit 72 and the driver circuit 73 may be stopped in a period during which a still image is displayed. With the above configuration, the number of times of writing image signals to the pixel portion 71 can be reduced, and thus power consumption of the display device can be reduced.

A transistor including a semiconductor film containing an oxide semiconductor has extremely low off-state current, and therefore is suitable for the transistor 10P, for example.

Figure 7C:
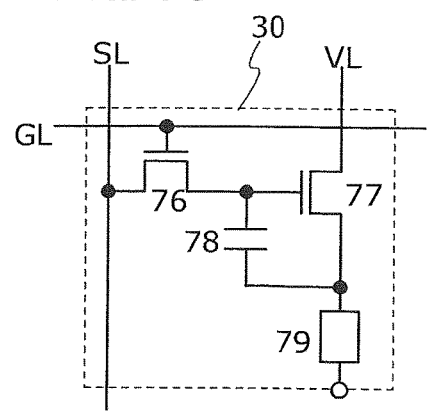

Next, FIG. 7C illustrates another example of the pixel 30 in a light-emitting device that is an example of the display device. The pixels 30 include a transistor 77 for controlling input of a video signal to the pixels 30, a light-emitting element 79, the transistor 77 for controlling the value of current supplied to the light-emitting element 79 in response to a data signal, and a capacitor 78 for holding the potential of an image signal.

Examples of the light-emitting elements 79 includes an element whose luminance is controlled by current or voltage, such as a light-emitting diode (LED) or an organic light-emitting diode (OLED). For example, an OLED includes at least an EL layer, an anode, and a cathode. The EL layer is formed using a single layer or a plurality of layers between the anode and the cathode, at least one of which is a light-emitting layer containing a light-emitting substance.

From the EL layer, electroluminescence is obtained by current supplied when a potential difference between the cathode and the anode is higher than or equal to the threshold voltage of the light-emitting element 79. As electroluminescence, there are luminescence (fluorescence) at the time of returning from a singlet-excited state to a ground state and luminescence (phosphorescence) at the time of returning from a triplet-excited state to a ground state.

The potential of one of an anode and a cathode of the light-emitting element 79 is controlled in response to an image signal input to the pixels 30. The one of the anode and the cathode whose potential is controlled in response to an image signal is used as a pixel electrode, and the other is used as a common electrode. A predetermined potential is supplied to the common electrode of the light-emitting element 79, and the luminance of the light-emitting element 79 is determined by a potential difference between the pixel electrode and the common electrode. Thus, the luminance of the light-emitting element 79 is controlled by the potential of the image signal, so that the light-emitting element 79 can express gray level. In each of the plurality of pixels 30 included in the pixel portion, the gray level of the light-emitting element 79 is adjusted in response to an image signal containing image data; thus, an image is displayed on the pixel portion 71.

Next, connection between the transistor 76, the transistor 77, the capacitor 78, and the light-emitting element 79 that are included in the pixels 30 is described.

One of a source and a drain of the transistor 76 is electrically connected to the wiring SL, and the other is electrically connected to a gate of the transistor 77. A gate of the transistor 76 is electrically connected to a wiring GL. One of a source and a drain of the transistor 77 is electrically connected to a power supply line VL, and the other is electrically connected to the light-emitting element 79. Specifically, the other of the source and the drain of the transistor 77 is electrically connected to one of the anode and the cathode of the light-emitting element 79. A predetermined potential is applied to the other of the anode and the cathode of the light-emitting element 79.

The transistor 10 illustrated in FIGS. 1A to 1C, FIGS. 2A to 2C, FIGS. 3A to 3C, and FIGS. 4A to 4C is used as the transistor 10B in FIG. 7B. The transistor 10 illustrated in FIGS. 1A to 1C, FIGS. 2A to 2C, FIGS. 3A to 3C, and FIGS. 4A to 4C is used as the transistor 76 or the transistor 77 in FIG. 7C.

Note that although the light-emitting element 79 or the liquid crystal element 74 is used as a display element, one embodiment of the present invention is not limited to this case.

For example, in this specification and the like, a display element, a display device which is a device including a display element, a light-emitting element, and a light-emitting device which is a device including a light-emitting element can employ a variety of modes or can include a variety of elements. Examples of a display element, a display device, a light-emitting element, or a light-emitting device include a display medium whose contrast, luminance, reflectance, transmittance, or the like is changed by electromagnetic action, such as an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator (IMOD) element, a MEMS shutter display element, an optical-interference-type MEMS display element, an electrowetting element, a piezoelectric ceramic display, or a carbon nanotube. Note that examples of display devices having EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

<Structure Example 1 of Pixel>

Figure 5:
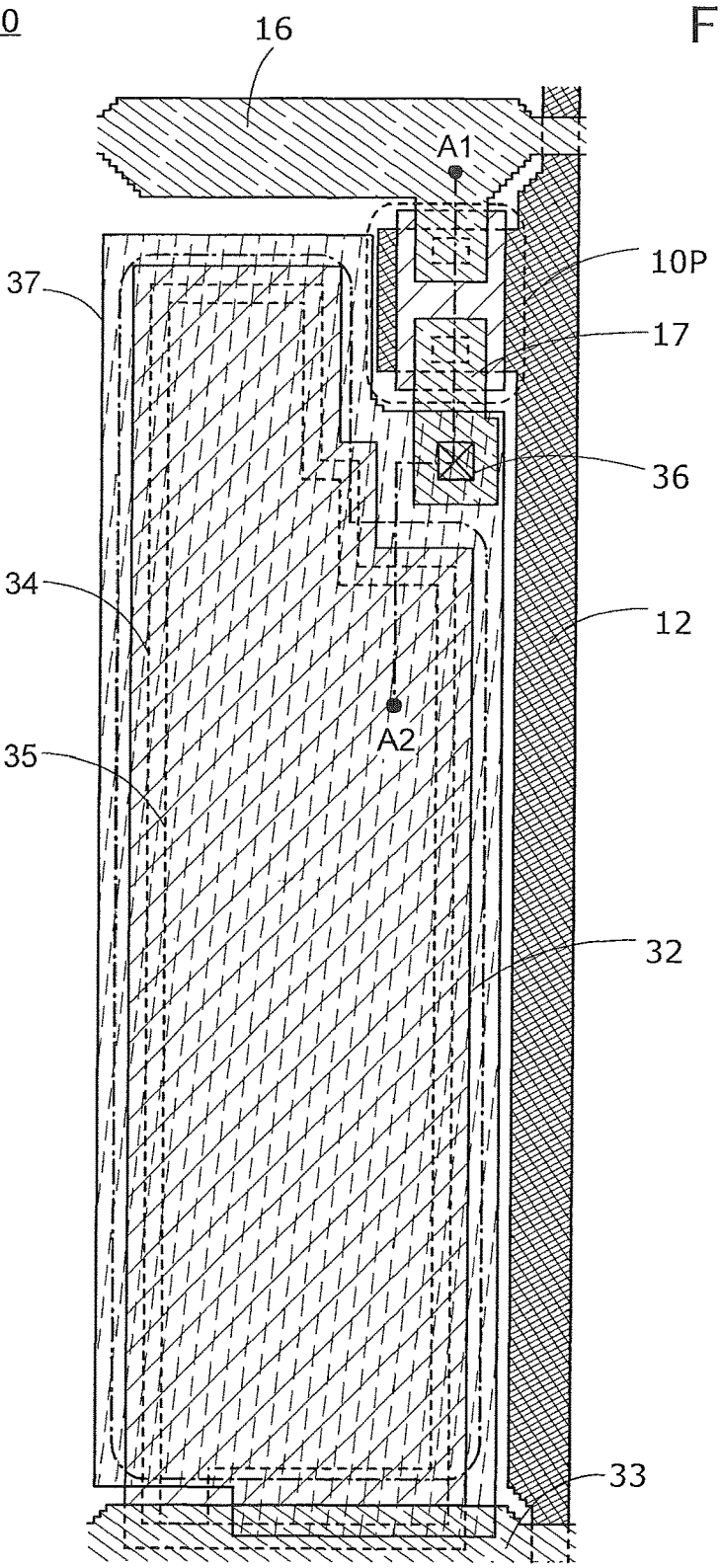
FIG. 5 is a top view of a pixel.
Figure 6:
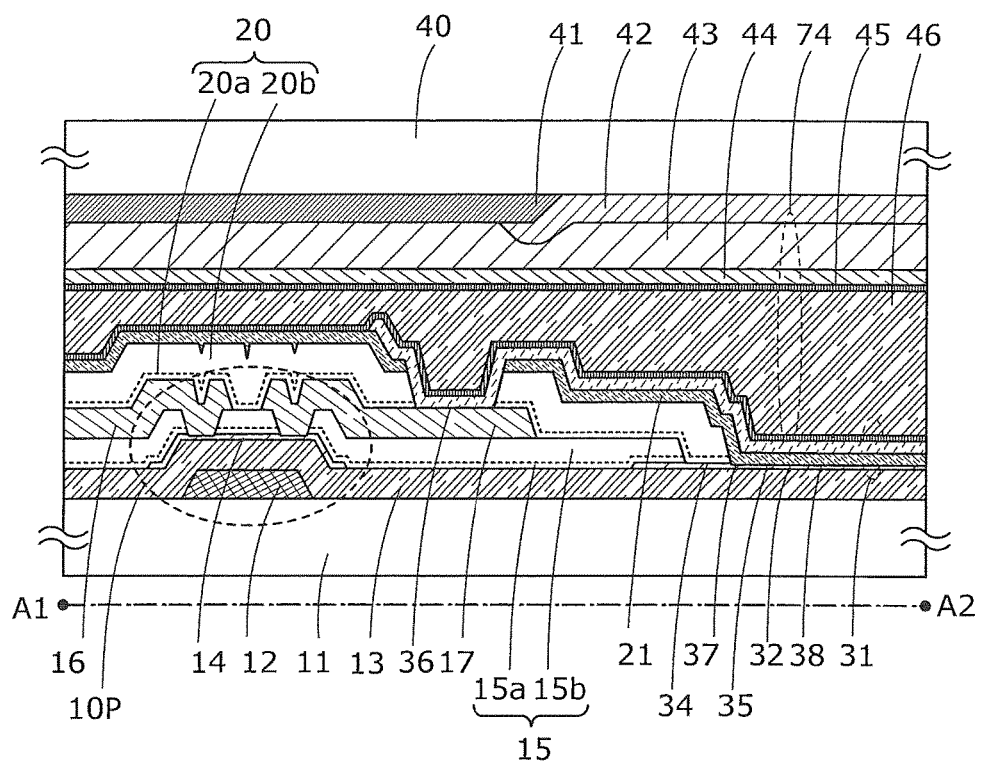
FIG. 6 is a cross-sectional view of a pixel.

Next, a structure example of the pixel 30 is described, taking as an example a liquid crystal display device that is a semiconductor device of one embodiment of the present invention. FIG. 5 illustrates, as an example, a top view of the pixels 30 formed over the substrate 11 together with the transistor 10 in FIGS. 1A to 1C. Note that insulating films are not illustrated in FIG. 5 in order to clarify the layout of the pixels 30. FIG. 6 is a cross-sectional view of the liquid crystal display device using an element substrate including the pixels 30 illustrated in FIG. 5. FIG. 6 corresponds to a cross-sectional view taken along dashed line A1-A2 in FIG. 5.

The pixel 30 illustrated in FIG. 5 and FIG. 6 includes the transistor 10P and the capacitor 31. In FIG. 6, the pixel 30 includes the liquid crystal element 74. Note that although the case where the transistor 10 illustrated in FIGS. 1A to 1C is used as the transistor 10P is illustrated in FIG. 5 and FIG. 6, the transistor 10 shown in any of FIGS. 2A to 2C, FIGS. 3A to 3C, and FIGS. 4A to 4C may be used as the transistor 10P.

The conductive film 12 has a function as the wiring GL illustrated in FIG. 7B in addition to a function as the gate of the transistor 10P. The conductive film 17 has a function as the wiring SL illustrated in FIG. 7B in addition to a function as the source or the drain of the transistor 10P.

The pixels 30 include a metal oxide film 32 over the insulating film 13. The metal oxide film 32 is a conductive film that transmits visible light. A conductive film 33 electrically connected to the metal oxide film 32 is provided over the metal oxide film 32. The conductive film 33 serves as a wiring that supplies a predetermined potential to the metal oxide film 32.

An opening portion is provided in the insulating film 15 and the insulating film 20 over the metal oxide film 32. Specifically, the insulating film 15 has an opening portion 34, and the insulating film 20 has an opening portion 35. In a region where the opening portion 34 overlaps with the opening portion 35, the insulating film 21 is in contact with the metal oxide film 32.

Note that when an oxide semiconductor film is formed over the insulating film 13 and the insulating film 21 which is a nitride insulating film is formed in contact with the oxide semiconductor film, the conductivity of the oxide semiconductor film can be increased. In that case, the oxide semiconductor film with high conductivity can be used as the metal oxide film 32. The conductivity of the oxide semiconductor film is increased probably because oxygen vacancies are formed in the oxide semiconductor film at the time of forming the opening portion 35, and hydrogen diffused from the insulating film 21 is bonded to the oxygen vacancies to form a donor. Specifically, the resistivity of the metal oxide film 32 is higher than or equal to $1\times10^{-3}$ Ωcm and lower than $1\times10^{4}$ Ωcm, preferably higher than or equal to $1\times10^{-3}$ Ωcm and lower than $1\times10^{-1}$ Ωcm.

It is preferable that the metal oxide film 32 have a higher hydrogen concentration than the oxide semiconductor film 14. In the metal oxide film 32, the hydrogen concentration measured by secondary ion mass spectrometry (SIMS) is greater than or equal to $8\times10^{19}$ atoms/cm$^3$, preferably greater than or equal to $1\times10^{20}$ atoms/cm$^3$, more preferably greater than or equal to $5\times10^{20}$ atoms/cm$^3$. In the oxide semiconductor film 14, the hydrogen concentration measured by SIMS is less than $5\times10^{19}$ atoms/cm$^3$, preferably less than $5\times10^{18}$ atoms/cm$^3$, more preferably less than or equal to $1\times10^{18}$ atoms/cm$^3$, still more preferably less than or equal to $5\times10^{17}$ atoms/cm$^3$, further preferably less than or equal to $1\times10^{16}$ atoms/cm$^3$.

As the insulating film 21 which is a nitride insulating film, for example, a silicon nitride film, a silicon nitride oxide film, or an aluminum nitride film, or an aluminum nitride oxide film can be used.

Furthermore, an opening portion 36 is provided in the insulating film 20 and the insulating film 21 to overlap with the conductive film 17. A conductive film 37 that transmits visible light and serves as a pixel electrode is provided over the insulating film 20 and the insulating film 21. The conductive film 37 is electrically connected to the conductive film 17 in the opening portion 36. The conductive film 37 overlaps with the metal oxide film 32 in a region where the opening portion 34 overlaps with the opening portion 35. A portion where the conductive film 37 overlaps with the metal oxide film 32 with the insulating film 21 provided therebetween serves as a capacitor 31.

In the capacitor 31, the metal oxide film 32 and the conductive film 37 serving as a pair of electrodes and the insulating film 21 serving as a dielectric film transmit visible light. This means that the capacitor 31 transmits visible light. Thus, the aperture ratio of the pixels 30 can be higher than that of a pixel including a capacitor having a property of transmitting less visible light. Therefore, the required capacitance for high image quality can be secured and the aperture ratio of the pixel can be increased; thus, light loss can be reduced in a panel and power consumption of a display device can be reduced.

An alignment film 38 is provided over the conductive film 37.

A substrate 40 is provided to face the substrate 11. A shielding film 41 blocking visible light and a coloring layer 42 transmitting visible light in a specific wavelength range are provided on the substrate 40. A resin film 43 is provided on the shielding film 41 and the coloring layer 42, and a conductive film 44 serving as a common electrode is provided on the resin film 43. An alignment film 45 is provided over the conductive film 44.

Between the substrate 11 and the substrate 40, a liquid crystal layer 46 containing a liquid crystal material is sandwiched between the alignment film 38 and the alignment film 45. The liquid crystal element 74 includes the conductive film 37, the conductive film 44, and the liquid crystal layer 46.

Although a twisted nematic (TN) mode is used as a method for driving the liquid crystal in FIG. 5 and FIG. 6, the following can be used as a method for driving the liquid crystal: a fringe field switching (FFS) mode, a super twisted nematic (STN) mode, a vertical alignment (VA) mode, a multi-domain vertical alignment (MVA) mode, an in-plane-switching (IPS) mode, an optically compensated birefringence (OCB) mode, a blue phase mode, a transverse bend alignment (TBA) mode, a VA-IPS mode, an electrically controlled birefringence (ECB) mode, a ferroelectric liquid crystal (FLC) mode, an anti-ferroelectric liquid crystal (AFLC) mode, a polymer dispersed liquid crystal (PDLC) mode, a polymer network liquid crystal (PNLC) mode, a guest-host mode, an advanced super view (ASV) mode, and the like.

In the liquid crystal display device, the liquid crystal layer can be formed using, for example, a liquid crystal material classified into a thermotropic liquid crystal or a lyotropic liquid crystal. As another example of a liquid crystal material used for the liquid crystal layer, the following can be given: a nematic liquid crystal, a smectic liquid crystal, a cholesteric liquid crystal, or a discotic liquid crystal. Further alternatively, a liquid crystal material categorized by a ferroelectric liquid crystal or an anti-ferroelectric liquid crystal can be used. Further alternatively, a liquid crystal material categorized by a high-molecular liquid crystal such as a main-chain high-molecular liquid crystal, a side-chain high-molecular liquid crystal, or a composite-type high-molecular liquid crystal, or a low-molecular liquid crystal can be used. Further alternatively, a liquid crystal material categorized by a polymer dispersed liquid crystal (PDLC) can be used.

Alternatively, liquid crystal exhibiting a blue phase for which an alignment film is unnecessary may be used for the liquid crystal layer. A blue phase is one of liquid crystal phases, which is generated just before a cholesteric phase changes into an isotropic phase while temperature of cholesteric liquid crystal is increased. Since the blue phase is only generated within a narrow range of temperature, a chiral material or an ultraviolet curable resin is added so that the temperature range is improved. It is preferable to use a liquid crystal composition which includes a liquid crystal exhibiting a blue phase and a chiral material has a short response time of 1 msec or less and has optical isotropy, which contributes to the exclusion of the alignment process and reduction of viewing angle dependence.

Although a liquid crystal display device using a color filter to display a color image is illustrated in FIG. 6 as an example, the liquid crystal display device of one embodiment of the present invention may display a color image by sequentially lighting a plurality of light sources having different hues.

<Connection Structure Example 1 Between Conductive Films>

Next, an example of the connection structure between the conductive film 50 and the conductive film 51 is described. The conductive film 50 is provided in the same layer as the conductive film 12 that functions as a gate of the transistor 10 illustrated in FIGS. 1A to 1C, and the conductive film 51 is provided in the same layer as the conductive films 16 and 17 that function as a source electrode and a drain electrode of the transistor 10 illustrated in FIGS. 1A to 1C.

Figure 8:
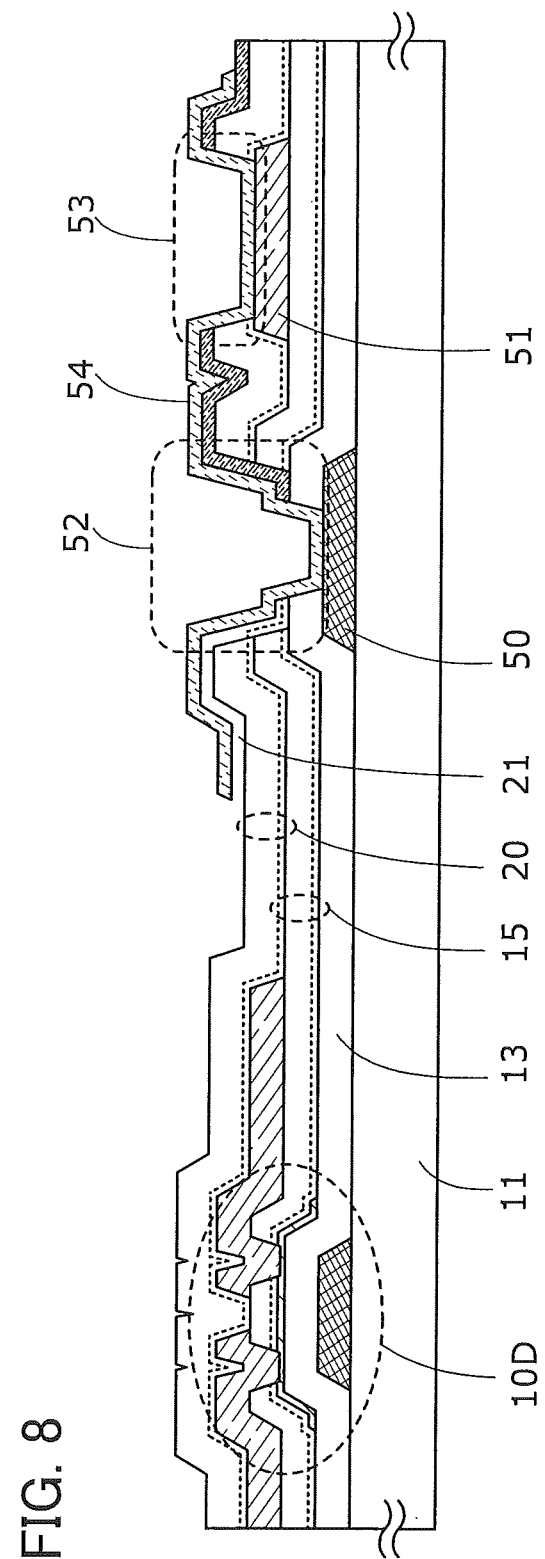
FIG. 8 illustrates a cross section of a transistor and a connection between conductive films.

FIG. 8 illustrates an example of a cross-sectional structure of a transistor 10D, the conductive film 50, and the conductive film 51. In FIG. 8, the transistor 10 illustrated in FIGS. 1A to 1C is used as the transistor 10D.

In FIG. 8, the conductive film 50 is formed over the substrate 11. The insulating film 13 and the insulating film 15 are sequentially stacked over the conductive film 50. The conductive film 51 is provided over the insulating film 15. The insulating film 20 and the insulating film 21 are sequentially stacked over the insulating film 15 and the conductive film 51.

An opening portion 52 is provided in the insulating films 13, 15, 20, and 21 over the conductive film 50. An opening portion 53 is provided in the insulating film 20 and the insulating film 21 over the conductive film 51. A conductive film 54 is provided over the insulating film 21 so as to be electrically connected to the conductive films 50 and 51 in the opening portions 52 and 53, respectively. Thus, the conductive film 54 is provided in the same layer as the conductive film 37 included in the pixels 30 illustrated in FIG. 5 and FIG. 6. The conductive film 37 and the conductive film 54 can be formed by etching one conductive film.

FIG. 8 shows the case in which after an opening portion is formed in the insulating film 15 and the insulating film 20, the insulating film 21 is formed, and an opening portion is formed in the insulating film 13 and the insulating film 21 so as to overlap with the above opening portion, whereby the opening portion 52 is formed. In one embodiment of the present invention, the opening portion 52 may be formed in the insulating films 13, 15, 20, and 21 by etching using the same mask. However, in the case where the transistor 10D illustrated in FIG. 8 and the conductive films 50 and 51 that are electrically connected to each other are formed over the same substrate 11 as the pixels 30 illustrated in FIG. 5 and FIG. 6, there is a big difference in the total thickness of the insulating films removed by etching between the opening portion 36 illustrated in FIG. 5 and FIG. 6 and the opening portion 52 illustrated in FIG. 8. For this reason, when the opening portion 36 and the opening portion 52 are formed with use of one mask, the following problems might occur: for example, part of the conductive film 17 is excessively etched in the opening portion 36, or the conductive film 17 is etched insufficiently so that the conductive film 50 is not exposed in the opening portion 52. However, in the cross-sectional structure illustrated in FIG. 8, an opening portion is formed in the insulating film 15 and the insulating film 20, and then, the insulating film 21 is formed and an opening portion is formed in the insulating film 13 and the insulating film 21 so as to overlap with the above opening portion. In that case, the thickness of the insulating films removed by etching for forming the opening portion 36 is less likely to be different from that for forming the opening portion 52 even when the opening portion 36 and the opening portion 52 are formed with use of one mask. Consequently, the problems are less likely to occur, resulting in an improvement in yield.

In the case where the transistor 10 illustrated in FIGS. 2A to 2C is used as the transistor 10D, the conductive film 22 illustrated in FIGS. 2A to 2C can be formed in the same layer as the conductive film 54. Thus, the conductive film 22 and the conductive film 54 can be formed by etching one conductive film.

<Structure Example 2 of Pixel and Connection Structure Example 2 Between Conductive Films>

Next, another structure example of the pixel is described, giving an example of a liquid crystal display device that is a semiconductor device of one embodiment of the present invention. FIGS. 9A and 9B are examples of a cross-sectional view of an element substrate in a pixel.

The pixel illustrated in FIG. 9A includes the transistor 10P and the capacitor 31. FIG. 9A shows the case where the transistor 10 illustrated in FIGS. 3A to 3C is used as the transistor 10P.

The pixel illustrated in FIG. 9A includes the metal oxide film 32 over the insulating film 13. The metal oxide film 32 is a conductive film that transmits visible light. The insulating film 20 has an opening portion 55 over the metal oxide film 32. In addition, in the opening portion 55, the insulating film 21 is in contact with the metal oxide film 32.

Furthermore, the opening portion 36 is provided in the insulating film 21 to overlap with the conductive film 17. The conductive film 37 that transmits visible light and serves as a pixel electrode is provided over the insulating film 21. The conductive film 37 is electrically connected to the conductive film 17 in the opening portion 36. The conductive film 37 overlaps with the metal oxide film 32 in the opening portion 55. A portion where the conductive film 37 overlaps with the metal oxide film 32 with the insulating film 21 provided therebetween serves as the capacitor 31.

In the capacitor 31, the metal oxide film 32 and the conductive film 37 serving as a pair of electrodes and the insulating film 21 serving as a dielectric film transmit visible light. This means that the capacitor 31 transmits visible light. Thus, the aperture ratio of the pixels can be higher than that of a pixel including a capacitor having a property of transmitting less visible light. Therefore, the required capacitance for high image quality can be secured and the aperture ratio of the pixel can be increased; thus, light loss can be reduced in a panel and power consumption of a display device can be reduced.

The alignment film 38 may be provided over the conductive film 37 as in FIG. 6.

Next, an example of the connection structure between the conductive film 50 and the conductive film 51 is described. The conductive film 50 is provided in the same layer as the conductive film 12 that functions as a gate of the transistor 10 illustrated in FIGS. 3A to 3C, and the conductive film 51 is provided in the same layer as the conductive films 16 and 17 that function as a source electrode and a drain electrode of the transistor 10 illustrated in FIGS. 3A to 3C.

FIG. 9B illustrates an example of a cross-sectional structure of the transistor 10D, the conductive film 50, and the conductive film 51. In FIG. 9B, the transistor 10 illustrated in FIGS. 3A to 3C is used as the transistor 10D.

In FIG. 9B, the conductive film 50 is formed over the substrate 11. The insulating film 13 and the insulating film 20 are sequentially stacked over the conductive film 50. The conductive film 51 is provided over the insulating film 20. The insulating film 21 is provided over the insulating film 20 and the conductive film 51.

An opening portion 52 is provided in the insulating films 13, 20, and 21 over the conductive film 50. The opening portion 53 is provided in the insulating film 21 over the conductive film 51. The conductive film 54 is provided over the insulating film 21 so as to be electrically connected to the conductive films 50 and 51 in the opening portions 52 and 53, respectively. Thus, the conductive film 54 is provided in the same layer as the conductive film 37 illustrated in FIG. 9A. The conductive film 37 and the conductive film 54 can be formed by etching one conductive film.

FIG. 9B shows the case in which after an opening portion is formed in the insulating film 13 and the insulating film 20, the insulating film 21 is formed, and an opening portion is formed in the insulating film 13 and the insulating film 21 so as to overlap with the above opening portion, whereby the opening portion 52 is formed. In one embodiment of the present invention, the opening portion 52 may be formed in the insulating films 13, 20, and 21 by etching using the same mask. However, in the case where the transistor 10D illustrated in FIG. 9B and the conductive films 50 and 51 that are electrically connected to each other are formed over the same substrate 11 as the pixel illustrated in FIG. 9A, there is a big difference in the total thickness of the insulating film removed by etching between the opening portion 36 illustrated in FIG. 9A and the opening portion 52 illustrated in FIG. 9B. For this reason, when the opening portion 36 and the opening portion 52 are formed with use of one mask, the following problems might occur: for example, part of the conductive film 17 is excessively etched in the opening portion 36, or the conductive film 50 is etched insufficiently so that the conductive film 50 is not exposed in the opening portion 52. However, in the cross-sectional structure illustrated in FIG. 9B, an opening portion is formed in the insulating film 13 and the insulating film 20, and then the insulating film 21 is formed and an opening portion is formed in the insulating film 21 so as to overlap with the above opening portion. In that case, the thickness of the insulating films removed by etching for forming the opening portion 36 is less likely to be different from that for forming the opening portion 52 even when the opening portion 36 and the opening portion 52 are formed with use of one mask. Consequently, the problems are less likely to occur, resulting in an improvement in yield.

In the case where the transistor 10 illustrated in FIGS. 4A to 4C is used as the transistor 10D, the conductive film 22 illustrated in FIGS. 4A to 4C can be formed in the same layer as the conductive film 54. Thus, the conductive film 22 and the conductive film 54 can be formed by etching one conductive film.

<Manufacturing Method Example 1>

Next, an example of a method for manufacturing a semiconductor device of one embodiment of the present invention is described with reference to FIGS. 10A and 10B, FIGS. 11A and 11B, FIGS. 12A and 12B, FIGS. 13A and 13B, and FIGS. 14A and 14B.

As illustrated in FIG. 10A, a conductive film is formed over the substrate 11 and then, the shape of the conductive film is processed (patterning) by etching, for example, whereby the conductive films 12A and 12B are formed.

As the substrate 11, a substrate having heat resistance high enough to withstand a later manufacturing step is preferable, and for example, a glass substrate, a quartz substrate, a ceramic substrate, a quartz substrate, a sapphire substrate, or the like is used.

Each of the conductive films 12A and 12B may be formed using a single layer or a stacked layer of a conductive film containing one or more kinds selected from aluminum, titanium, chromium, cobalt, nickel, copper, yttrium, zirconium, molybdenum, ruthenium, silver, tantalum, and tungsten. For example, the conductive films 12A and 12B may be a conductive film in which a copper film is stacked over a tungsten nitride film or a single-layer tungsten film. In this manufacturing method, a conductive film formed by stacking a 10-nm-thick titanium film and a 200-nm-thick copper film in this order is used for forming the conductive films 12A and 12B.

Next, as illustrated in FIG. 10B, the insulating film 13 is formed to cover the conductive film 12A and the conductive film 12B and then, the oxide semiconductor film 14A, the oxide semiconductor film 14B, and an oxide semiconductor film 32a are formed over the insulating film 13. Note that the oxide semiconductor film 14A is formed to overlap with the conductive film 12A, and the oxide semiconductor film 14B is formed to overlap with the conductive film 12B.

The insulating film 13 may be formed using a single layer or a stacked layer of an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

Note that in this specification, oxynitride contains more oxygen than nitrogen, and nitride oxide contains more nitrogen than oxygen.

For example, in the case where the insulating film 13 has a two-layer structure, a silicon nitride film and a silicon oxide film may be used as the first layer and the second layer, respectively. A silicon oxynitride film may be used as the second layer instead of the silicon oxide film. A silicon nitride oxide film may be used as the first layer instead of the silicon nitride film. In this manufacturing method, a 400-nm-thick silicon nitride film and a 50-nm-thick silicon oxynitride film are stacked in this order to be used as the insulating film 13.

As the silicon oxide film, a silicon oxide film with a low defect density is preferably used. Specifically, a silicon oxide film which has a spin density of $3 \times 10^{17}$ spins/cm$^3$ or less, preferably $5 \times 10^{16}$ spins/cm$^3$ or less corresponding to a signal at a g-factor of 2.001 in electron spin resonance (ESR) spectroscopy is used. As the silicon oxide film, a silicon oxide film having excess oxygen is preferably used. As the silicon nitride film, a silicon nitride film from which hydrogen and ammonia are less released is used. The amount of discharge of hydrogen or ammonia may be measured by thermal desorption spectroscopy (TDS).

An oxide semiconductor film can be used as each of the oxide semiconductor film 14A, the oxide semiconductor film 14B, and the oxide semiconductor film 32a. When the oxide semiconductor film used as the oxide semiconductor films 14A and 14B contains a large amount of hydrogen, the hydrogen and the oxide semiconductor are bonded to each other, so that part of the hydrogen becomes donors and generates electrons serving as carriers. As a result, the threshold voltages of the transistor 10A and the transistor 10B are each shifted in a negative direction. Therefore, it is preferable that, after forming the oxide semiconductor film, dehydration treatment (dehydrogenation treatment) be performed to remove hydrogen or moisture from the oxide semiconductor film so that the oxide semiconductor film contains impurities as little as possible.

Each of the oxide semiconductor film 14A, the oxide semiconductor film 14B, and the oxide semiconductor film 32a is typically an In—Ga oxide, an In—Zn oxide, or an In-M-Zn oxide (M is Ti, Ga, Y, Zr, La, Ce, Nd, Sn, or Hf). It is particularly preferable to use an In-M-Zn oxide (M is Ti, Ga, Y, Zr, La, Ce, Nd, Sn, or Hf) for the oxide semiconductor films 14A and 14B.

In the case where each of the oxide semiconductor film 14A, the oxide semiconductor film 14B, and the oxide semiconductor film 32a is an In-M-Zn oxide film (M is Ti, Ga, Y, Zr, La, Ce, Nd, Sn, or Hf), it is preferable that the atomic ratio of metal elements of a sputtering target used for forming the In-M-Zn oxide film satisfy In≥M and Zn≥M. As the atomic ratio of metal elements of such a sputtering target, In:M:Zn=1:1:1, In:M:Zn=1:1:1.2, or In:M:Zn=3:1:2 is preferable. Note that the atomic ratios of metal elements in the formed oxide semiconductor films 14A, 14B, and 32a vary from the above atomic ratio of metal elements of the sputtering target within a range of ±40% as an error.

In the case of using an In-M-Zn oxide for the oxide semiconductor film 14A, 14B, and 32a, when Zn and O are eliminated from consideration, the proportion of In and the proportion of Mare preferably greater than or equal to 25 atomic % and less than 75 atomic %, respectively, further preferably greater than or equal to 34 atomic % and less than 66 atomic %, respectively.

The energy gap of the oxide semiconductor films 14A and 14B is greater than or equal to 2 eV, preferably greater than or equal to 2.5 eV, further preferably greater than or equal to 3 eV. With the use of an oxide semiconductor having such a wide energy gap, the off-state current of the transistors 10A and 10B can be reduced.

The thickness of the oxide semiconductor films 14A, 14B, and 32a is greater than or equal to 3 nm and less than or equal to 200 nm, preferably greater than or equal to 3 nm and less than or equal to 100 nm, further preferably greater than or equal to 3 nm and less than or equal to 50 run.

An oxide semiconductor film with low carrier density is used as the oxide semiconductor films 14A, 14B, and 32a. For example, the carrier density of an oxide semiconductor film 14 is lower than or equal to $1 \times 10^{17}$/cm$^3$, preferably lower than or equal to $1 \times 10^{15}$/cm$^3$, further preferably lower than or equal to $1 \times 10^{13}$/cm$^3$, still further preferably lower than or equal to $1 \times 10^{11}$/cm$^3$, particularly preferably lower than or equal to $1 \times 10^{10}$/cm$^3$, and is higher than or equal to $1 \times 10^{-9}$/cm$^3$.

In this manufacturing method, a 35-nm-thick In—Ga—Zn oxide semiconductor film formed using a target containing a metal oxide including metal elements of In, Ga, and Zn in an atomic ratio of 1:1:1 is used as the oxide semiconductor films 14A, 14B, and 32a.

Note that oxygen in the oxide semiconductor film is also reduced by the dehydration treatment (dehydrogenation treatment) in some cases. Therefore, it is preferable that oxygen be added to the oxide semiconductor film to fill oxygen vacancies increased by the dehydration treatment (dehydrogenation treatment). In this manner, hydrogen or moisture is removed from the oxide semiconductor film by dehydration treatment (dehydrogenation treatment) and oxygen vacancies therein are filled by oxygen adding treatment, whereby the oxide semiconductor film can be turned into an i-type (intrinsic) or substantially i-type oxide semiconductor film.

Figure 11A:
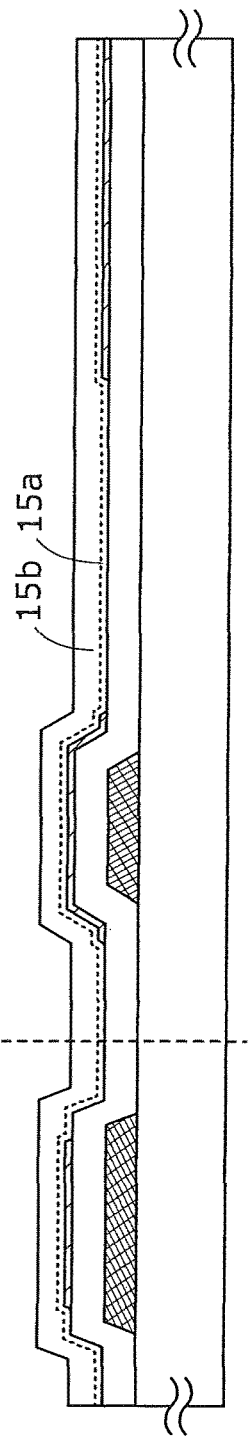
FIGS. 11A and 11B illustrate a method for manufacturing a semiconductor device.

Next, as illustrated in FIG. 11A, the insulating films 15a and 15b are stacked in this order over the insulating film 13 to cover the oxide semiconductor films 14A, 14B, and 32a.

It is preferable to form the insulating film 15b without exposure to the atmosphere, directly after the insulating film 15a is formed. After the insulating film 15a is formed, the insulating film 15b is formed in succession by adjusting at least one of the flow rate of a source gas, pressure, a high-frequency power, and a substrate temperature without exposure to the air, whereby the concentration of impurities at the interface between the insulating film 15a and the insulating film 15b can be reduced and oxygen in the insulating film 15b can be moved to the oxide semiconductor film 14A and the oxide semiconductor film 14B; accordingly, the number of oxygen vacancies in the oxide semiconductor film 14A and the oxide semiconductor film 14B can be reduced.

As the insulating film 15a, a silicon oxide film or a silicon oxynitride film is formed under the following conditions: the substrate placed in a treatment chamber of a plasma-enhanced CVD apparatus that is vacuum-evacuated is held at 180 to 400° C., preferably 200 to 370° C., the pressure in the treatment chamber is 30 to 250 Pa, preferably 40 to 200 Pa with introduction of a source gas into the treatment chamber, and high-frequency power is supplied to an electrode provided in the treatment chamber.

A deposition gas containing silicon and an oxidizing gas are preferably used as the source gases of the insulating film 15a. Typical examples of the deposition gas containing silicon include silane, disilane, trisilane, and silane fluoride. As the oxidizing gas, oxygen, ozone, dinitrogen monoxide, and nitrogen dioxide can be given as examples.

With the use of the above conditions, an oxide insulating film which transmits oxygen can be formed as the insulating film 15a. By providing the insulating film 15a, damage to the oxide semiconductor films 14A, 14B, and 32a can be reduced in a step of forming the insulating film 15b which is formed later.

Note that when the ratio of the amount of the oxidizing gas to the amount of the deposition gas containing silicon is higher than or equal to 100, the hydrogen content in the insulating film 15a can be reduced, and dangling bonds in the insulating film 15a can be reduced. Oxygen released from the insulating film 15b is captured by the dangling bonds in the insulating film 15a in some cases; thus, oxygen in the insulating film 15b can enter the oxide semiconductor films 14A and 14B efficiently to fill the oxygen vacancies in the oxide semiconductor films 14A and 14B. As a result, the amount of hydrogen entering the oxide semiconductor films 14A and 14B can be reduced and the oxygen vacancies in the oxide semiconductor films 14A and 14B can be reduced. Consequently, a negative shift in threshold voltage of each of the transistors 10A and 10B can be reduced, and the off-state current of the transistors 10A and 10B can be reduced.

In this manufacturing method, as the insulating film 15a, a 50-nm-thick silicon oxynitride film is formed by a plasma CVD method under the following conditions: silane with a flow rate of 20 sccm and dinitrogen monoxide with a flow rate of 3000 sccm are used as the source gases, the pressure in the treatment chamber is 200 Pa, the substrate temperature is 350° C., and a high-frequency power of 100 W is supplied to parallel plate electrodes with a high-frequency power supply of 27.12 MHz. Note that a plasma CVD apparatus is a parallel plate plasma CVD apparatus in which the electrode area is 6000 cm$^2$, and the power per unit area (power density) into which the supplied power is converted is $1.6 \times 10^2$ W/cm$^2$. Under the above conditions, a silicon oxynitride film that passes oxygen can be formed.

As the insulating film 15b, a silicon oxide film or a silicon oxynitride film is formed under the following conditions: the substrate placed in a treatment chamber of the plasma-enhanced CVD apparatus that is vacuum-evacuated is held at 180 to 260° C., preferably 180 to 230° C., the pressure is 100 to 250 Pa, preferably 100 to 200 Pa with introduction of a source gas into the treatment chamber, and a high-frequency power of 0.17 to 0.5 W/cm$^2$, preferably 0.25 to 0.35 W/cm$^2$ is supplied to an electrode provided in the treatment chamber.

As the film formation conditions of the insulating film 15b, the high-frequency power having the above power density is supplied to the treatment chamber having the above pressure, whereby the degradation efficiency of the source gas in plasma is increased, oxygen radicals are increased, and oxidation of the source gas is promoted; therefore, the oxygen content in the insulating film 15b becomes higher than that in the stoichiometric composition. However, in the case where the substrate temperature is within the above temperature range, the bond between silicon and oxygen is weak, and accordingly, part of oxygen is released by heating. Thus, it is possible to form an oxide insulating film which contains oxygen at a higher proportion than oxygen in the stoichiometric composition and from which part of oxygen is released by heating. Since the insulating film 15a is provided over the oxide semiconductor films 14A, 14B, and 32a, the insulating film 15a has a function of protecting the oxide semiconductor films 14A, 14B, and 32a in the step of forming the insulating film 15b. Consequently, the insulating film 15b can be formed using the high-frequency power having a high power density while damage to the oxide semiconductor films 14A, 14B, and 32a is reduced.

In this manufacturing method, as the insulating film 15b, a 200-nm-thick silicon oxynitride film is formed by a plasma CVD method under the following conditions: silane with a flow rate of 160 sccm and dinitrogen monoxide with a flow rate of 3000 sccm are used as the source gases, the pressure in the reaction chamber is 200 Pa, the substrate temperature is 220° C., and a high-frequency power of 1500 W is supplied to parallel plate electrodes with a high-frequency power supply of 27.12 MHz. Note that a plasma CVD apparatus is a parallel plate plasma CVD apparatus in which the electrode area is 6000 cm$^2$, and the power per unit area (power density) into which the supplied power is converted is $2.5 \times 10^{-1}$ W/cm$^2$.

Figure 11B:
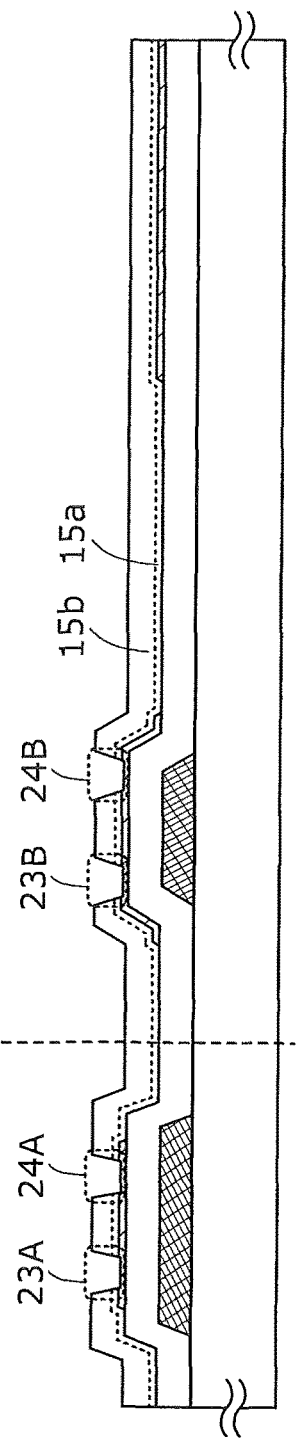

Next, as illustrated in FIG. 11B, opening portions 23A and 24A are formed in the insulating films 15a and 15b to overlap with the oxide semiconductor film 14A, and opening portions 23B and 24B are formed in the insulating films 15a and 15b to overlap with the oxide semiconductor film 14B.

At the time of forming the opening portions 23A, 24A, 23B, and 24B, part of the oxide semiconductor films 14A and 14B might be etched owing to over-etching, so that the oxide semiconductor films 14A and 14B might have depressed portions. The opening portions 23A and 24A, and the opening portions 23B and 24B are formed by a wet etching method, a dry etching method, or a combination of a wet etching method and a dry etching method.

Next, a conductive film is formed over the insulating film 15b to cover the opening portions 23A and 24A and the opening portions 23B and 24B. Then, shape of the conductive film is processed by etching or the like, whereby conductive films 16A and 17A in contact with the oxide semiconductor film 14A and the conductive films 16B and 17B in contact with the oxide semiconductor film 14B are formed (see FIG. 12A). The conductive films 16A and 17A and the conductive films 16B and 17B can be formed using the same conductive material as the conductive films 12A and 12B.

In this manufacturing method, each of the conductive films 16A and 17A and the conductive films 16B and 17B is formed using a conductive film in which a titanium film with a thickness of 35 nm and a copper film with a thickness of 200 nm are stacked in this order.

Next, as illustrated in FIG. 12B, the insulating films 20a and 20b are formed over the insulating film 15b to cover the conductive films 16A and 17A and the conductive films 16B and 17B.

The insulating film 20a can be formed using a material and a method similar to those of the insulating film 15a. The insulating film 20b can be formed using a material and a method similar to those of the insulating film 15b.

In this manufacturing method, as the insulating film 20a, a 50-nm-thick silicon oxynitride film is formed by a plasma CVD method under the following conditions: silane with a flow rate of 20 sccm and dinitrogen monoxide with a flow rate of 3000 sccm are used as the source gases, the pressure in the treatment chamber is 200 Pa, the substrate temperature is 350° C., and a high-frequency power of 100 W is supplied to parallel plate electrodes with a high-frequency power supply of 27.12 MHz. Note that a plasma CVD apparatus is a parallel plate plasma CVD apparatus in which the electrode area is 6000 cm$^2$, and the power per unit area (power density) into which the supplied power is converted is $1.6 \times 10^{-2}$ W/cm$^2$. Under the above conditions, a silicon oxynitride film that passes oxygen can be formed. As the insulating film 20b, a 200-nm-thick silicon oxynitride film is formed by a plasma CVD method under the following conditions: silane with a flow rate of 160 sccm and dinitrogen monoxide with a flow rate of 4000 sccm are used as source gases, the pressure in a reaction chamber is 200 Pa, the substrate temperature is 220° C., and a high-frequency power of 1500 W is supplied to parallel plate electrodes with a high-frequency power supply of 27.12 MHz. Note that a plasma CVD apparatus is a parallel plate plasma CVD apparatus in which the electrode area is 6000 cm$^2$, and the power per unit area (power density) into which the supplied power is converted is $2.5 \times 10^{-1}$ W/cm$^2$.

It is preferable that heat treatment be performed after the formation of the insulating film 20 so that oxygen contained in the insulating film 15a or the insulating film 15b enters the oxide semiconductor films 14A and 14B to fill oxygen vacancies in the oxide semiconductor films 14A and 14B. Note that the heat treatment can be performed as heat treatment for dehydration or dehydrogenation of the oxide semiconductor films 14A and 14B. Specifically, in this manufacturing method, the heat treatment is performed at 350° C. for 1 hour in an atmosphere of nitrogen and oxygen.

Through the series of steps, the transistor 10A and the transistor 10B are formed.

Next, as illustrated in FIG. 13A, the insulating films 15a, 15b, 20a and 20b are partly etched to form the opening portion 60. In the opening portion 60, the oxide semiconductor film 32a is exposed partly or entirely.

Then, the insulating film 21 and an insulating film 61 are formed in this order over the insulating film 20 to cover the opening portion 60. The insulating film 21 is in contact with the oxide semiconductor film 32a in the opening portion 60.

As the insulating film 21, a nitride insulating film such as a silicon nitride film, a silicon nitride oxide film, an aluminum nitride film, or an aluminum nitride oxide film, which is formed by a CVD method or the like, can be used, for example. The insulating film 21 which is a nitride insulating film is formed to be in contact with the oxide semiconductor film 32a in the opening portion 60, which enables the conductivity of the oxide semiconductor film 32a to be increased. In FIG. 13B, the oxide semiconductor film 32a having the increased conductivity is illustrated as the metal oxide film 32.

In this manufacturing method, as the insulating film 21, a 100-nm-thick silicon nitride film is formed by a plasma CVD method under the following conditions: silane with a flow rate of 50 sccm, nitrogen with a flow rate of 5000 sccm, and ammonia with a flow rate of 100 sccm are used as a source gas; the pressure in the treatment chamber is 100 Pa; the substrate temperature is 350° C.; and high-frequency power of 1000 W (the power density was $1.6 \times 10^{-1}$ W/cm$^2$) is supplied to parallel-plate electrodes with a high-frequency power supply of 27.12 MHz.

As the insulating film 61, an insulating film which has a lower dielectric constant and smaller internal stress than the insulating film 21 is preferably used. Specific examples of the insulating film 61 include a silicon oxide film, a silicon oxynitride film, and an aluminum oxide film.

Note that the insulating film 61 is not necessarily provided. Note that the insulating film 61 and the insulating film 21 serve as a dielectric film of a capacitor in the pixel that is described later. The insulating film 21 tends to have a higher dielectric constant and larger internal stress than those of an oxide insulating film such as a silicon oxide film. Thus, in the case where the insulating film 21 is used alone as the dielectric film of the capacitor without the insulating film 61, if the thickness of the insulating film 21 is small, the capacitance value of the capacitor becomes too large, which makes it difficult to increase the speed of writing an image signal to a pixel with low power consumption. In reverse, when the thickness of the nitride insulating film 21 is large, internal stress is too large and degradation of the characteristics of a semiconductor element formed using a semiconductor film, such as a change in threshold voltage of a transistor, might occur. When the internal stress of the insulating film 21 is too large, the insulating film 21 is easily peeled off from the substrate 11, which prevents an improvement in yield. However, when the insulating film 61 is formed using an insulator such as silicon oxide with a dielectric constant lower than that of the insulating film 21, and used together with the insulating film 21 as the dielectric film of the capacitor in the pixel, the dielectric constant of the dielectric film can be adjusted to a desirable value without increasing the thickness of the insulating film 21.

For example, a silicon oxide film formed by a CVD method using an organosilane gas can also be used as the insulating film 61. Examples of the organosilane gas include tetraethyl orthosilicate (TEOS, chemical formula: $Si(OC_2H_5)_4$), tetramethylsilane (TMS, chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), trisdimethylaminosilane (chemical formula: $SiH(N(CH_3)_2)_3$) and the like.

In this manufacturing method, a 320-nm-thick silicon oxide film formed by a CVD method using tetraethoxysilane is used as the insulating film 61.

Figure 14A:
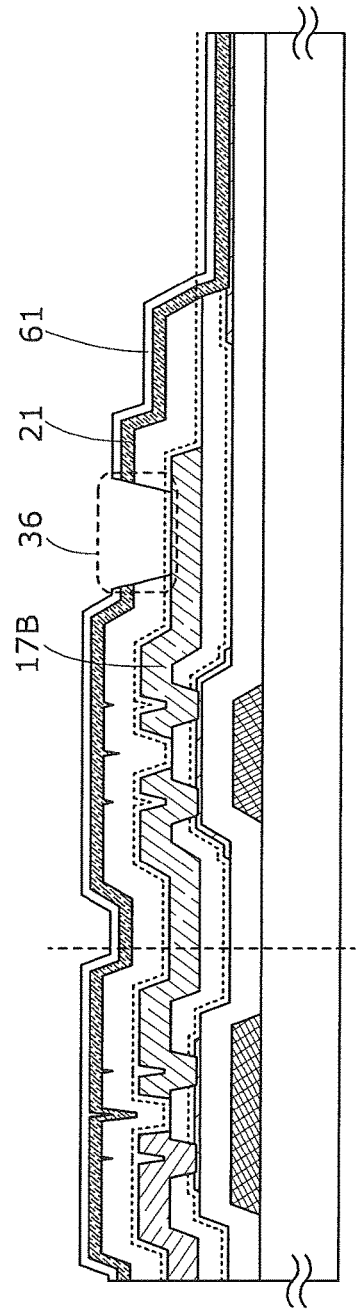
FIGS. 14A and 14B illustrate a method for manufacturing a semiconductor device.

Next, as illustrated in FIG. 14A, the insulating film 21 and the insulating film 61 are partly etched to form the opening portion 36. In the opening portion 36, at least part of the conductive film 17B is exposed.

Figure 14B:
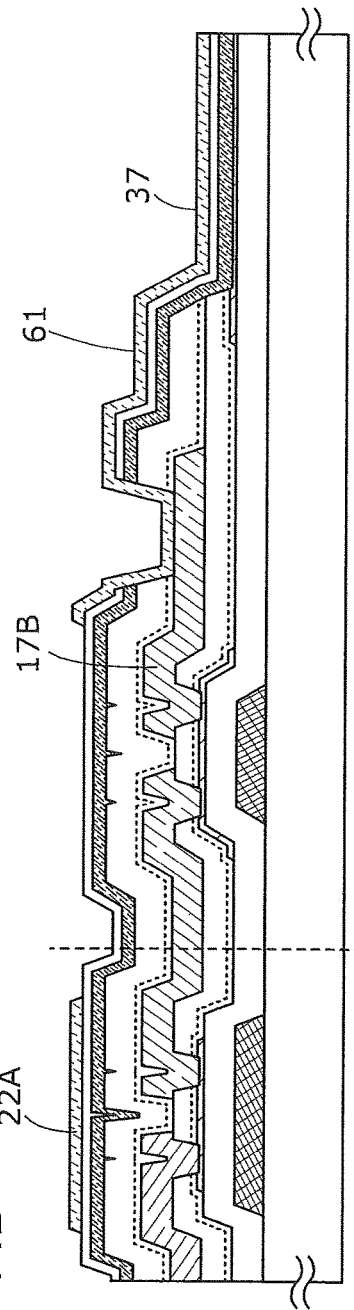

Next, as illustrated in FIG. 14B, a transparent conductive film is formed over the insulating film 61 and the shape thereof is processed by etching, for example, whereby the conductive films 22A and 37 are formed. The conductive film 22A overlaps with the conductive film 12A with the oxide semiconductor film 14A sandwiched therebetween. The conductive film 37 is electrically connected to the conductive film 17B in the opening portion 36.

As the transparent conductive film used for forming the conductive film 12A and the conductive film 37, a conductive film containing the following can be used: indium oxide containing tungsten oxide, indium zinc oxide containing tungsten oxide, indium oxide containing titanium oxide, indium tin oxide containing titanium oxide, indium tin oxide, indium zinc oxide, zinc oxide, zinc oxide to which gallium is added, or indium tin oxide to which silicon oxide is added.

In this manufacturing method, a 110-nm-thick conductive film containing indium tin oxide to which silicon oxide is added is used, for example, to form the conductive film 12A and the conductive film 37.

Heat treatment may be performed after the conductive film 12A and the conductive film 37 are formed. The heat treatment is performed at 250° C. under a nitrogen atmosphere for 1 hour, for example.

Although the variety of films such as the conductive films, the insulating films, the oxide semiconductor films, and the metal oxide films described above can be formed by a sputtering method or a PECVD method, such films may be formed by another method, e.g., a thermal chemical vapor deposition (CVD) method. Examples of a thermal CVD method include metal organic chemical vapor deposition (MOCVD) method and atomic layer deposition (ALD) method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time so that the pressure in a chamber is set to an atmospheric pressure or a reduced pressure, and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive films, the insulating films, the oxide semiconductor films, and the metal oxide films which are described in this specification can be formed by a thermal CVD method such as a MOCVD method or an ALD method. For example, in the case where an In—Ga—ZnO film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed by a deposition apparatus using an ALD method, two kinds of gases, i.e., ozone ($O_3$) as an oxidizer and a source gas which is obtained by vaporizing liquid containing a solvent and a hafnium precursor compound (a hafnium alkoxide solution, typically tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed by a deposition apparatus using an ALD method, two kinds of gases, e.g., $H_2O$ as an oxidizer and a source gas which is obtained by vaporizing a solvent and liquid containing an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an InGaZnO film is formed using a deposition apparatus employing ALD, an $In(CH_3)_3$ gas and an $O_3$ gas are sequentially introduced plural times to form an $InO_2$ layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Furthermore, instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, instead of an $In(CH_3)_3$ gas, an $In(C_2H_5)_3$ gas may be used. Furthermore, a $Zn(CH_3)_2$ gas may be used.

Next, the alignment film is formed over the conductive film 37. Thus, the element substrate can be formed.

The alignment film can be formed using an organic resin such as polyimide or polyvinyl alcohol. An alignment treatment such as rubbing is performed on a surface of the alignment film in order to align liquid crystal molecules in a certain direction. Rubbing can be performed by rolling a roller wrapped with cloth of nylon or the like while being in contact with the alignment film and the surface of the alignment film is rubbed in a certain direction. Note that it is also possible to form the alignment film that has alignment characteristics with the use of inorganic materials such as silicon oxide by evaporation, without alignment treatment.

After the element substrate and a counter substrate are formed, the liquid crystal layer 46 is sealed between the substrate 11 and the substrate 40 as illustrated in FIG. 6; thus, a panel of the liquid crystal display device is completed. Injection of liquid crystals for formation of the liquid crystal layer 46 may be performed by a dispenser method (a dripping method) or a dipping method (a pumping method).

<Manufacturing Method Example 2>

Next, another example of a method for manufacturing a semiconductor device of one embodiment of the present invention is described with reference to FIGS. 10A and 10B, FIGS. 15A and 15B, FIGS. 16A and 16B, and FIGS. 17A and 17B.

Figure 15A:
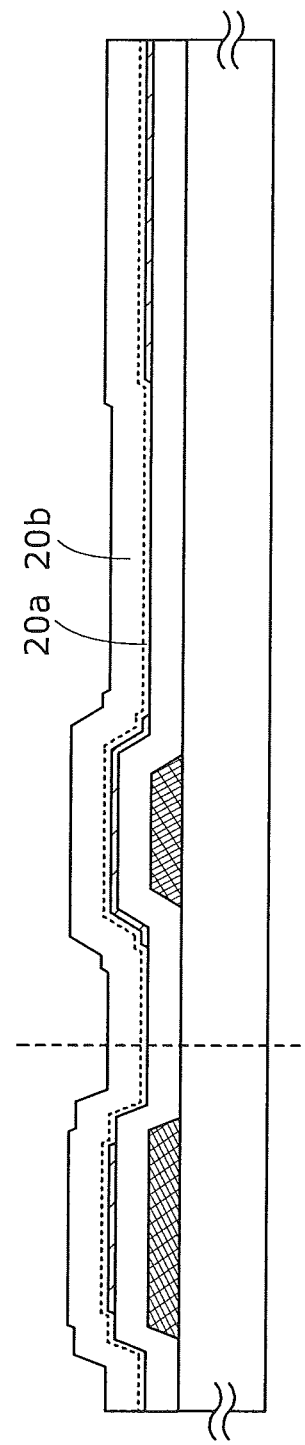
FIGS. 15A and 15B illustrate a method for manufacturing a semiconductor device.

After the steps up to the step in FIG. 10B are performed in a manner similar to the above described manufacturing method, an insulating film 20a and an insulating film 20b are stacked in this order over the insulating film 13 to cover the oxide semiconductor films 14A, 14B, and 32a as illustrated in FIG. 15A.

The insulating film 20b is preferably formed without exposure to the atmosphere following the formation of the insulating film 20a. After the insulating film 20a is formed, the insulating film 20b is formed in succession by adjusting at least one of the flow rate of a source gas, pressure, a high-frequency power, and a substrate temperature without exposure to the air, whereby the concentration of impurities at the interface between the insulating film 20a and the insulating film 20b can be reduced and oxygen in the insulating film 20b can be moved to the oxide semiconductor film 14A and the oxide semiconductor film 14B; accordingly, the number of oxygen vacancies in the oxide semiconductor film 14A and the oxide semiconductor film 14B can be reduced.

The silicon oxide film or the silicon oxynitride film which is used as the insulating film 20a can be formed under the following conditions: the substrate placed in a treatment chamber of a plasma CVD apparatus, which is vacuum-evacuated, is held at a temperature higher than or equal to 180° C. and lower than or equal to 400° C., preferably higher than or equal to 200° C. and lower than or equal to 370° C., the pressure in the treatment chamber is greater than or equal to 30 Pa and less than or equal to 250 Pa, preferably greater than or equal to 40 Pa and less than or equal to 200 Pa with introduction of a source gas into the treatment chamber, and high-frequency power is supplied to an electrode provided in the treatment chamber.

As a source gas of the insulating film 20a, a deposition gas containing silicon and an oxidizing gas is preferably used. Typical examples of the deposition gas containing silicon include silane, disilane, trisilane, and silane fluoride. As the oxidizing gas, oxygen, ozone, dinitrogen monoxide, and nitrogen dioxide can be given as examples.

With the use of the above conditions, an oxide insulating film through which oxygen is passed can be formed as the insulating film 20a. By providing the insulating film 20a, damage to the oxide semiconductor films 14A, 14B, and 32a can be reduced in a step of forming the insulating film 20b which is formed later.

Note that when the ratio of the amount of the oxidizing gas to the amount of the deposition gas containing silicon is higher than or equal to 100, the hydrogen content in the insulating film 20a can be reduced, and dangling bonds in the insulating film 20a can be reduced. Oxygen released from the insulating film 20b is captured by the dangling bonds in the insulating film 20a in some cases; thus, oxygen in the insulating film 20b can enter the oxide semiconductor films 14A and 14B efficiently to fill the oxygen therein. As a result, the amount of hydrogen entering the oxide semiconductor films 14A and 14B can be reduced and the oxygen vacancies in the oxide semiconductor films 14A and 14B can be reduced. Consequently, a negative shift in threshold voltage of each of the transistors 10A and 10B can be reduced, and the off-state current of the transistors 10A and 10B can be reduced.

In this manufacturing method, as the insulating film 20a, a 50-nm-thick silicon oxynitride film is formed by a plasma CVD method under the following conditions: silane with a flow rate of 20 sccm and dinitrogen monoxide with a flow rate of 3000 sccm are used as the source gases, the pressure in the treatment chamber is 200 Pa, the substrate temperature is 350° C., and a high-frequency power of 100 W is supplied to parallel plate electrodes with a high-frequency power supply of 27.12 MHz. Note that a plasma CVD apparatus is a parallel plate plasma CVD apparatus in which the electrode area is 6000 $cm^2$, and the power per unit area (power density) into which the supplied power is converted is $1.6 \times 10^{-2}$ $W/cm^2$. Under the above conditions, a silicon oxynitride film that passes oxygen can be formed.

As the insulating film 20b, a silicon oxide film or a silicon oxynitride film is formed under the following conditions: the substrate placed in a treatment chamber of the plasma-enhanced CVD apparatus that is vacuum-evacuated is held at 180 to 260° C., preferably 180 to 230° C., the pressure is 100 to 250 Pa, preferably 100 to 200 Pa with introduction of a source gas into the treatment chamber, and a high-frequency power of 0.17 to 0.5 $W/cm^2$, preferably 0.25 to 0.35 $W/cm^2$ is supplied to an electrode provided in the treatment chamber.

As the film formation conditions of the insulating film 20b, the high-frequency power having the above power density is supplied to the treatment chamber having the above pressure, whereby the degradation efficiency of the source gas in plasma is increased, oxygen radicals are increased, and oxidation of the source gas is promoted; therefore, the oxygen content in the oxide insulating film 20b becomes higher than that in the stoichiometric composition. However, in the case where the substrate temperature is within the above temperature range, the bond between silicon and oxygen is weak, and accordingly, part of oxygen is released by heating. Thus, it is possible to form an oxide insulating film which contains oxygen at a higher proportion than the stoichiometric composition and from which part of oxygen is released by heating. Since the insulating film 20a is provided over the oxide semiconductor films 14A, 14B, and 32a, the insulating film 20a has a function of protecting the oxide semiconductor films 14A, 14B, and 32a in the step of forming the insulating film 20b. Consequently, the insulating film 20b can be formed using the high-frequency power having a high power density while damage to the oxide semiconductor films 14A, 14B, and 32a is reduced.

In this manufacturing method, as the insulating film 20, a 400-nm-thick silicon oxynitride film is formed by a plasma CVD method under the following conditions: silane with a flow rate of 160 sccm and dinitrogen monoxide with a flow rate of 3000 sccm are used as the source gases, the pressure in the treatment chamber is 200 Pa, the substrate temperature is 220° C., and a high-frequency power of 1500 W is supplied to parallel plate electrodes with a high-frequency power supply of 27.12 MHz. Note that a plasma CVD apparatus is a parallel plate plasma CVD apparatus in which the electrode area is 6000 cm$^2$, and the power per unit area (power density) into which the supplied power is converted is $2.5 \times 10^{-1}$ W/cm$^2$.

It is preferable that heat treatment be performed after the formation of the insulating film 20b so that oxygen contained in the insulating film 20a or the insulating film 20b enters the oxide semiconductor films 14A and 14B to fill oxygen vacancies in the oxide semiconductor films 14A and 14B. Note that the heat treatment can be performed as heat treatment for dehydration or dehydrogenation of the oxide semiconductor films 14A and 14B. Specifically, in this manufacturing method, the heat treatment is performed at 350° C. for 1 hour in an atmosphere of nitrogen and oxygen.

Figure 15B:
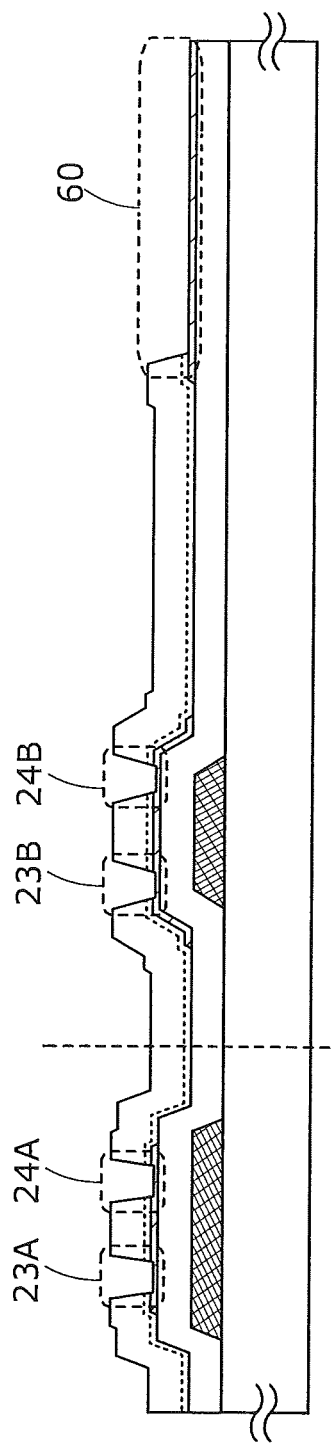

Next, as illustrated in FIG. 15B, the opening portions 23A and 24A are formed in the insulating films 20a and 20b to overlap with the oxide semiconductor film 14A, the opening portions 23A and 24B are formed in the insulating films 20a and 20b to overlap with the oxide semiconductor film 14B, and the opening portion 60 is formed in the insulating films 20a and 20b to overlap with the oxide semiconductor film 32a.

At the time of forming the opening portions 23A and 24A, the opening portions 23B and 24B, and the opening portion 60, part of the oxide semiconductor films 14A, 14B and 32a might be etched owing to over-etching, so that the oxide semiconductor film 14A, 14B, and 32a have depressed portions. The opening portions 23A and 24A, the opening portions 23B and 24B, and the opening portion 60 are be formed by a wet etching method, a dry etching method, or a combination of a wet etching method and a dry etching method.

Next, a conductive film is formed over the insulating films 20a and 20b to cover the opening portions 23A and 24A, the opening portions 23B and 24B, and the opening portion 60. Then, the shape of the conductive film is processed by etching or the like, whereby the conductive films 16A and 17A in contact with the oxide semiconductor film 14A and the conductive films 16B and 17B in contact with the oxide semiconductor film 14B are formed (see FIG. 16A). The conductive films 16A and 17A and the conductive films 16B and 17B can be formed using the same conductive material as the conductive films 12A and 12B.

Through the series of steps, the transistor 10A and the transistor 10B are formed.

Next, as illustrated in FIG. 16B, the insulating films 21 and 61 are stacked in this order over the insulating films 20a and 20b to cover the conductive films 16A and 17A, the conductive films 16B and 17B, and the opening portion 60. The insulating film 21 is in contact with the oxide semiconductor film 32a in the opening portion 60. Note that the above manufacturing method described with reference to FIGS. 10A and 10B, FIGS. 11A and 11B, FIGS. 12A and 12B, FIGS. 13A and 13B, and FIGS. 14A and 14B can be referred to for kinds, film thicknesses, and formation methods of insulating films that can be used for the insulating films 21 and 61.

The insulating film 21 which is a nitride insulating film is formed to be in contact with the oxide semiconductor film 32a in the opening portion 60, which enables the conductivity of the oxide semiconductor film 32a to be increased. In FIG. 16B, the oxide semiconductor film 32a having the increased conductivity is illustrated as the metal oxide film 32.

Next, as illustrated in FIG. 17A, the insulating film 21 and the insulating film 61 are partly etched to form the opening portion 36. In the opening portion 36, at least part of the conductive film 17B is exposed.

Next, as illustrated in FIG. 17B, a transparent conductive film is formed over the insulating film 61 and the shape thereof is processed by etching, for example, whereby the conductive films 22A and 37 are formed. The conductive film 22A overlaps with the conductive film 12A with the oxide semiconductor film 14A sandwiched therebetween. The conductive film 37 is electrically connected to the conductive film 17B in the opening portion 36.

Note that the above manufacturing method described with reference to FIGS. 10A and 10B, FIGS. 11A and 11B, FIGS. 12A and 12B, FIGS. 13A and 13B, and FIGS. 14A and 14B can be referred to for kinds, film thicknesses, and formation methods of the transparent conductive films that can be used for the conductive films 22 and 37.

Heat treatment may be performed after the conductive film 22 and the conductive film 37 are formed. The heat treatment is performed at 250° C. under a nitrogen atmosphere for 1 hour, for example.

Next, the alignment film is formed over the conductive film 37; thus, the element substrate can be formed.

<Configuration Example of Sequential Circuit>

Figure 18:
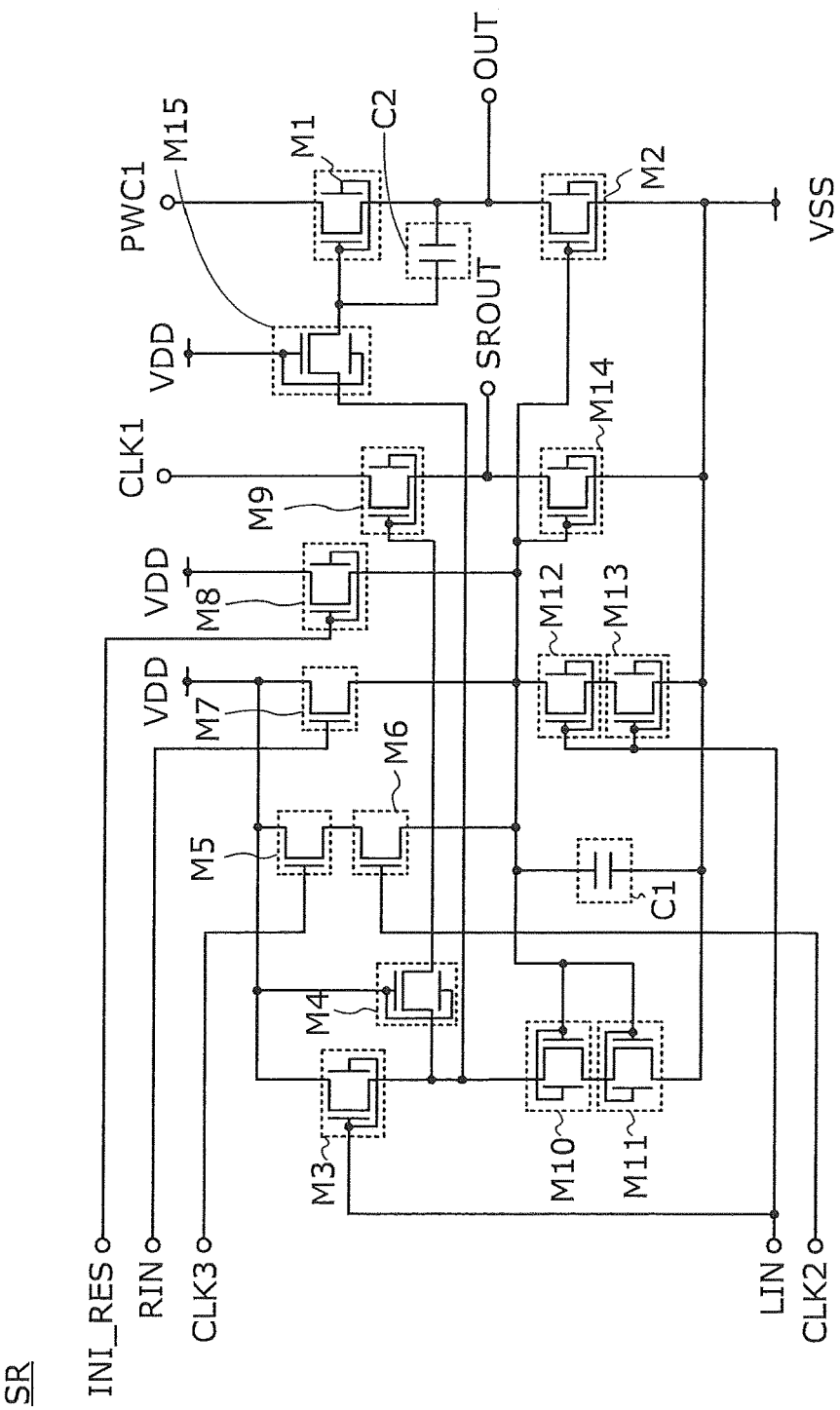
FIG. 18 illustrates a configuration of a sequential circuit.

Next, FIG. 18 illustrates a configuration example of a sequential circuit included in a semiconductor device of one embodiment of the present invention.

A sequential circuit SR illustrated in FIG. 18 includes transistors M1 to M15 and capacitors C1 and C2. FIG. 18 illustrates the case where the transistors other than the transistor M5 to M7 among the transistors M1 to M15 each have an s-channel structure. Note that in one embodiment of the present invention, all of the transistors M1 to M15 may have an s-channel structure. Alternatively, one or more of the transistors M1 to M15 may have an s-channel structure.

Specifically, gates of the transistors M3, M12, and M13 are electrically connected to a wiring to which a signal LIN is supplied. One of a source and a drain of the transistor M3, one of a source and a drain of the transistor M5, and one of a source and a drain of the transistor M7 are electrically connected to a wiring to which a high-level potential VDD is supplied. The other of the source and the drain of the transistor M3 is electrically connected to the one of a source and a drain of the transistor M15. One of a source and a drain of the transistor M10 is electrically connected to the one of the source and the drain of the transistor M15, and the other thereof is electrically connected to one of a source and a drain of the transistor M11.

One of the source and the drain of the transistor M11, one of a source and a drain of the transistor M13, one of a source and a drain of the transistor M14, and one of a source and a drain of the transistor M2 are electrically connected to a wiring to which a potential VSS is supplied. The gates of the transistors M10 and M11 and gates of M14 and M2 are electrically connected to one of the source and the drain of the transistor M6, one of the source and the drain of the transistor M7, one of the source and the drain of the transistor M8 and one of a source and a drain of the transistor M12.

A gate of the transistor M5 is electrically connected to a wiring to which a signal CLK3 is supplied. A gate of the transistor M6 is electrically connected to a wiring to which a signal CLK2 is supplied. The other of the source and the drain of the transistor M5 is electrically connected to the other of the source and the drain of the transistor M6. A gate of the transistor M7 is electrically connected to a wiring to which a signal RIN is supplied.

Gates of the transistor M8 is electrically connected to a wiring to which a signal INI_RES is supplied. The other of the source and the drain of the transistor M8 is electrically connected to the wiring to which the potential VDD is supplied. Gates of the transistor M4 is electrically connected to the wiring to which the potential VDD is supplied. One of a source and a drain of the transistor M4 is electrically connected to the other of the source and the drain of the transistor M3. The other of the source and the drain of the transistor M4 is electrically connected to gates of the transistor M9. One of a source and a drain of the transistor M9 is electrically connected to a wiring to which a signal CLK1 is supplied. The other of the source and the drain of the transistor M9 and the one of the source and the drain of the transistor M14 are electrically connected to a wiring to which a signal SROUT is supplied.

One of the source and the drain of the transistor M15 is electrically connected to gates of the transistor M1. Gates of the transistor M15 is electrically connected to the wiring to which the potential VDD is supplied. One of a source and a drain of the transistor M1 is electrically connected to the wiring to which the signal PWC1 is supplied. The other of the source and the drain of the transistor M1 and the other of the source and the drain of the transistor M2 are electrically connected to a wiring to which a signal OUT is supplied.

One of a pair of electrodes of the capacitor C1 is electrically connected to the wiring to which the potential VSS is supplied, and the other thereof is electrically connected to the gates of the transistor M2. One of a pair of electrodes of the capacitor C2 is electrically connected to the other of the source and the drain of the transistor M15, and the other thereof is electrically connected to the wiring to which the signal OUT is supplied.

The transistor 10 illustrated in FIGS. 2A to 2C or FIGS. 4A to 4C can be used as the transistors M1 to M4 or the transistors M8 to M15. The transistor 10 illustrated in FIGS. 1A to 1C or FIGS. 3A to 3C can be used as the transistors M5 to M7.

Figure 19:
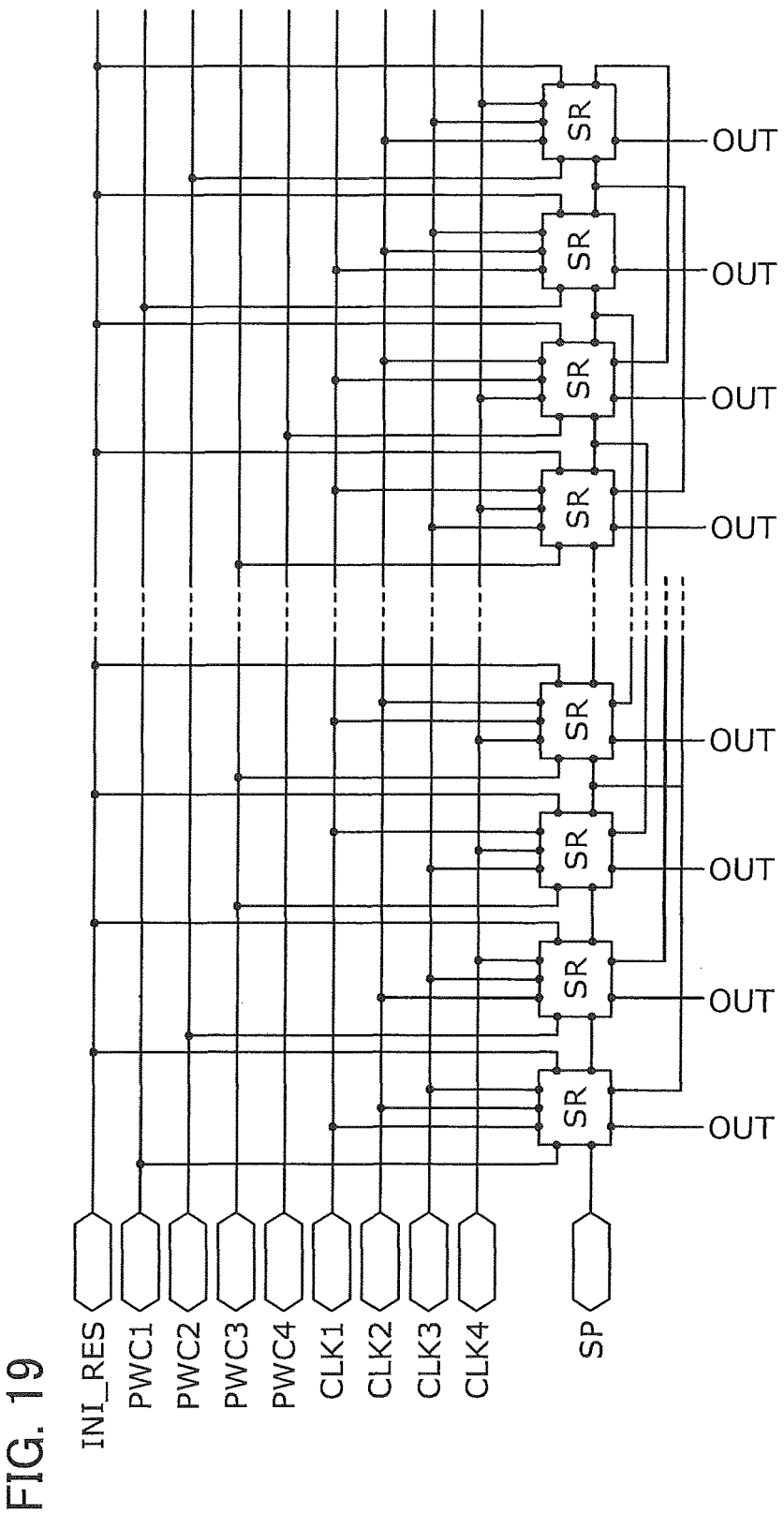
FIG. 19 schematically illustrates a configuration of a sequential circuit.

Next, FIG. 19 illustrates an example of a shift register constituted by connecting the sequential circuits SR illustrated in FIG. 18 in the plurality of stages to each other. The shift register illustrated in FIG. 19 includes y sequential circuits SR (y is a natural number of 2 or more). Each of the y sequential circuits SR has the same structure as the sequential circuit SR illustrated in FIG. 18.

The shift register illustrated in FIG. 19 includes a sequential circuit SR of a (y+1)-th stage and a sequential circuit SR of a (y+2)-th stage provided to follow y-th sequential circuit SR. The structure of each of the sequential circuit SR in the (y+1)-th stage and the sequential circuit SR in the (y+2)-th stage are different from the structure of the sequential circuit SR in FIG. 18 in that the transistor M7 is not included. That is, the structure of the sequential circuit SR of the (y+1)-th stage and that of the sequential circuit SR of the (y+2)-th stage are different from the structure of the sequential circuit SR in FIG. 18 in that a function of controlling the supply of the potential VDD to the gates of the transistor M2 in response to the signal RIN is not provided.

Figure 20:
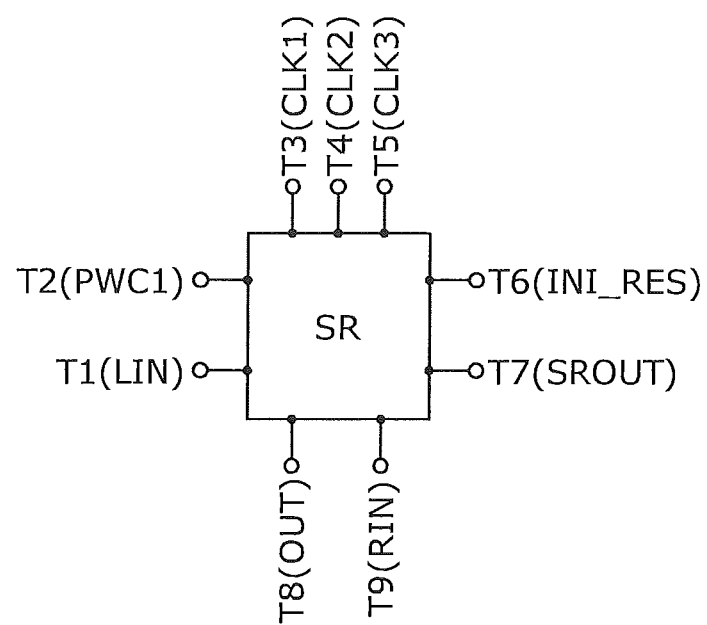
FIG. 20 illustrates a configuration of a shift register.

FIG. 20 schematically illustrates the positions of the wirings connected to the sequential circuit SR of a j-th stage (j is a natural number of y or less) in the shift register illustrated in FIG. 19. In the case of the sequential circuit SR illustrated in FIG. 18, a wiring T1 is supplied with the signal LIN, a wiring T2 is supplied with the signal PWC1, a wiring T3 is supplied with the signal CLK1, a wiring T4 is supplied with the signal CLK2, a wiring T5 is supplied with the signal CLK3, a wiring T6 is supplied with the signal INI_RES, a wiring T7 is supplied with the signal SROUT, a wiring T8 is supplied with the signal OUT, and a wiring T9 is supplied with the signal RIN.

As seen from FIG. 19 and FIG. 20, in the sequential circuit SR in the j-th stage, the wiring T1 is supplied with, as the signal LIN, the signal SROUT that is output from the wiring T7 of the sequential circuit SR of a (j−1)-th stage. Note that the wiring T1 of the sequential circuit SR of the first stage is supplied with a potential of a start pulse signal SP.

Note that the wirings T3, T4, and T5 are supplied with the signals CLK1, CLK2, and CLK3, respectively, in the sequential circuit SR illustrated in FIG. 18; however, in FIG. 19, the wirings T3, T4, and T5 are not necessarily supplied with the signals CLK1, CLK2, and CLK3, respectively, like the sequential circuit SR illustrated in FIG. 18.

Specifically, in the sequential circuit SR of a (4m+1)-th stage, the signals CLK1, CLK2, and CLK3 are supplied to the wirings T3, T4, and T5, respectively. In the sequential circuit SR of a (4m+2)-th stage, the signals CLK2, CLK3, and CLK4 are supplied to the wirings T3, T4, and T5, respectively. In the sequential circuit SR of a (4m+3)-th stage, the signals CLK3, CLK4, and CLK1 are supplied to the wirings T3, T4, and T5, respectively. In the sequential circuit SR of a (4m+4)-th stage, the signals CLK4, CLK1, and CLK2 are supplied to the wirings T3, T4, and T5, respectively. Note that in is a given integer that meets the condition that the total number of the sequential circuits SR is y.

In the sequential circuit SR of the j-th stage, the signal SROUT output from the wiring T7 of the sequential circuit SR which is in two stages after the current stage is supplied to the wiring T9 as the signal RIN. Note that the sequential circuit SR of (y+1)-th stage and the sequential circuit SR of (y+2)-th stage corresponding to the last two stages are not provided with the signal RIN.

<Method 1 for Manufacturing Display Device>

Next, a method for manufacturing a display device 400 of one embodiment of the present invention is described with reference to FIGS. 21A to 21D and FIGS. 22A and 22B.

Figure 21A:
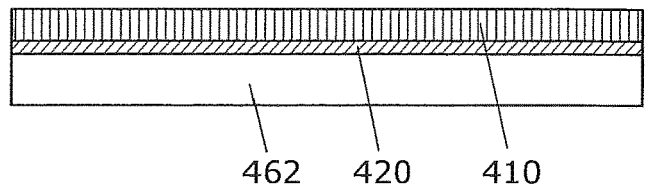
FIGS. 21A to 21D are cross-sectional views illustrating a method for manufacturing a display device.
Figure 21B:
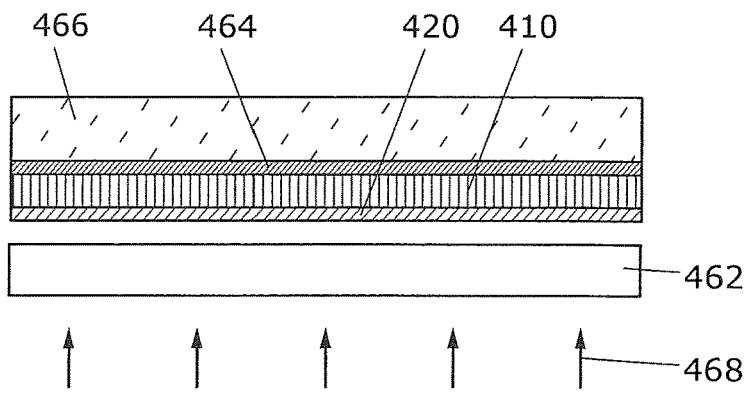

First of all, an insulating film 420 is formed over a substrate 462, and a first element layer 410 is formed over the insulating film 420 (see FIG. 21A). The first element layer 410 is provided with a semiconductor element. In addition to the semiconductor element, the first element layer 410 may be provided with a display element or part of a display element such as a pixel electrode.

It is necessary that the substrate 462 have at least heat resistance high enough to withstand heat treatment performed later. For example, a glass substrate, a ceramic substrate, a quartz substrate, a sapphire substrate, or the like may be used as the substrate 462.

In the case where a glass substrate is used as the substrate 462, an insulating film such as a silicon oxide film, a silicon oxynitride film, a silicon nitride film, or a silicon nitride oxide film is preferably formed between the substrate 462 and the insulating film 420, in which case contamination from the glass substrate can be prevented.

For the insulating film 420, an organic resin film of an epoxy resin, an aramid resin, an acrylic resin, a polyimide resin, a polyamide resin, a polyamide-imide resin, or the like can be used. Among them, a polyimide resin is preferably used because it has high heat resistance. For example, in the case where a polyimide resin is used for the insulating film 420, the thickness of the polyimide resin is greater than or equal to 3 nm and less than or equal to 20 µm, preferably greater than or equal to 500 nm and less than or equal to 2 µm. In the case where a polyimide resin is used for the insulating film 420, the insulating film 420 can be formed by a spin coating method, a dip coating method, a doctor blade method, or the like. In the case where a polyimide resin is used for the insulating film 420, for example, the insulating film 420 with a desired thickness can be obtained by removing part of a film containing the polyimide resin by a doctor blade method.

Note that a temperature during the process of forming the first element layer 410 is preferably higher than or equal to room temperature and lower than or equal to 300° C. For example, the deposition temperature of an insulating film or a conductive film which is included in the first element layer 410 and is formed using an inorganic material is preferably higher than or equal to 150° C. and lower than or equal to 300° C., further preferably higher than or equal to 200° C. and lower than or equal to 270° C. Furthermore, an insulating film or the like which is included in the first element layer 410 and is formed using an organic resin material is preferably formed at a temperature higher than or equal to room temperature and lower than or equal to 100° C.

It is preferable that a CAAC-OS, which is described later, be used for an oxide semiconductor film of a transistor included in the first element layer 410. In the case where the CAAC-OS is used for the oxide semiconductor film of the transistor, for example, when the display device 400 is bent, a crack or the like is less likely to be generated in a channel formation region, resulting in higher resistance against bending.

Indium tin oxide to which silicon oxide is added is preferably used for the conductive film included in the first element layer 410 because a crack or the like is less likely to be generated in the conductive film when the display device 400 is bent.

Next, the first element layer 410 and a temporary supporting substrate 466 are attached with an adhesive 464 for separation, and then the insulating film 420 and the first element layer 410 are separated from the substrate 462. Thus, the temporary supporting substrate 466 is provided with the insulating film 420 and the first element layer 410 (see FIG. 21B).

As the temporary supporting substrate 466, a glass substrate, a quartz substrate, a sapphire substrate, a ceramic substrate, a metal substrate, or the like can be used. Alternatively, a plastic substrate that can withstand a processing temperature of this manufacturing method may be used, or a flexible film-like substrate may be used.

An adhesive with which the temporary supporting substrate 466 and the first element layer 410 can be chemically or physically separated when necessary, such as an adhesive that is soluble in water or a solvent or an adhesive that is capable of being plasticized upon irradiation with UV light or the like, is used as the adhesive 464 for separation.

Any of various methods can be used as appropriate in the process for transferring the components to the temporary supporting substrate 466. For example, the substrate 462 and the insulating film 420 can be separated from each other in such a manner that the insulating film 420 is irradiated with laser light 468 from a side of the substrate 462 where the insulating film 420 is not formed, i.e., from the bottom side in FIG. 21B to make the insulating film 420 weak. Furthermore, a region where adhesion between the substrate 462 and the insulating film 420 is low and a region where adhesion between the substrate 462 and the insulating film 420 is high may be formed by adjustment of the irradiation energy density of the laser light 468, and then the substrate 462 and the insulating film 420 may be separated.

Although the method in which separation is caused at the interface between the substrate 462 and the insulating film 420 is described, one embodiment of the present invention is not limited thereto. For example, separation may be caused at the interface between the insulating film 420 and the first element layer 410.

The insulating film 420 may be separated from the substrate 462 by filling the interface between the substrate 462 and the insulating film 420 with a liquid. Alternatively, the first element layer 410 may be separated from the insulating film 420 by filling the interface between the insulating film 420 and the first element layer 410 with a liquid. As the liquid, water, a polar solvent, or the like can be used, for example. The interface along which the insulating film 420 is separated, specifically, the interface between the substrate 462 and the insulating film 420 or the interface between the insulating film 420 and the first element layer 410 is filled with a liquid, whereby an influence of static electricity and the like which are generated owing to the separation and applied to the first element layer 410 can be reduced.

Figure 21C:
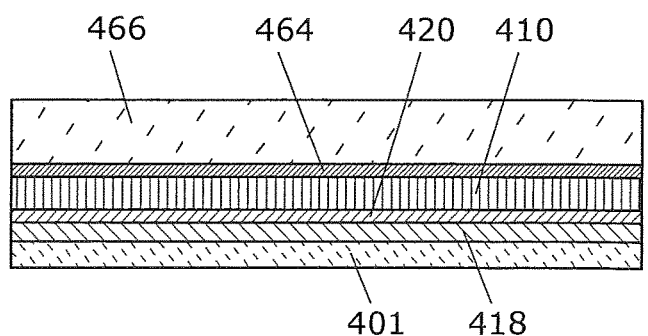

Next, a first substrate 401 is attached to the insulating film 420 using an adhesive layer 418 (see FIG. 21C).

Figure 21D:
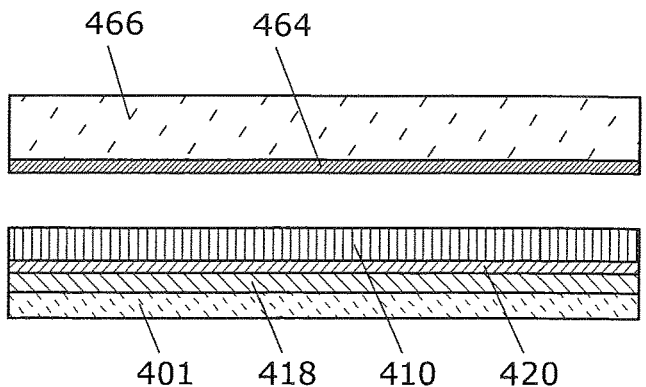

Then, the adhesive 464 for separation and the temporary supporting substrate 466 are detached from the first element layer 410 by dissolving or plasticizing the adhesive 464 for separation (see FIG. 21D).

Note that the adhesive 464 for separation is preferably removed by water, a solvent, or the like to expose the surface of the first element layer 410.

Through the above process, the first element layer 410 can be formed over the first substrate 401.

Figure 22A:
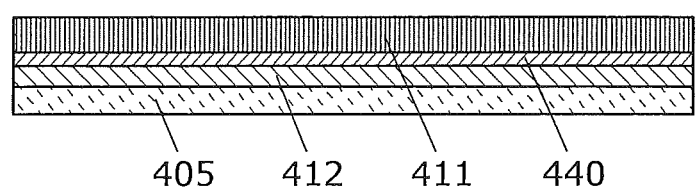
FIGS. 22A and 22B are cross-sectional views illustrating a method for manufacturing a display device.

Next, a second substrate 405, an adhesive layer 412 over the second substrate 405, an insulating film 440 over the adhesive layer 412, and a second element layer 411 are formed by a process similar to that illustrated in FIGS. 21A to 21D (see FIG. 22A).

The insulating film 440 included in the second element layer 411 can be formed using a material similar to that of the insulating film 420, here, using an organic resin.

Figure 22B:
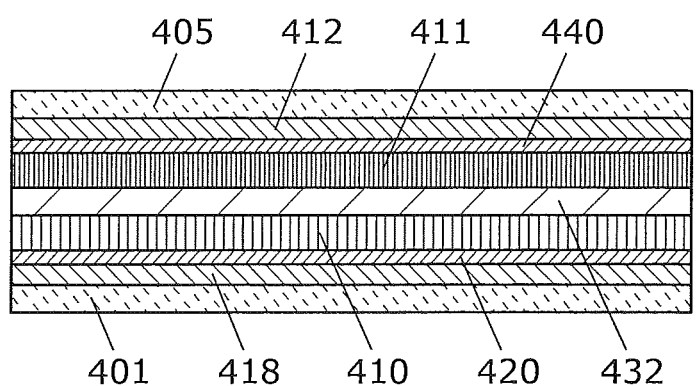

Next, a space between the first element layer 410 and the second element layer 411 is filled with a sealing layer 432 to attach the first element layer 410 and the second element layer 411 (see FIG. 22B).

With the sealing layer 432, for example, solid sealing is possible. Note that the sealing layer 432 preferably has flexibility. For example, a glass material such as a glass frit, or a resin material such as a resin that is curable at room temperature (e.g., a two-component type resin), a light curable resin, a heat-curable resin, or the like can be used for the sealing layer 432.

Through the above process, the display device 400 can be manufactured.

<Method 2 for Manufacturing Display Device>

Next, another method for manufacturing the display device 400 of one embodiment of the present invention is described with reference to FIGS. 23A to 23D. Note that FIGS. 23A to 23D illustrate an example in which an inorganic insulating film is used as the insulating film 420 and the insulating film 440.

First, a separation layer 463 is formed over the substrate 462. Then, the insulating film 420 is formed over the separation layer 463, and the first element layer 410 is formed over the insulating film 420 (see FIG. 23A).

The separation layer 463 can have a single-layer structure or a stacked-layer structure containing an element selected from tungsten, molybdenum, titanium, tantalum, niobium, nickel, cobalt, zirconium, zinc, ruthenium, rhodium, palladium, osmium, iridium, and silicon; an alloy material containing any of the elements; or a compound material containing any of the elements, for example. In the case of a layer containing silicon, a crystal structure of the layer containing silicon may be amorphous, microcrystal, polycrystal, or single crystal.

The separation layer 463 can be formed by a sputtering method, a PECVD method, a coating method, a printing method, or the like. Note that the coating method includes a spin coating method, a droplet discharge method, and a dispensing method.

In the case where the separation layer 463 has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that a mixture of tungsten and molybdenum is an alloy of tungsten and molybdenum, for example.

When the separation layer 463 has a stacked-layer structure including a layer containing tungsten and a layer containing an oxide of tungsten, it may be utilized that the layer containing tungsten is formed first and an insulating layer formed of oxide is formed thereover so that a layer containing an oxide of tungsten is formed at the interface between the tungsten layer and the insulating layer. Alternatively, the layer containing an oxide of tungsten may be formed by performing thermal oxidation treatment, oxygen plasma treatment, dinitrogen monoxide ($N_2O$) plasma treatment, treatment with a highly oxidizing solution such as ozone water, or the like on the surface of the layer containing tungsten. Plasma treatment or heat treatment may be performed in an atmosphere of oxygen, nitrogen, or dinitrogen monoxide alone, or a mixed gas of any of these gasses and another gas. Surface condition of the separation layer 463 is changed by the plasma treatment or heat treatment, whereby adhesion between the separation layer 463 and the insulating film 420 formed later can be controlled.

The insulating film 420 can be formed using an inorganic insulating film with low moisture permeability, such as a silicon oxide film, a silicon nitride film, a silicon oxynitride film, a silicon nitride oxide film, or an aluminum oxide film. The inorganic insulating film can be formed by a sputtering method or a PECVD method, for example.

Next, the first element layer 410 and the temporary supporting substrate 466 are attached with the adhesive 464 for separation, and then the insulating film 420 and the first element layer 410 are separated from the separation layer 463. Thus, the temporary supporting substrate 466 is provided with the insulating film 420 and the first element layer 410 (see FIG. 23B).

Any of various methods can be used as appropriate as the process for transferring the components to the temporary supporting substrate 466. For example, in the case where a layer including a metal oxide film is formed at the interface between the separation layer 463 and the insulating film 420, the metal oxide film is made to be weakened by crystallization, so that the insulating film 420 can be separated from the separation layer 463. Alternatively, in the case where the separation layer 463 is formed using a tungsten film, separation may be performed in such a manner that the tungsten film is etched using a mixed solution of ammonia water and a hydrogen peroxide solution.

The insulating film 420 may be separated from the separation layer 463 by filling the interface between the separation layer 463 and the insulating film 420 with a liquid. As the liquid, water, a polar solvent, or the like can be used, for example. The interface along which the insulating film 420 is separated, specifically, the interface between the separation layer 463 and the insulating film 420 is filled with a liquid, whereby an influence of static electricity and the like which are generated owing to the separation and applied to the first element layer 410 can be reduced.

Figure 23A:
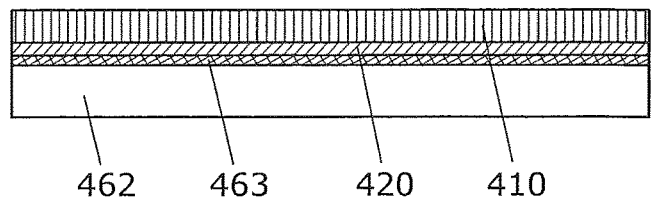
FIGS. 23A to 23D are cross-sectional views illustrating a method for manufacturing the display device.
Figure 23B:
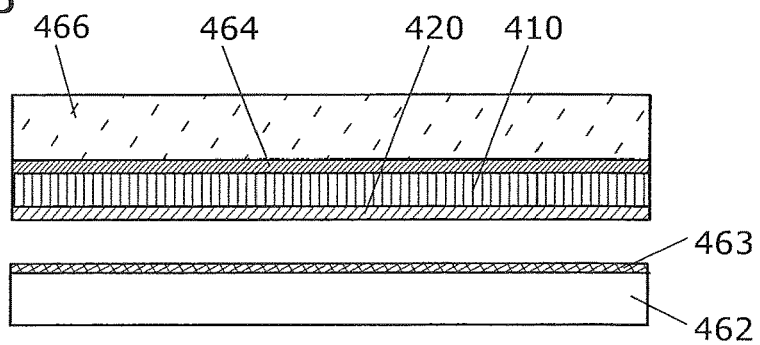
Figure 23C:
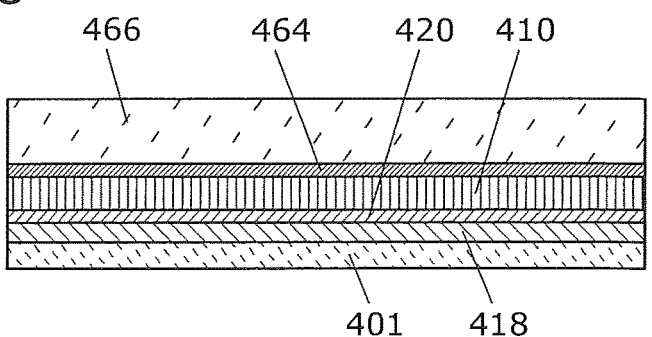

Next, the first substrate 401 is attached to the insulating film 420 using the adhesive layer 418 (see FIG. 23C).

Figure 23D:
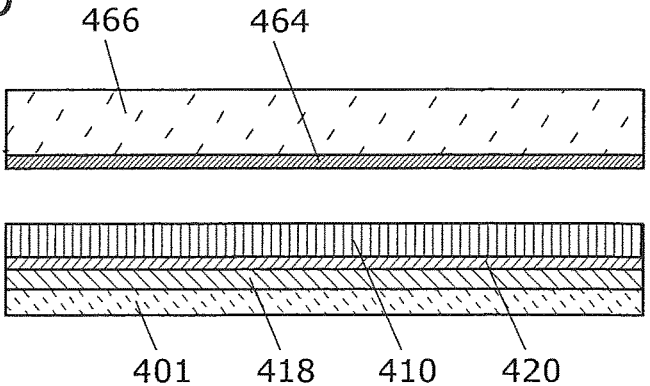

Then, the adhesive 464 for separation and the temporary supporting substrate 466 are removed from the first element layer 410 by dissolving or plasticizing the adhesive 464 for separation (see FIG. 23D).

Note that the adhesive 464 for separation is preferably removed by water, a solvent, or the like to expose the surface of the first element layer 410.

Through the above process, the first element layer 410 can be formed over the first substrate 401.

Next, the second substrate 405, the adhesive layer 412 over the second substrate 405, the insulating film 440 over the adhesive layer 412, and the second element layer 411 are formed by a process similar to that illustrated in FIGS. 23A to 23D. After that, a space between the first element layer 410 and the second element layer 411 is filled with the sealing layer 432, so that the first element layer 410 and the second element layer 411 are attached to each other.

Finally, an anisotropic conductive film and a flexible printed circuit (FPC) are attached to a connection electrode. An IC chip or the like may be mounted if necessary.

Through the above process, the display device 400 can be manufactured.

<Structure of Oxide Semiconductor>

A structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and a microcrystalline oxide semiconductor.

<CAAC-OS>

First, a CAAC-OS is described. Note that the CAAC-OS can also be referred to as an oxide semiconductor including c-axis aligned nanocrystals (CANC).

The CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 24A:
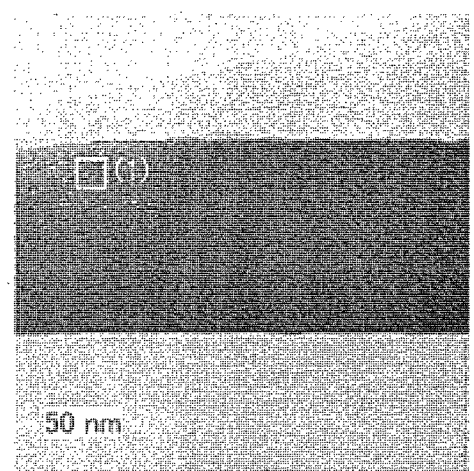
FIGS. 24A to 24D are Cs-corrected high-resolution TEM images of a cross section of a CAAC-OS and a cross-sectional schematic view of a CAAC-OS.

A CAAC-OS observed with TEM is described below. FIG. 24A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 24B:
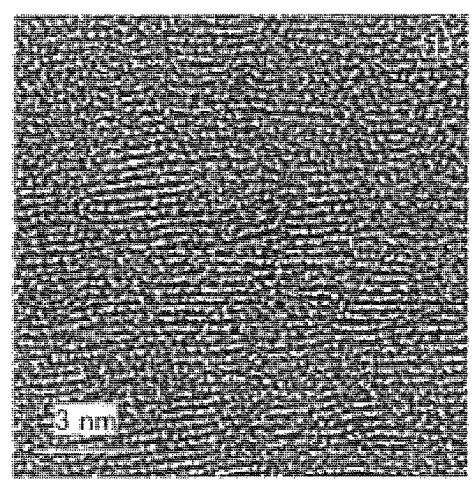

FIG. 24B is an enlarged Cs-corrected high-resolution TEM image of a region (1) in FIG. 24A. FIG. 24B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 24C:
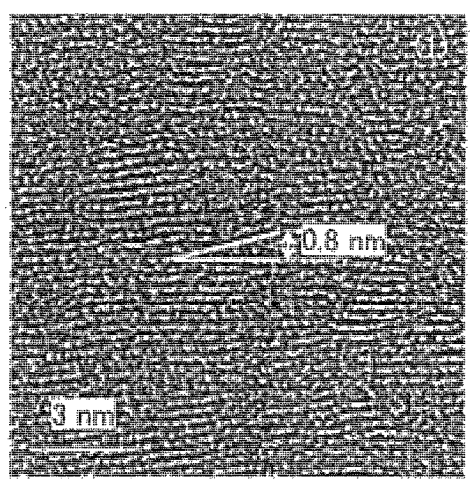

As shown in FIG. 24B, the CAAC-OS has a characteristic atomic arrangement. The characteristic atomic arrangement is denoted by an auxiliary line in FIG. 24C. FIGS. 24B and 24C prove that the size of a pellet is approximately 1 nm to 3 nm, and the size of a space caused by tilt of the pellets is approximately 0.8 nm. Therefore, the pellet can also be referred to as a nanocrystal (nc).

Figure 24D:
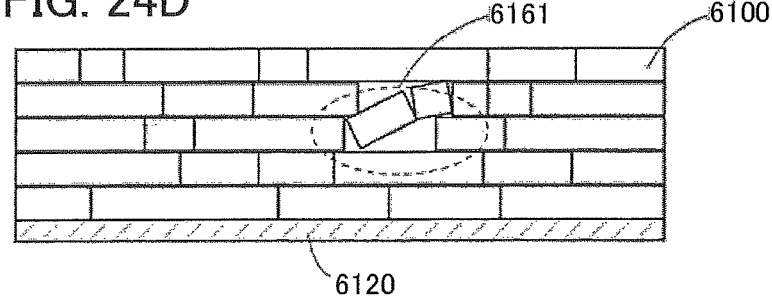

Here, according to the Cs-corrected high-resolution TEM images, the schematic arrangement of pellets 6100 of a CAAC-OS over a substrate 6120 is illustrated by such a structure in which bricks or blocks are stacked (see FIG. 24D). The part in which the pellets are tilted as observed in FIG. 24C corresponds to a region 6161 shown in FIG. 24D.

FIG. 25A shows a Cs-corrected high-resolution TEM image of a plane of the CAAC-OS observed from a direction substantially perpendicular to the sample surface. FIGS. 25B, 25C, and 25D are enlarged Cs-corrected high-resolution TEM images of regions (1), (2), and (3) in FIG. 25A, respectively. FIGS. 25B, 25C, and 25D indicate that metal atoms are arranged in a triangular, quadrangular, or hexagonal configuration in a pellet. However, there is no regularity of arrangement of metal atoms between different pellets.

Figure 26A:
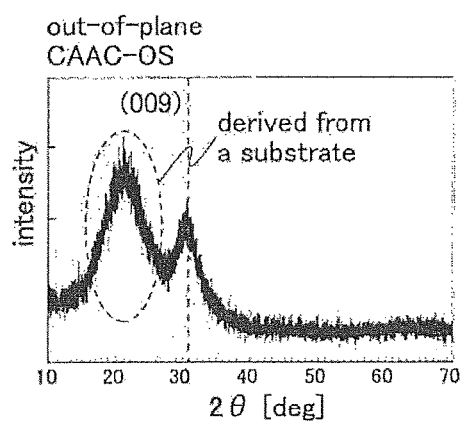
FIGS. 26A to 26C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle (2θ) of around 31° as shown in FIG. 26A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 26B:
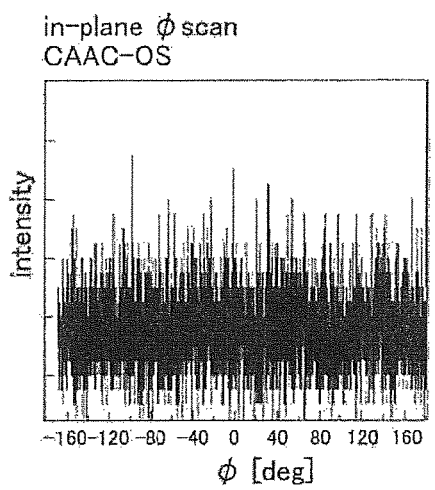
Figure 26C:
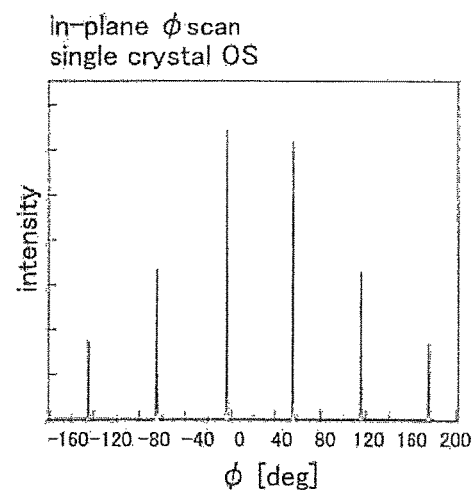

On the other hand, in structural analysis of the CAAC-OS by an in-plane method in which an X-ray is incident on a sample in a direction substantially perpendicular to the c-axis, a peak appears when 2θ is around 56°. This peak is attributed to the (110) plane of the $InGaZnO_4$ crystal. In the case of the CAAC-OS, when analysis (φ scan) is performed with 2θ fixed at around 56° and with the sample rotated using a normal vector of the sample surface as an axis (φ axis), as shown in FIG. 26B, a peak is not clearly observed. In contrast, in the case of a single crystal oxide semiconductor of $InGaZnO_4$, when φ scan is performed with 2θ fixed at around 56°, as shown in FIG. 26C, six peaks which are derived from crystal planes equivalent to the (110) plane are observed. Accordingly, the structural analysis using XRD shows that the directions of a-axes and b-axes are different in the CAAC-OS.

Next, a CAAC-OS analyzed by electron diffraction is described. For example, when an electron beam with a probe diameter of 300 mm is incident on a CAAC-OS including an $InGaZnO_4$ crystal in a direction parallel to the sample surface, a diffraction pattern (also referred to as a selected-area transmission electron diffraction pattern) shown in FIG. 27A might be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 27B shows a diffraction pattern obtained in such a manner that an electron beam with a probe diameter of 300 nm is incident on the same sample in a direction perpendicular to the sample surface. As shown in FIG. 27B, a ring-like diffraction pattern is observed. Thus, the electron diffraction also indicates that the a-axes and b-axes of the pellets included in the CAAC-OS do not have regular alignment. The first ring in FIG. 27B is considered to be derived from the (010) plane, the (100) plane, and the like of the $InGaZnO_4$ crystal. The second ring in FIG. 27B is considered to be derived from the (110) plane and the like.

Moreover, the CAAC-OS is an oxide semiconductor having a low density of defect states. Defects in the oxide semiconductor are, for example, a defect due to impurity and oxygen vacancy. Therefore, the CAAC-OS can be regarded as an oxide semiconductor with a low impurity concentration, or an oxide semiconductor having a small number of oxygen vacancy.

The impurity contained in the oxide semiconductor might serve as a carrier trap or serve as a carrier generation source. Furthermore, oxygen vacancies in the oxide semiconductor serve as carrier traps or serve as carrier generation sources when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having a low density of defect states (a small amount of oxygen vacancy) can have a low carrier density. Such an oxide semiconductor is referred to as a highly purified intrinsic or substantially highly purified intrinsic oxide semiconductor. A CAAC-OS has a low impurity concentration and a low density of defect states. That is, a CAAC-OS is likely to be highly purified intrinsic or substantially highly purified intrinsic oxide semiconductor. Thus, a transistor including a CAAC-OS rarely has negative threshold voltage (is rarely normally on). The highly purified intrinsic or substantially highly purified intrinsic oxide semiconductor has few carrier traps. An electric charge trapped by the carrier traps in the oxide semiconductor takes a long time to be released. The trapped electric charge may behave like a fixed electric charge. Thus, the transistor which includes the oxide semiconductor having a high impurity concentration and a high density of defect states might have unstable electrical characteristics. However, a transistor including a CAAC-OS has small variation in electrical characteristics and high reliability.

Since the CAAC-OS has a low density of defect states, carriers generated by light irradiation or the like are less likely to be trapped in defect states. Therefore, in a transistor using the CAAC-OS, change in electrical characteristics due to irradiation with visible light or ultraviolet light is small.

<Microcrystalline Oxide Semiconductor>

Next, a microcrystalline oxide semiconductor is described.

The microcrystalline oxide semiconductor has a region in which a crystal part is observed and a region in which a crystal part is not clearly observed in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal (nc) that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

<Amorphous Oxide Semiconductor>

Next, an amorphous oxide semiconductor is described.

The amorphous oxide semiconductor is an oxide semiconductor having disordered atomic arrangement and no crystal part and exemplified by an oxide semiconductor which exists in an amorphous state as quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and only a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of crystal part, for example, a CAAC-OS and an nc-OS cannot be called an amorphous oxide semiconductor or a completely amorphous oxide semiconductor.

<Amorphous-Like Oxide Semiconductor>

Note that an oxide semiconductor may have a structure between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS, an nc-OS, and a CAAC-OS are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 28:
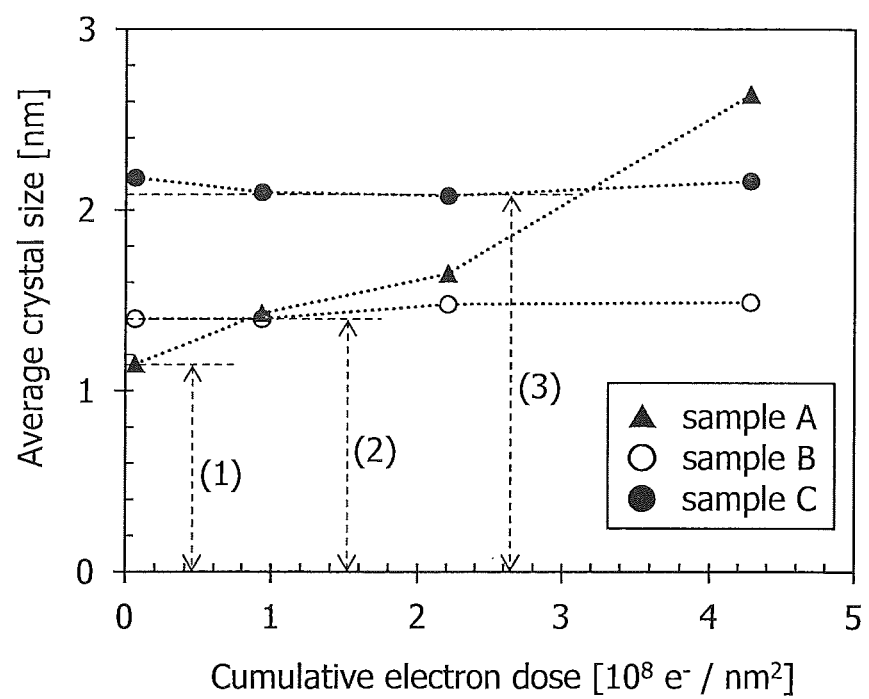
FIG. 28 shows a change in crystal part of an In—Ga—Zn oxide induced by electron irradiation.

FIG. 28 shows change in the average size of crystal parts (at 22 points to 45 points) in each sample. Note that the crystal part size corresponds to the length of a lattice fringe. FIG. 28 indicates that the crystal part size in the a-like OS increases with an increase in the cumulative electron dose. Specifically, as shown by (1) in FIG. 28, a crystal part of approximately 1.2 nm (also referred to as an initial nucleus) at the start of TEM observation grows to a size of approximately 2.6 nm at a cumulative electron dose of $4.2\times10^8$ e$^-$/nm$^2$. In contrast, the crystal part size in the nc-OS and the CAAC-OS shows little change from the start of electron irradiation to a cumulative electron dose of $4.2\times10^8$ e$^-$/nm$^2$. Specifically, as shown by (2) and (3) in FIG. 28, the average crystal sizes in the nc-OS and the CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, a microcrystalline oxide semiconductor, and a CAAC-OS, for example.

<Deposition Model>

Examples of deposition models of a CAAC-OS and an nc-OS are described below.

Figure 29A:
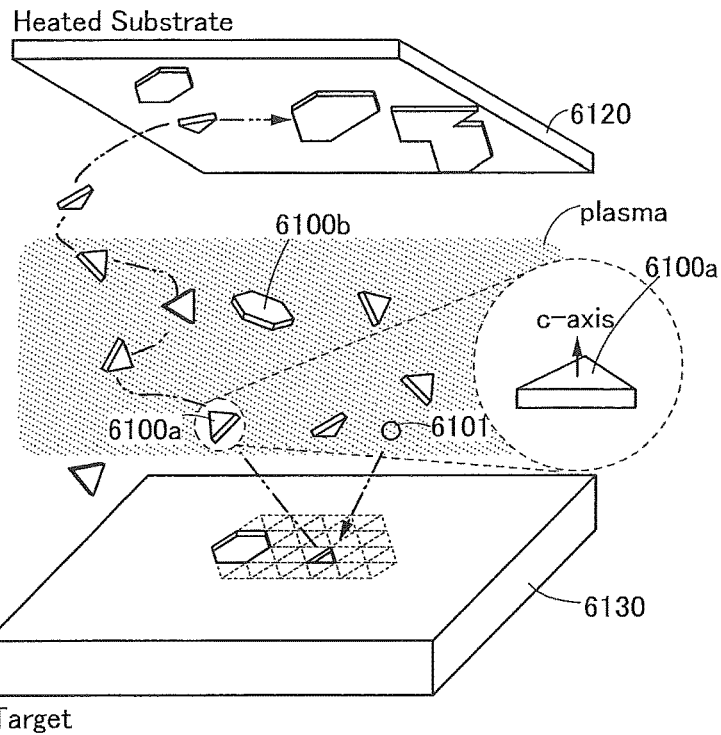
FIGS. 29A and 29B are schematic views showing deposition models of a CAAC-OS and an nc-OS.

FIG. 29A is a schematic view of the inside of a deposition chamber where a CAAC-OS is deposited by a sputtering method.

A target 6130 is attached to a backing plate. A plurality of magnets is provided to face the target 6130 with the backing plate positioned therebetween. The plurality of magnets generates a magnetic field. A sputtering method in which the disposition rate is increased by utilizing a magnetic field of magnets is referred to as a magnetron sputtering method.

The substrate 6120 is placed to face the target 6130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 6130, and plasma is observed. The magnetic field forms a high-density plasma region in the vicinity of the target 6130. In the high-density plasma region, the deposition gas is ionized, so that an ion 6101 is generated. Examples of the ion 6101 include an oxygen cation (O$^+$) and an argon cation (Ar$^+$).

Figure 30A:
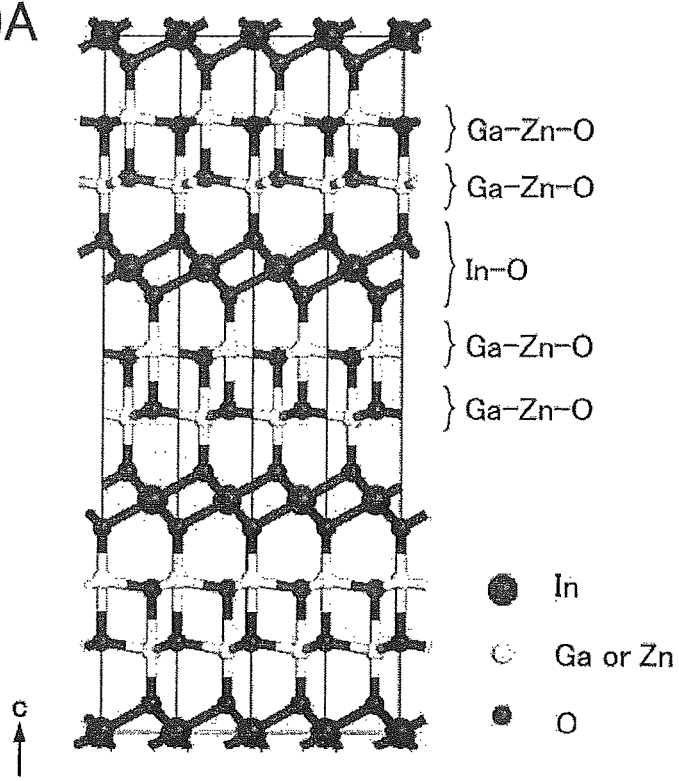
FIGS. 30A to 30C illustrate an InGaZnO$_4$ crystal and a pellet.

Here, the target 6130 has a polycrystalline structure which includes a plurality of crystal grains and in which a cleavage plane exists in at least one crystal grain. FIG. 30A shows a structure of an InGaZnO$_4$ crystal included in the target 6130 as an example. Note that FIG. 30A shows a structure of the case where the InGaZnO$_4$ crystal is observed from a direction parallel to the b-axis. FIG. 30A indicates that oxygen atoms in a Ga—Zn—O layer are positioned close to those in an adjacent Ga—Zn—O layer. The oxygen atoms have negative charge, whereby repulsive force is generated between the two adjacent Ga—Zn—O layers. As a result, the InGaZnO$_4$ crystal has a cleavage plane between the two adjacent Ga—Zn—O layers.

The ion 6101 generated in the high-density plasma region is accelerated toward the target 6130 side by an electric field, and then collides with the target 6130. At this time, a pellet 6100a and a pellet 6100b which are flat-plate-like (pellet-like) sputtered particles are separated and sputtered from the cleavage plane. Note that structures of the pellet 6100a and the pellet 6100b may be distorted by an impact of collision of the ion 6101.

The pellet 6100a is a flat-plate-like (pellet-like) sputtered particle having a triangle plane, e.g., regular triangle plane. The pellet 6100b is a flat-plate-like (pellet-like) sputtered particle having a hexagon plane, e.g., regular hexagon plane. Note that flat-plate-like (pellet-like) sputtered particles such as the pellet 6100a and the pellet 6100b are collectively called pellets 6100. The shape of a flat plane of the pellet 6100 is not limited to a triangle or a hexagon. For example, the flat plane may have a shape formed by combining two or more triangles. For example, a quadrangle (e.g., rhombus) may be formed by combining two triangles (e.g., regular triangles).

Figure 30B:
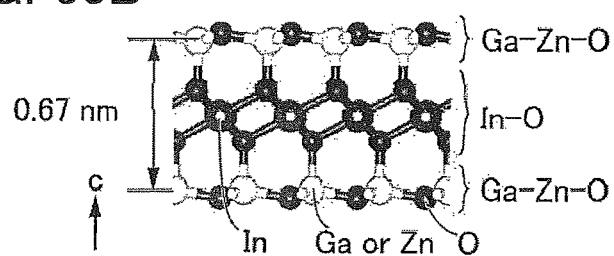
Figure 30C:
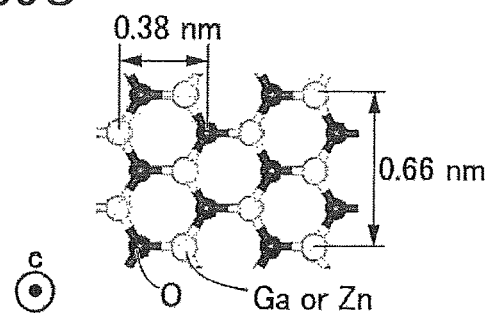

The thickness of the pellet 6100 is determined depending on the kind of deposition gas and the like. The thicknesses of the pellets 6100 are preferably uniform; the reason for this is described later. In addition, the sputtered particle preferably has a pellet shape with a small thickness as compared to a dice shape with a large thickness. For example, the thickness of the pellet 6100 is greater than or equal to 0.4 nm and less than or equal to 1 nm, preferably greater than or equal to 0.6 nm and less than or equal to 0.8 nm. In addition, for example, the width of the pellet 6100 is greater than or equal to 1 nm and less than or equal to 3 nm, preferably greater than or equal to 1.2 nm and less than or equal to 2.5 nm. The pellet 6100 corresponds to the initial nucleus in the description of (1) in FIG. 28. For example, when the ion 6101 collides with the target 6130 including an In—Ga—Zn oxide, the pellet 6100 that includes three layers of a Ga—Zn—O layer, an In—O layer, and a Ga—Zn—O layer as shown in FIG. 30B is separated. Note that FIG. 30C shows the structure of the separated pellet 6100 which is observed from a direction parallel to the c-axis. The pellet 6100 has a nanometer-sized sandwich structure including two Ga—Zn—O layers (pieces of bread) and an In—O layer (filling).

The pellet 6100 may receive a charge when passing through the plasma, so that side surfaces thereof are negatively or positively charged. In the pellet 6100, for example, an oxygen atom positioned on its side surface may be negatively charged. When the side surfaces are charged with the same polarity, charges repel each other, and accordingly, the pellet 6100 can maintain a flat-plate (pellet) shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged. In addition, the pellet 6100 may grow by being bonded with an indium atom, a gallium atom, a zinc atom, an oxygen atom, or the like when passing through plasma. A difference in size between (2) and (1) in FIG. 28 corresponds to the amount of growth in plasma. Here, in the case where the temperature of the substrate 6120 is at around room temperature, the pellet 6100 on the substrate 6120 hardly grows; thus, an nc-OS is formed (see FIG. 29B). An nc-OS can be deposited when the substrate 6120 has a large size because the deposition of an nc-OS can be carried out at room temperature. Note that in order that the pellet 6100 grows in plasma, it is effective to increase deposition power in sputtering. High deposition power can stabilize the structure of the pellet 6100.

Figure 29B:
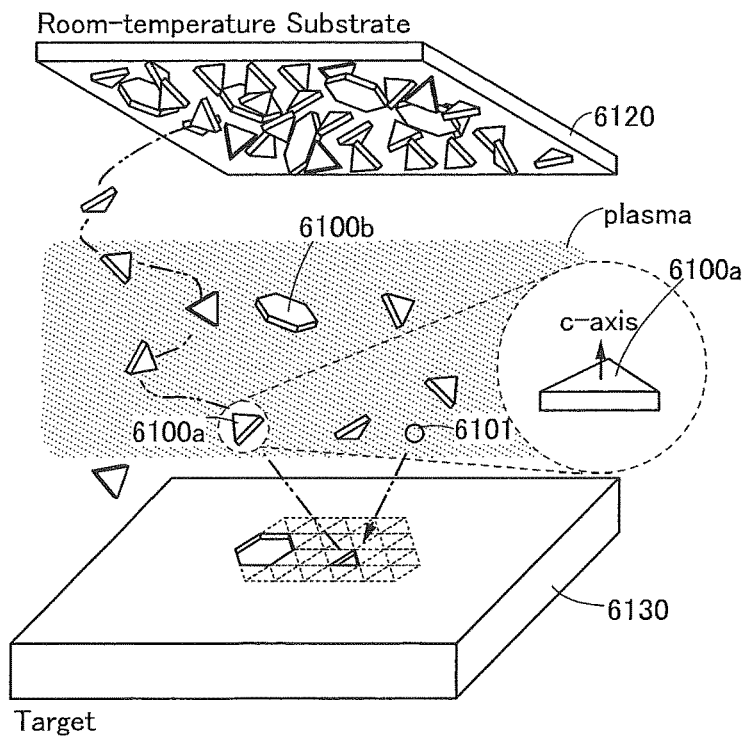

As shown in FIGS. 29A and 29B, the pellet 6100 flies like a kite in plasma and flutters up to the substrate 6120. Since the pellets 6100 are charged, when the pellet 6100 gets close to a region where another pellet 6100 has already been deposited, repulsion is generated. Here, above the substrate 6120, a magnetic field in a direction parallel to the top surface of the substrate 6120 (also referred to as a horizontal magnetic field) is generated. A potential difference is given between the substrate 6120 and the target 6130, and accordingly, current flows from the substrate 6120 toward the target 6130. Thus, the pellet 6100 is given a force (Lorentz force) on the top surface of the substrate 6120 by an effect of the magnetic field and the current. This is explainable with Fleming's left-hand rule.

The mass of the pellet 6100 is larger than that of an atom. Therefore, to move the pellet 6100 over the top surface of the substrate 6120, it is important to apply some force to the pellet 6100 from the outside. One kind of the force may be force which is generated by the action of a magnetic field and current. In order to apply a sufficient force to the pellet 6100 so that the pellet 6100 moves over a top surface of the substrate 6120, it is preferable to provide, on the top surface, a region where the magnetic field in a direction parallel to the top surface of the substrate 6120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate 6120 is 1.5 times or higher, preferably twice or higher, further preferably 3 times or higher, still further preferably 5 times or higher as high as the magnetic field in a direction perpendicular to the top surface of the substrate 6120.

At this time, the magnets and the substrate 6120 are moved or rotated relatively, whereby the direction of the horizontal magnetic field on the top surface of the substrate 6120 continues to change. Therefore, the pellet 6100 can be moved in various directions on the top surface of the substrate 6120 by receiving forces in various directions.

Furthermore, as shown in FIG. 29A, when the substrate 6120 is heated, resistance between the pellet 6100 and the substrate 6120 due to friction or the like is low. As a result, the pellet 6100 glides above the top surface of the substrate 6120. The glide of the pellet 6100 is caused in a state where its flat plane faces the substrate 6120. Then, when the pellet 6100 reaches the side surface of another pellet 6100 that has already been deposited, the side surfaces of the pellets 6100 are bonded. At this time, the oxygen atom on the side surface of the pellet 6100 is released. With the released oxygen atom, oxygen vacancies in a CAAC-OS might be filled; thus, the CAAC-OS has a low density of defect states. Note that the temperature of the top surface of the substrate 6120 is, for example, higher than or equal to 100° C. and lower than 500° C., higher than or equal to 150° C. and lower than 450° C., or higher than or equal to 170° C. and lower than 400° C. Hence, even when the substrate 6120 has a large size, it is possible to deposit a CAAC-OS.

Furthermore, the pellet 6100 is heated on the substrate 6120, whereby atoms are rearranged, and the structure distortion caused by the collision of the ion 6101 can be reduced. The pellet 6100 whose structure distortion is reduced is substantially single crystal. Even when the pellets 6100 are heated after being bonded, expansion and contraction of the pellet 6100 itself hardly occur, which is caused by turning the pellet 6100 into substantially single crystal. Thus, formation of defects such as a grain boundary due to expansion of a space between the pellets 6100 can be prevented, and accordingly, generation of crevasses can be prevented.

The CAAC-OS does not have a structure like a board of a single crystal oxide semiconductor but has arrangement with a group of pellets 6100 (nanocrystals) like stacked bricks or blocks. Furthermore, a grain boundary does not exist between the pellets 6100. Therefore, even when deformation such as shrink occurs in the CAAC-OS owing to heating during deposition, heating or bending after deposition, or the like, it is possible to relieve local stress or release distortion. Therefore, this structure is suitable for a flexible semiconductor device. Note that the nc-OS has arrangement in which pellets 6100 (nanocrystals) are randomly stacked.

When the target 6130 is sputtered with the ion 6101, in addition to the pellets 6100, zinc oxide or the like may be separated. The zinc oxide is lighter than the pellet 6100 and thus reaches the top surface of the substrate 6120 before the pellet 6100. As a result, the zinc oxide forms a zinc oxide layer 6102 with a thickness greater than or equal to 0.1 nm and less than or equal to 10 nm, greater than or equal to 0.2 nm and less than or equal to 5 nm, or greater than or equal to 0.5 nm and less than or equal to 2 nm. FIGS. 31A to 31D are cross-sectional schematic views.

Figure 31A:
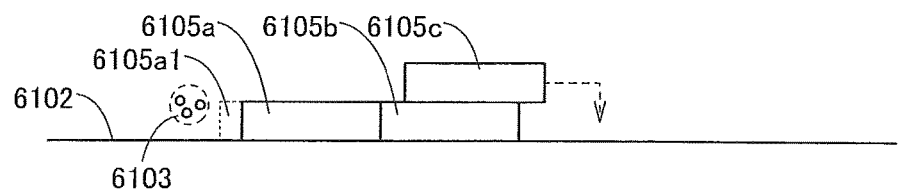
FIGS. 31A to 31D are schematic diagrams illustrating a deposition model of a CAAC-OS.

As illustrated in FIG. 31A, a pellet 6105a and a pellet 6105b are deposited over the zinc oxide layer 6102. Here, side surfaces of the pellet 6105a and the pellet 6105b are in contact with each other. In addition, a pellet 6105c is deposited over the pellet 6105b, and then glides over the pellet 6105b. Furthermore, a plurality of particles 6103 separated from the target together with the zinc oxide is crystallized by heat from the substrate 6120 to form a region 6105a1 on another side surface of the pellet 6105a. Note that the plurality of particles 6103 may contain oxygen, zinc, indium, gallium, or the like.

Figure 31B:
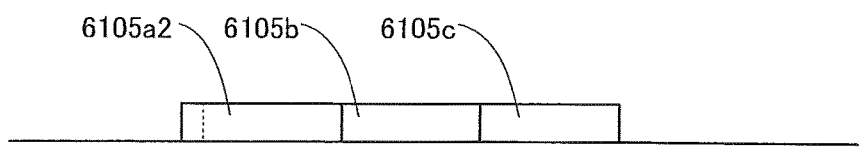

Then, as illustrated in FIG. 31B, the region 6105a1 grows to part of the pellet 6105a to form a pellet 6105a2. In addition, a side surface of the pellet 6105c is in contact with another side surface of the pellet 6105b.

Figure 31C:
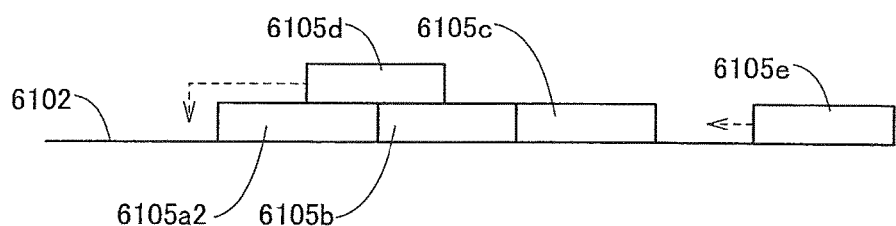

Next, as illustrated in FIG. 31C, a pellet 6105d is deposited over the pellet 6105a2 and the pellet 6105b, and then glides over the pellet 6105a2 and the pellet 6105b. Furthermore, a pellet 6105e glides toward another side surface of the pellet 6105c over the zinc oxide layer 6102.

Figure 31D:
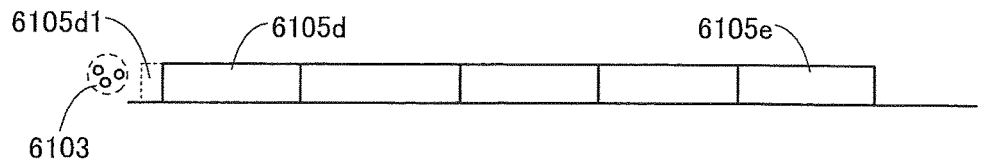

Then, as illustrated in FIG. 31D, the pellet 6105d is placed so that a side surface of the pellet 6105d is in contact with a side surface of the pellet 6105a2. Furthermore, a side surface of the pellet 6105e is in contact with another side surface of the pellet 6105c. A plurality of particles 6103 separated from the target 6130 together with the zinc oxide is crystallized by heat from the substrate 6120 to form a region 6105d1 on another side surface of the pellet 6105d.

As described above, deposited pellets are placed to be in contact with each other and then growth is caused at side surfaces of the pellets, whereby a CAAC-OS is formed over the substrate 6120. Therefore, each pellet of the CAAC-OS is larger than that of the nc-OS. A difference in size between (3) and (2) in FIG. 28 corresponds to the amount of growth after deposition.

When spaces between pellets are extremely small, the pellets may form a large pellet. The large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above. In this case, in an oxide semiconductor used for a minute transistor, a channel formation region might be fit inside the large pellet. That is, the region having a single crystal structure can be used as the channel formation region. Furthermore, when the size of the pellet is increased, the region having a single crystal structure can be used as the channel formation region, the source region, and the drain region of the transistor.

In this manner, when the channel formation region or the like of the transistor is formed in a region having a single crystal structure, the frequency characteristics of the transistor can be increased in some cases.

As shown in such a model, the pellets 6100 are considered to be deposited on the substrate 6120. Thus, a CAAC-OS can be deposited even when a formation surface does not have a crystal structure; therefore, a growth mechanism in this case is different from epitaxial growth. In addition, laser crystallization is not needed for formation of a CAAC-OS, and a uniform film can be formed even over a large-sized glass substrate or the like. For example, even when the top surface (formation surface) of the substrate 6120 has an amorphous structure (e.g., the top surface is formed of amorphous silicon oxide), a CAAC-OS can be formed.

In addition, it is found that in formation of the CAAC-OS, the pellets 6100 are arranged in accordance with the top surface shape of the substrate 6120 that is the formation surface even when the formation surface has unevenness. For example, in the case where the top surface of the substrate 6120 is flat at the atomic level, the pellets 6100 are arranged so that flat planes parallel to the a-b plane face downwards. In the case where the thickness of the pellets 6100 are uniform, a layer with a uniform thickness, flatness, and high crystallinity is formed. By stacking n layers (n is a natural number), the CAAC-OS can be obtained.

In the case where the top surface of the substrate 6120 has unevenness, a CAAC-OS in which n layers (n is a natural number) in each of which the pellets 6100 are arranged along the unevenness are stacked is formed. Since the substrate 6120 has unevenness, a gap is easily generated between the pellets 6100 in the CAAC-OS in some cases. Note that, even in such a case, owing to intermolecular force, the pellets 6100 are arranged so that a gap between the pellets is as small as possible even on the unevenness surface. Therefore, even when the formation surface has unevenness, a CAAC-OS with high crystallinity can be obtained.

Since a CAAC-OS is deposited in accordance with such a model, the sputtered particle preferably has a pellet shape with a small thickness. Note that when the sputtered particles have a dice shape with a large thickness, planes facing the substrate 6120 vary; thus, the thicknesses and orientations of the crystals cannot be uniform in some cases.

According to the deposition model described above, a CAAC-OS with high crystallinity can be formed even on a formation surface with an amorphous structure.

<Top and Cross-Sectional Views of Semiconductor Device>

Figure 32:
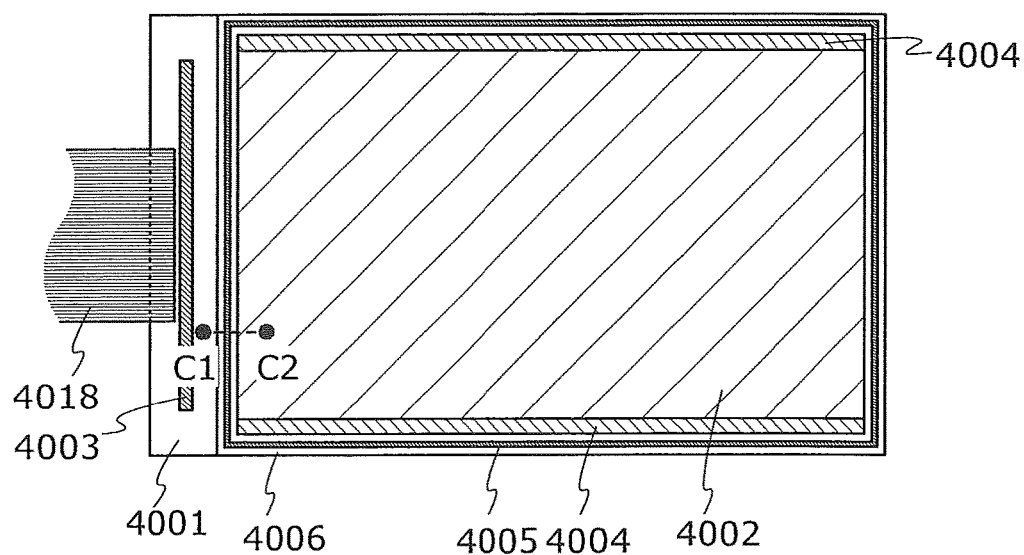
FIG. 32 is a top view of a liquid crystal display device.
Figure 33:
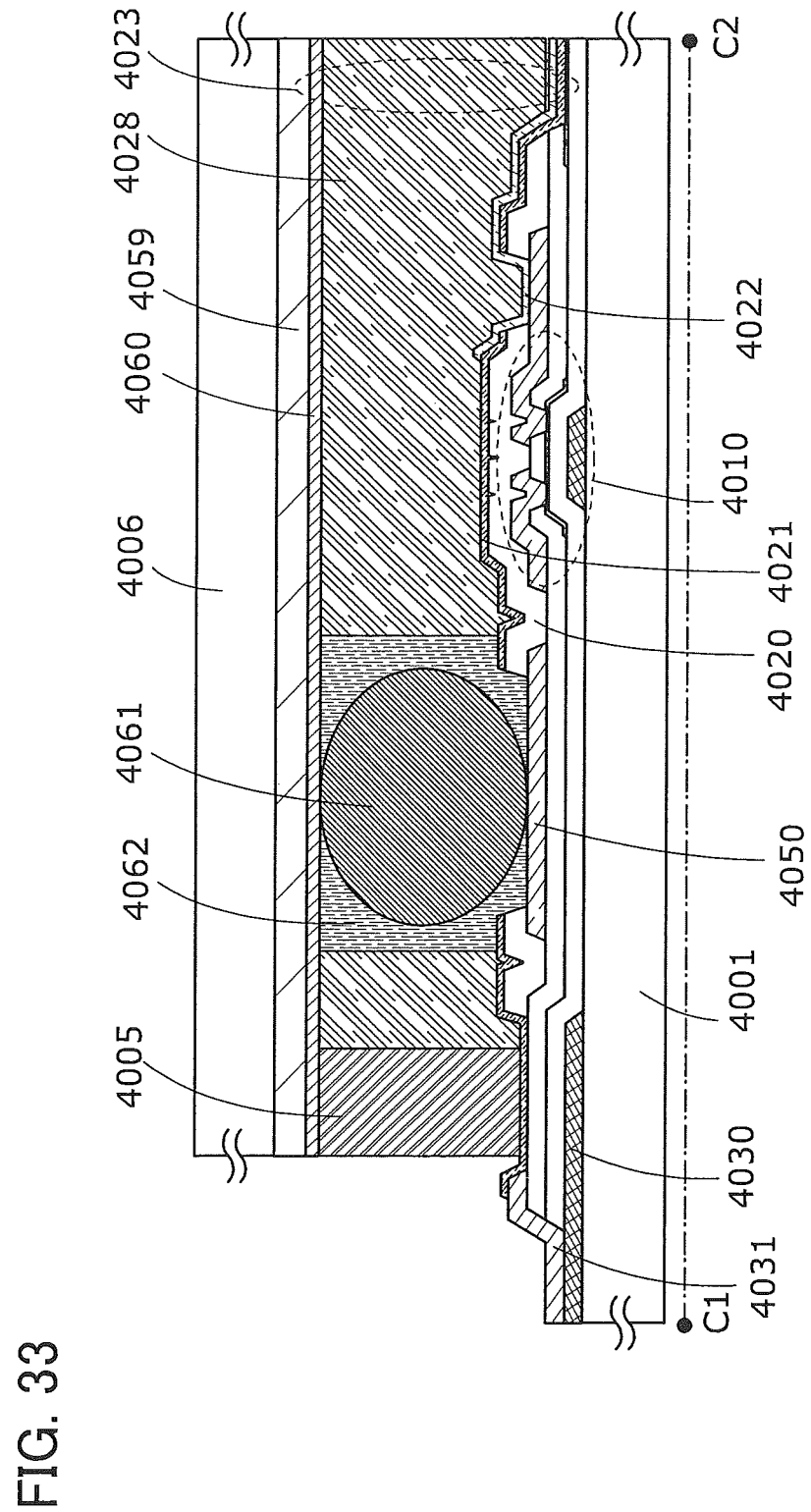
FIG. 33 is a cross-sectional view of a liquid crystal display device.

Next, the appearance of the semiconductor device of one embodiment of the present invention is described with reference to FIG. 32. A liquid crystal display device is described as an example of the semiconductor device. FIG. 32 is a top view of the liquid crystal display device where a substrate 4001 and a substrate 4006 are bonded to each other with a sealant 4005. FIG. 33 corresponds to a cross-sectional view taken along dashed line C1-C2 in FIG. 32.

The sealant 4005 is provided to surround a pixel portion 4002 and a pair of driver circuits 4004 provided over the substrate 4001. The substrate 4006 is provided over the pixel portion 4002 and the driver circuits 4004. Thus, the pixel portion 4002 and the driver circuits 4004 are sealed by the substrate 4001, the sealant 4005, and the substrate 4006.

A driver circuit 4003 is mounted in a region which is different from the region surrounded by the sealant 4005 over the substrate 4001.

A plurality of transistors are included in the pixel portion 4002 and the driver circuits 4004 provided over the substrate 4001. FIG. 33 illustrates a transistor 4010 included in the pixel portion 4002. An insulating film 4020 and an insulating film 4021 are stacked in this order over the transistor 4010, and the transistor 4010 is connected to a pixel electrode 4022 over the insulating film 4021 through an opening provided in the insulating films 4020 and 4021.

A resin film 4059 is provided on the substrate 4006, and a common electrode 4060 is provided on the resin film 4059. A liquid crystal layer 4028 between the pixel electrode 4022 and the common electrode 4060 is provided between the substrates 4001 and 4006. A liquid crystal element 4023 includes the pixel electrode 4022, the common electrode 4060, and the liquid crystal layer 4028.

The transmittance of the liquid crystal element 4023 changes when the alignment of liquid crystal molecules included in the liquid crystal layer 4028 changes in accordance with the level of a voltage applied between the pixel electrode 4022 and the common electrode 4060. Accordingly, when the transmittance of the liquid crystal element 4023 is controlled by the potential of an image signal supplied to the pixel electrode 4022, gray-scale images can be displayed.

As illustrated in FIG. 33, in one embodiment of the present invention, the insulating film 4020 is removed at an end of the panel. In the region where the insulating film 4020 is removed, a conductive film 4050 is formed. The conductive film 4050 and conductive films serving as a source and a drain of the transistor 4010 can be formed by etching one conductive film.

A resin film 4062 in which a conductive particle 4061 is dispersed is provided between the substrate 4001 and the substrate 4006. The conductive film 4050 is electrically connected to the common electrode 4060 through the conductive particle 4061. In other words, the common electrode 4060 and the conductive film 4050 are electrically connected to each other through the conductive particle 4061 at the end portion of the panel. The resin film 4062 can be formed using a thermosetting resin or an ultraviolet curable resin. As the conductive particle 4061, a particle of a spherical organic resin coated with thin-film metal of Au, Ni, Co, or the like can be used, for example.

An alignment film is not illustrated in FIG. 33. In the case of providing alignment films on the pixel electrode 4022 and the common electrode 4060, the alignment film overlapping with the common electrode 4060 is partly removed and the alignment film overlapping with the conductive film 4050 is partly removed; thus, the common electrode 4060, the conductive particle 4061, and the conductive film 4050 can be electrically connected to one another.

The liquid crystal display device may display a color image by using a color filter or may display a color image by sequentially turning on a plurality of light sources whose hues are different from each other.

Image signals from the driver circuit 4003 and a variety of control signals and potentials from an FPC 4018 are supplied to the driver circuits 4004 or the pixel portion 4002 through lead wirings 4030 and 4031.

<Structural Example of Electronic Device>

The semiconductor device of one embodiment of the present invention can be used for display devices, notebook personal computers, or image reproducing devices provided with recording media (typically, devices which reproduce the content of recording media such as digital versatile discs (DVDs) and have displays for displaying the reproduced images). Other than the above, as an electronic device which can use the semiconductor device of one embodiment of the present invention, cellular phones, portable game machines, portable information terminals, electronic books, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. Specific examples of these electronic devices are illustrated in FIGS. 34A to 34F.

Figure 34A:
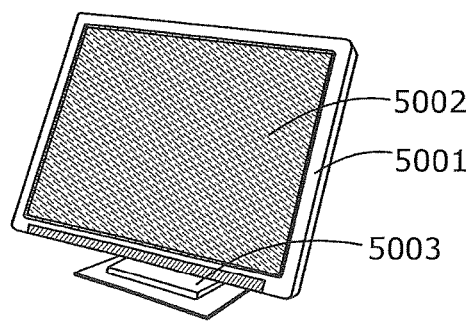
FIGS. 34A to 34F each illustrate an electronic device.

FIG. 34A illustrates a display device including a housing 5001, a display portion 5002, a supporting base 5003, and the like. The semiconductor device of one embodiment of the present invention can be used for the display portion 5002 or another circuit. Note that the display device includes all devices for displaying information such as for a personal computer, for receiving TV broadcasting, and for displaying an advertisement.

Figure 34B:
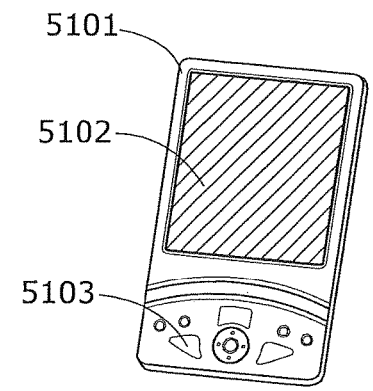

FIG. 34B illustrates a portable information terminal including a housing 5101, a display portion 5102, operation keys 5103, and the like. The semiconductor device of one embodiment of the present invention can be used for the display portion 5102 or another circuit.

Figure 34C:
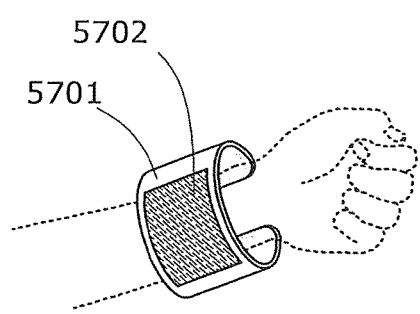

FIG. 34C illustrates a display device including a housing 5701 having a curved surface, a display portion 5702, and the like. When a flexible substrate is used for the semiconductor device of one embodiment of the present invention, it is possible to use the semiconductor device as the display portion 5702 supported by the housing 5701 having a curved surface.

Figure 34D:
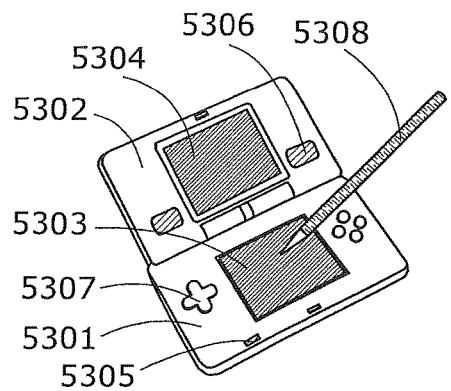

FIG. 34D illustrates a portable game machine including a housing 5301, a housing 5302, a display portion 5303, a display portion 5304, a microphone 5305, a speaker 5306, an operation key 5307, a stylus 5308, and the like. The semiconductor device of one embodiment of the present invention can be used for the display portion 5303, the display portion 5304, or another circuit. Note that although the portable game machine illustrated in FIG. 34D includes the two display portions 5303 and 5304, the number of display portions included in the portable game machine is not limited to two.

Figure 34E:
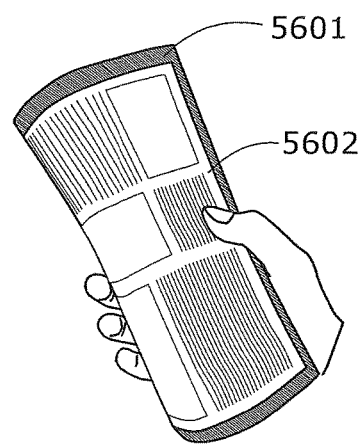

FIG. 34E illustrates an e-book reader, which includes a housing 5601, a display portion 5602, and the like. The semiconductor device of one embodiment of the present invention can be used for the display portion 5602 or another circuit. When a flexible substrate is used, the semiconductor device can have flexibility.

Figure 34F:
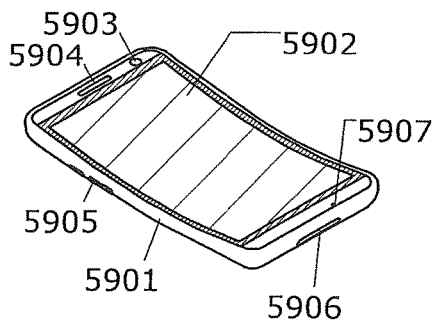

FIG. 34F illustrates a cellular phone, which includes a display portion 5902, a microphone 5907, a speaker 5904, a camera 5903, an external connection portion 5906, and an operation button 5905 in a housing 5901. The semiconductor device of one embodiment of the present invention can be used for the display portion 5902 or another circuit. When the semiconductor device of one embodiment of the present invention is provided over a flexible substrate, the semiconductor device can be used for the display portion 5902 having a curved surface, as illustrated in FIG. 34F.

EXAMPLE 1

Next, the result of measurement of drain current ID (A) with respect to gate voltage VG (V) of a transistor fabricated using a CAAC-OS film is described.

The fabricated transistor has the same stacked-layer structure as the transistor 10 illustrated in FIGS. 3A to 3C. The fabricated transistor has a channel length L of 6 μm, a channel width W of 3 μm or 10 cm, and an Lov length of 2 μm. The distance ΔW between an end portion of the opening 23 or 24 and an end portion of the oxide semiconductor film 14 in the channel width direction is 1.5 μm. Note that the channel width W corresponds to the width of the opening 23 or 24 in a direction perpendicular to the channel length. The Lov length means the length in the channel length direction of a region where a conductive film serving as a source or a drain and a conductive film serving as a gate overlap with each other.

The conductive film 12 is a conductive film obtained by stacking a 35-nm-thick titanium film and a 200-nm-thick copper film. The insulating film 13 is an insulating film obtained by stacking a 400-nm-thick silicon nitride film and a 50-nm-thick silicon oxynitride film in this order. The oxide semiconductor film 14 is a 35-nm-thick In—Ga—Zn oxide semiconductor film formed using a metal oxide target containing metal elements at an atomic ratio of In:Ga:Zn=1:1:1. Each of the conductive films 16 and 17 is a conductive film obtained by stacking a 35-nm-thick titanium film and a 200-nm-thick copper film in this order. The insulating film 20a is a 50-nm-thick silicon oxynitride film. The insulating film 20b is a 400-nm-thick silicon oxynitride film. The insulating film 21 is a 100-nm-thick silicon nitride film.

Figure 35:
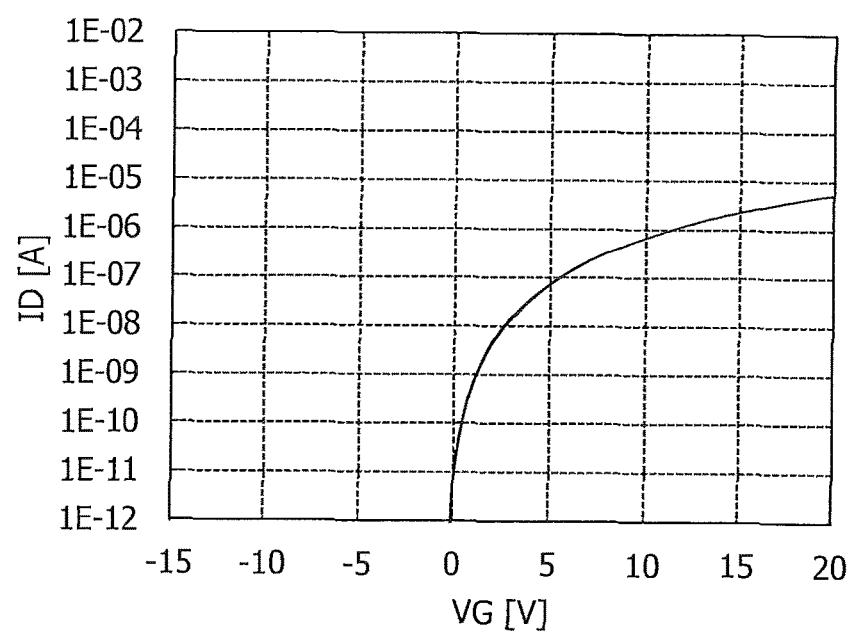
FIG. 35 shows the measurement results of drain current ID (A) with respect to gate voltage VG (V) of a transistor.

FIG. 35 shows the result of measurement of drain current ID (A) with respect to gate voltage VG (V) of the fabricated transistor.

In addition, the resistivity of a metal oxide film obtained by decreasing the resistivity of an oxide semiconductor film by forming a nitride insulating film in contact with the oxide semiconductor film is examined. In the case where the oxide semiconductor film is an In—Ga—Zn oxide semiconductor film formed using a metal oxide target of In:Ga:Zn=1:1:1 and the nitride insulating film is a silicon nitride film, the resistivity of the metal oxide film obtained by decreasing the resistivity of the In—Ga—Zn oxide semiconductor film is estimated to be approximately $7.0 \times 10^{-3}$ [Ω·cm].

Figure 36:
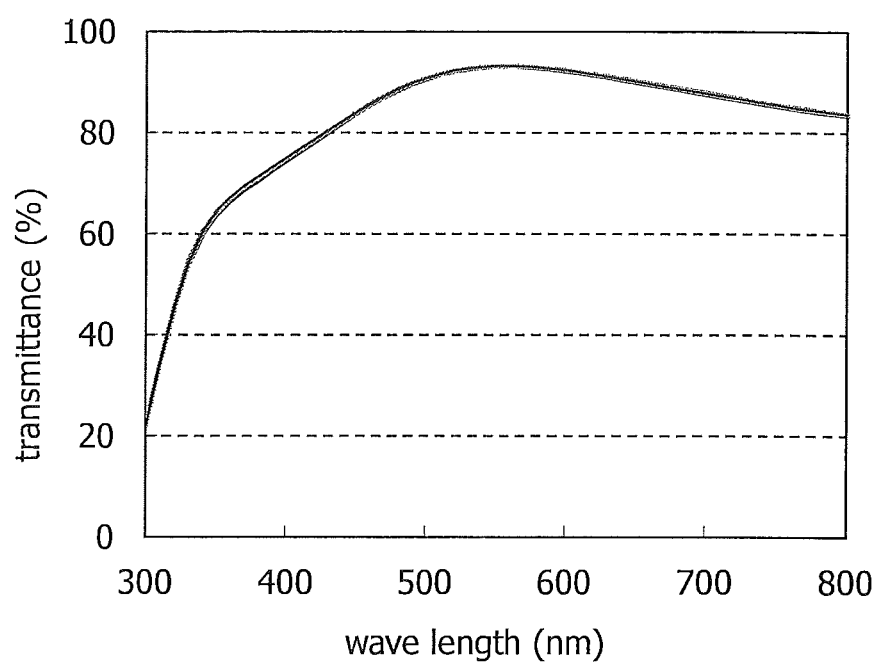
FIG. 36 shows the transmittance of a metal oxide film with respect to wavelengths of light.

Furthermore, the transmittance of the metal oxide film was examined. FIG. 36 shows the wavelength dependence of the transmittance of a sample obtained by stacking an In—Ga—Zn oxide semiconductor film and a silicon nitride film in this order over a glass substrate. Note that the In—Ga—Zn oxide semiconductor film was formed using a metal oxide target of In:Ga:Zn=1:1:1 so as to have a thickness of 35 nm. The silicon nitride film was formed at a substrate temperature of 350° C. so as to have a thickness of 100 nm. FIG. 36 shows that the transmittance of the sample in a visible light region from 380 nm to 770 nm is 70% or higher.

Moreover, a prototype liquid crystal display device including the pixel 30 illustrated in FIG. 5 was fabricated. Note that the pixel 30 in the prototype liquid crystal display device has the cross-sectional view structure illustrated in FIG. 9A. Table 1 given below shows specifications of the prototype liquid crystal display device.

TABLE 1

| | Specifications |
|---|---|
| Screen Diagonal | 6.05 inches |
| Driving Method | Active Matrix |
| Resolution | 768 × 1024 × RGB (XGA) |
| Pixel Pitch | 0.120 mm × 0.040 mm |
| Aperture Ratio | 57% |
| Liquid Crystal | VA Mode |
| Source Driver | COF |
| Scan Driver | Integrated |

Figure 37:
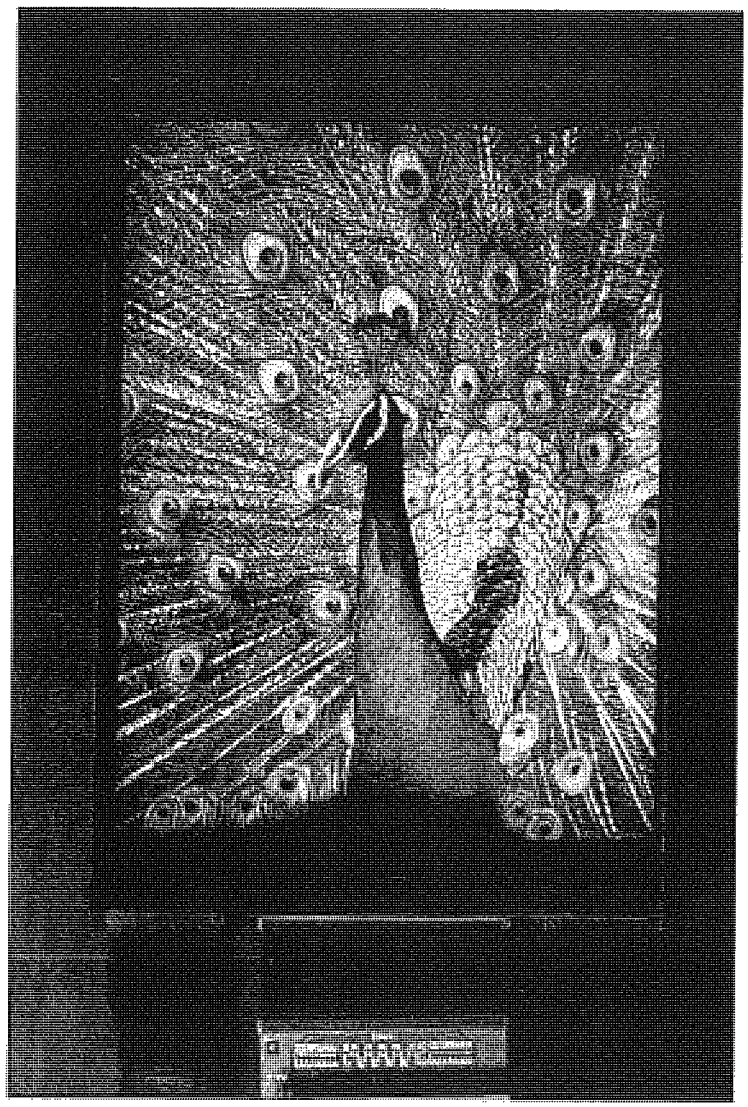
FIG. 37 is a photograph of a liquid crystal display device displaying an image.

FIG. 37 shows a photograph of an image displayed on the prototype liquid crystal display device.

This application is based on Japanese Patent Application serial no. 2013-249165 filed with Japan Patent Office on Dec. 2, 2013, the entire contents of which are hereby incorporated by reference.

What is claimed is:

1. A method for manufacturing a semiconductor device, comprising:
    forming a first electrode over a substrate;
    forming a first insulating film over the first electrode;
    forming an oxide semiconductor film over the first insulating film;
    forming a second insulating film over the oxide semiconductor film so that the second insulating film covers an edge of the oxide semiconductor film;
    forming a third insulating film on the second insulating film;
    forming a pair of opening portions in the second insulating film and the third insulating film; and
    forming a pair of electrodes over the third insulating film so that the pair of electrodes is respectively in contact with the oxide semiconductor film through the pair of opening portions,
    wherein the second insulating film is in contact with a top surface of a region between the pair of electrodes of the oxide semiconductor film, a side edge of an end portion of the oxide semiconductor film and the first insulating film.

2. The method for manufacturing a semiconductor device according to claim 1, wherein each of the second insulating film and the third insulating film comprises silicon and nitrogen.

3. The method for manufacturing a semiconductor device according to claim 1, wherein the oxide semiconductor film comprises indium, zinc and a metal other than indium and zinc.

4. The method for manufacturing a semiconductor device according to claim 1, wherein the third insulating film is formed without exposure to an atmosphere.

5. The method for manufacturing a semiconductor device according to claim 1, wherein, in forming the third insulating film, at least one of a flow rate of a source gas, pressure, a high-frequency power, and a substrate temperature is different from a condition of forming the second insulating film.

6. The method for manufacturing a semiconductor device according to claim 1, wherein, in forming the third insulating film, a high-frequency power of 0.17 to 0.5 W/cm$^2$ is supplied to an electrode provided in a treatment chamber.

7. The method for manufacturing a semiconductor device according to claim 1, wherein the third insulating film is formed using a high-frequency power larger than a high-frequency power for foil ling the second insulating film.

8. A method for manufacturing a semiconductor device, comprising:
   forming a first electrode over a substrate;
   forming a first insulating film over the first electrode;
   forming an oxide semiconductor film over the first insulating film;
   forming a second insulating film on the oxide semiconductor film so that the second insulating film covers an edge of the oxide semiconductor film;
   forming a third insulating film on the second insulating film;
   forming a pair of opening portions in the second insulating film and the third insulating film; and
   forming a pair of electrodes over the third insulating film so that the pair of electrodes is respectively in contact with the oxide semiconductor film through the pair of opening portions,
   wherein the second insulating film is in contact with a top surface of a region between the pair of electrodes of the oxide semiconductor film, a side edge of an end portion of the oxide semiconductor film and the first insulating film.

9. The method for manufacturing a semiconductor device according to claim 8, wherein each of the second insulating film and the third insulating film comprises silicon and nitrogen.

10. The method for manufacturing a semiconductor device according to claim 8, wherein the oxide semiconductor film comprises indium, zinc and a metal other than indium and zinc.

11. The method for manufacturing a semiconductor device according to claim 8, wherein the third insulating film is formed without exposure to an atmosphere.

12. The method for manufacturing a semiconductor device according to claim 8, wherein, in forming the third insulating film, at least one of a flow rate of a source gas, pressure, a high-frequency power, and a substrate temperature is different from a condition of forming the second insulating film.

13. The method for manufacturing a semiconductor device according to claim 8, wherein, in forming the third insulating film, a high-frequency power of 0.17 to 0.5 W/cm$^2$ is supplied to an electrode provided in a treatment chamber.

14. A method for manufacturing a semiconductor device, comprising:
   forming a first electrode over a substrate;
   forming a first insulating film over the first electrode;
   forming an oxide semiconductor film over the first insulating film;
   forming a second insulating film over the oxide semiconductor film so that the second insulating film is in contact with an edge of the oxide semiconductor film;
   forming a third insulating film on the second insulating film;
   forming a pair of opening portions in the second insulating film and the third insulating film; and
   forming a pair of electrodes over the third insulating film so that the pair of electrodes is respectively in contact with the oxide semiconductor film through the pair of opening portions,
   wherein the second insulating film covers a top surface of a region between the pair of electrodes of the oxide semiconductor film, a side edge of an end portion of the oxide semiconductor film and a part of the first insulating film.

15. The method for manufacturing a semiconductor device according to claim 14, wherein each of the second insulating film and the third insulating film comprises silicon and nitrogen.

16. The method for manufacturing a semiconductor device according to claim 14, wherein the oxide semiconductor film comprises indium, zinc and a metal other than indium and zinc.

17. The method for manufacturing a semiconductor device according to claim 14, wherein the third insulating film is formed without exposure to an atmosphere.

18. The method for manufacturing a semiconductor device according to claim 14, wherein, in forming the third insulating film, at least one of a flow rate of a source gas, pressure, a high-frequency power, and a substrate temperature is different from a condition of forming the second insulating film.

19. The method for manufacturing a semiconductor device according to claim 14, wherein, in forming the third insulating film, a high-frequency power of 0.17 to 0.5 W/cm$^2$ is supplied to an electrode provided in a treatment chamber.

* * * * *